(12) United States Patent
Zhang et al.

(10) Patent No.: US 10,840,460 B2
(45) Date of Patent: Nov. 17, 2020

(54) AZABORININE DERIVATIVES, THEIR SYNTHESIS AND USE IN ORGANIC ELECTRONIC DEVICES

(71) Applicant: MERCK PATENT GMBH, Darmstadt (DE)

(72) Inventors: Fan Zhang, Shanghai (CN); Xinyang Wang, Shanghai (CN); Ruizhi Tang, Shanghai (CN); Yubin Fu, Shanghai (CN); Xiaodong Zhuang, Shanghai (CN); Xinliang Feng, Shanghai (CN); Dongqing Wu, Shanghai (CN)

(73) Assignee: Flexenable Limited, Cambridge (GB)

( * ) Notice: Subject to any disclaimer, the term of this patent is extended or adjusted under 35 U.S.C. 154(b) by 91 days.

(21) Appl. No.: 15/025,768

(22) PCT Filed: Sep. 16, 2014

(86) PCT No.: PCT/EP2014/002497
§ 371 (c)(1),
(2) Date: Mar. 29, 2016

(87) PCT Pub. No.: WO2015/043722
PCT Pub. Date: Apr. 2, 2015

(65) Prior Publication Data
US 2016/0248014 A1   Aug. 25, 2016

(30) Foreign Application Priority Data

Sep. 30, 2013  (CN) .......................... 2013 1 0459594
Jun. 6, 2014    (CN) .......................... 2014 1 0247218

(51) Int. Cl.
*H01L 51/00* (2006.01)
*C07F 5/02* (2006.01)
(Continued)

(52) U.S. Cl.
CPC .............. *H01L 51/008* (2013.01); *C07F 5/02* (2013.01); *C07F 5/027* (2013.01); *C09K 11/025* (2013.01);
(Continued)

(58) Field of Classification Search
CPC ............... H01L 51/008; H01L 51/0071; H01L 51/0079; H01L 51/5012; C07F 5/02;
(Continued)

(56) References Cited

U.S. PATENT DOCUMENTS 9,166,176 B2    10/2015  Hatakeyama et al.
2014/0005399 A1*  1/2014  Hatakeyama ....... C07F 9/65846
                                                          546/13
2016/0049600 A1   2/2016  Hatakeyama et al.

FOREIGN PATENT DOCUMENTS

WO        2012121398 A1    9/2012
WO    WO 2014-025424 A1 *  2/2014

OTHER PUBLICATIONS

Lukoyanova et al. "Donor-Acceptor Intermediates and Low-Bandgap Polymers by Electropolymerization of Thienoazaborines". Macromolecules. ACS Publications. May 26, 2011. Total pp. 6.*
(Continued)

*Primary Examiner* — Khanh T Nguyen
(74) *Attorney, Agent, or Firm* — Millen White Zelano and Branigan, PC

(57) ABSTRACT

The present invention relates to azaborinine derivatives their synthesis as well as their use in organic electronic devices, particularly in organic light emitting devices, organic photovoltaic devices and organic photodetectors. The invention further relates to organic electronic devices comprising the present azaborinine derivatives 20 Claims, 12 Drawing Sheets

(51) Int. Cl.
*C09K 11/06* (2006.01)
*C09K 11/02* (2006.01)
*H01L 51/50* (2006.01)

(52) U.S. Cl.
CPC .......... *C09K 11/06* (2013.01); *H01L 51/0071* (2013.01); *H01L 51/0079* (2013.01); *C09K 2211/104* (2013.01); *C09K 2211/1011* (2013.01); *C09K 2211/1029* (2013.01); *C09K 2211/1033* (2013.01); *C09K 2211/1037* (2013.01); *C09K 2211/1044* (2013.01); *C09K 2211/1048* (2013.01); *C09K 2211/1051* (2013.01); *C09K 2211/1055* (2013.01); *C09K 2211/1088* (2013.01); *C09K 2211/1092* (2013.01); *C09K 2211/1096* (2013.01); *H01L 51/5012* (2013.01); *Y02E 10/549* (2013.01); *Y02P 70/521* (2015.11)

(58) Field of Classification Search
CPC ....... C07F 5/027; C09K 11/025; C09K 11/06; C09K 2211/1011; C09K 2211/1029; C09K 2211/1033; C09K 2211/1037; C09K 2211/1044; C09K 2211/1048; C09K 2211/1051; C09K 2211/1055; C09K 2211/1088; C09K 2211/1092; C09K 2211/1096; Y02P 70/521; Y02E 10/549

USPC ........................................................ 252/500
See application file for complete search history.

(56) References Cited

OTHER PUBLICATIONS

Lepeltier et al. "New azaborine-thiophene heteroacnes". The Royal Society of Chemistry 2010. Accepeted Aug. 10, 2010. Total pp. 3.*
International Search Report for PCT/EP2014/002497 dated Dec. 16, 2014.
Lukoyanova, O. et al., "Donor-acceptor intermediates and low-bandgap polymers by electropolymerization of thienoazaborines," Macromolecules, Jun. 28, 2011, vol. 44, No. 12, pp. 4729-4734.
Lepeltier, M. et al., "New azaborine-thiophene heteroacenes," Chemical Communications, Aug. 23, 2010, vol. 46, No. 37, pp. 7007.
Chissick, S. S. et al., "New heteraromatic compounds containing two boron atoms," Tetrahedron Letters, 1960, vol. 1, No. 44, pp. 8-10.
Neue, B. et al., "BN-Dibenzo[a,o]picenes: Analogues of an unknown polycyclic aromatic hydrocarbon," Angewandte Chemie International Edition, Sep. 16, 2013, vol. 52, No. 38.
Wang, X. et al., "Ladder-type BN-embedded heteroacenes with blue emission," Organic Letters, Nov. 15, 2013, vol. 15, No. 22, pp. 5714-5717.

* cited by examiner

AZABORININE DERIVATIVES, THEIR SYNTHESIS AND USE IN ORGANIC ELECTRONIC DEVICES

TECHNICAL FIELD

The present invention relates to azaborinine derivatives their synthesis as well as their use in organic electronic devices, particularly in organic light emitting devices, organic photovoltaic devices and organic photodetectors. The invention further relates to organic electronic devices comprising the present azaborinine derivatives.

BACKGROUND AND DESCRIPTION OF THE PRIOR ART

In the field of electronic materials a lot of interest has focused on organic electronic materials because they offer a promising combination of cost reduction, high production throughput, low temperature deposition methods and in consequence ease of fabrication of electronic devices, particularly of large electronic devices which are otherwise difficult to produce, such as for example large television screens. Furthermore, electronic devices comprising organic electronic materials may further be characterized by flexibility and reduced weight, thus making them more suited for transportable devices.

Polycyclic aromatic compounds, such as for example rubrene or pentacene, are widely used in organic electronics because of their good semiconducting properties. However, these materials have a number of disadvantages, which hinder large-scale commercial production. Such polycyclic aromatic compounds are generally characterized by low solubility and in consequence can often be processed by vapor deposition methods only. Furthermore they are also difficult to synthesize and in some cases, such as for example pentacene, extremely sensitive to oxidation.

Objective of the present invention was therefore to provide new organic electronic materials that have similar properties as the known polycyclic aromatic compounds while not having any one or more of the mentioned disadvantages. It was a further objective of the present invention to increase the pool of organic semiconducting materials. Additional advantages of the present invention will become evident from the following description and examples.

SUMMARY OF THE INVENTION

The present inventors have now surprisingly found that the above objectives may be attained either individually or in any combination by the compound of the present application.

The present application therefore provides for a compound comprising a structural unit of formula (I-1 or I-2)

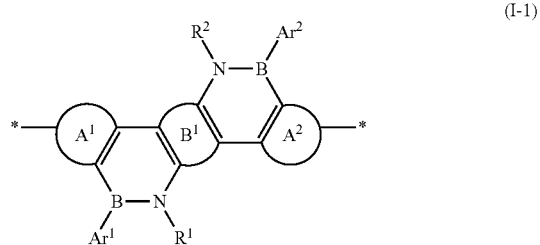

(I-1)

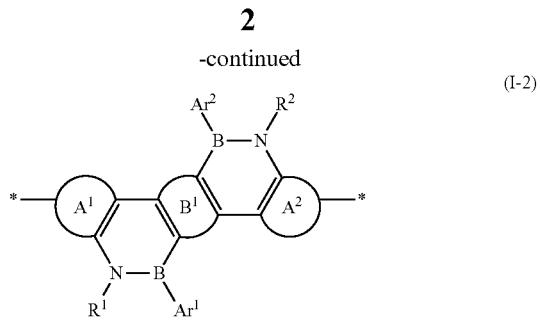

(I-2)

wherein
A$^1$ and A$^2$ are independently of each other mono- or polycyclic aromatic or heteroaromatic ring systems annealed to the neighboring azaborinine ring;
B$^1$ is a mono- or polycyclic aromatic or heteroaromatic ring system annealed to the two neighboring azaborinine rings;
Ar$^1$ and Ar$^2$ are independently of each other aryl or heteroaryl; and
R$^1$ and R$^2$ are independently of each other selected from the group consisting of hydrogen, carbyl and hydrocarbyl;
wherein A$^1$, A$^2$, B$^1$, Ar$^1$ and Ar$^2$ may independently of each other be substituted or unsubstituted.

The present application also provides for a mixture or blend comprising one or more of said compound and one or more compounds or polymers having semiconducting, charge transport, hole transport, electron transport, hole blocking, electron blocking, electrically conducting, photoconducting or light emitting properties.

Further, the present application provides for a formulation comprising said compound and an organic solvent.

Furthermore, the present application provides for the use of said compound as charge transport, semiconducting, electrically conducting, photoconducting or light emitting material in optical, electrooptical, electronic, electroluminescent or photoluminescent components or devices.

Additionally the present application provides for charge transport, semiconducting, electrically conducting, photoconducting or light emitting materials comprising said compound.

The present application also provides for a component or device comprising such compound, said component or device being selected from the group consisting of organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), organic solar cells (OSC), photodiodes, laser diodes, photoconductors, organic photodetectors (OPD), electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

The present application further relates to conjugated polymers comprising one or more repeating units which comprise a unit of formula (I-1) or (I-2) and/or one or more groups selected from aryl and heteroaryl groups.

The invention further relates to monomers comprising a unit of formula (I-1) or (I-2) and further comprising one or more reactive groups which can be reacted to form a conjugated polymer as described herein.

The invention also relates to small molecules comprising a unit of formula (I-1) or (I-2) and one or more inert groups.

The invention further relates to the use of a polymer, formulation, mixture or polymer blend of the present invention as charge transport, semiconducting, electrically conducting, photoconducting or light emitting material, or in an optical, electrooptical, electronic, electroluminescent or photoluminescent device, or in a component of such a device or in an assembly comprising such a device or component.

The optical, electrooptical, electronic, electroluminescent and photoluminescent devices include, without limitation, organic field effect transistors (OFET), organic thin film transistors (OTFT), organic light emitting diodes (OLED), organic light emitting transistors (OLET), organic photovoltaic devices (OPV), organic photodetectors (OPD), organic solar cells, laser diodes, Schottky diodes, photoconductors and photodetectors.

The components of the above devices include, without limitation, charge injection layers, charge transport layers, interlayers, planarizing layers, antistatic films, polymer electrolyte membranes (PEM), conducting substrates and conducting patterns.

The assemblies comprising such devices or components include, without limitation, integrated circuits (IC), radio frequency identification (RFID) tags or security markings or security devices containing them, flat panel displays or backlights thereof, electrophotographic devices, electrophotographic recording devices, organic memory devices, sensor devices, biosensors and biochips.

The present compounds are particularly useful in that they allow easy production of blue emitting OLEDs.

DETAILED DESCRIPTION OF THE INVENTION

Figure 1:
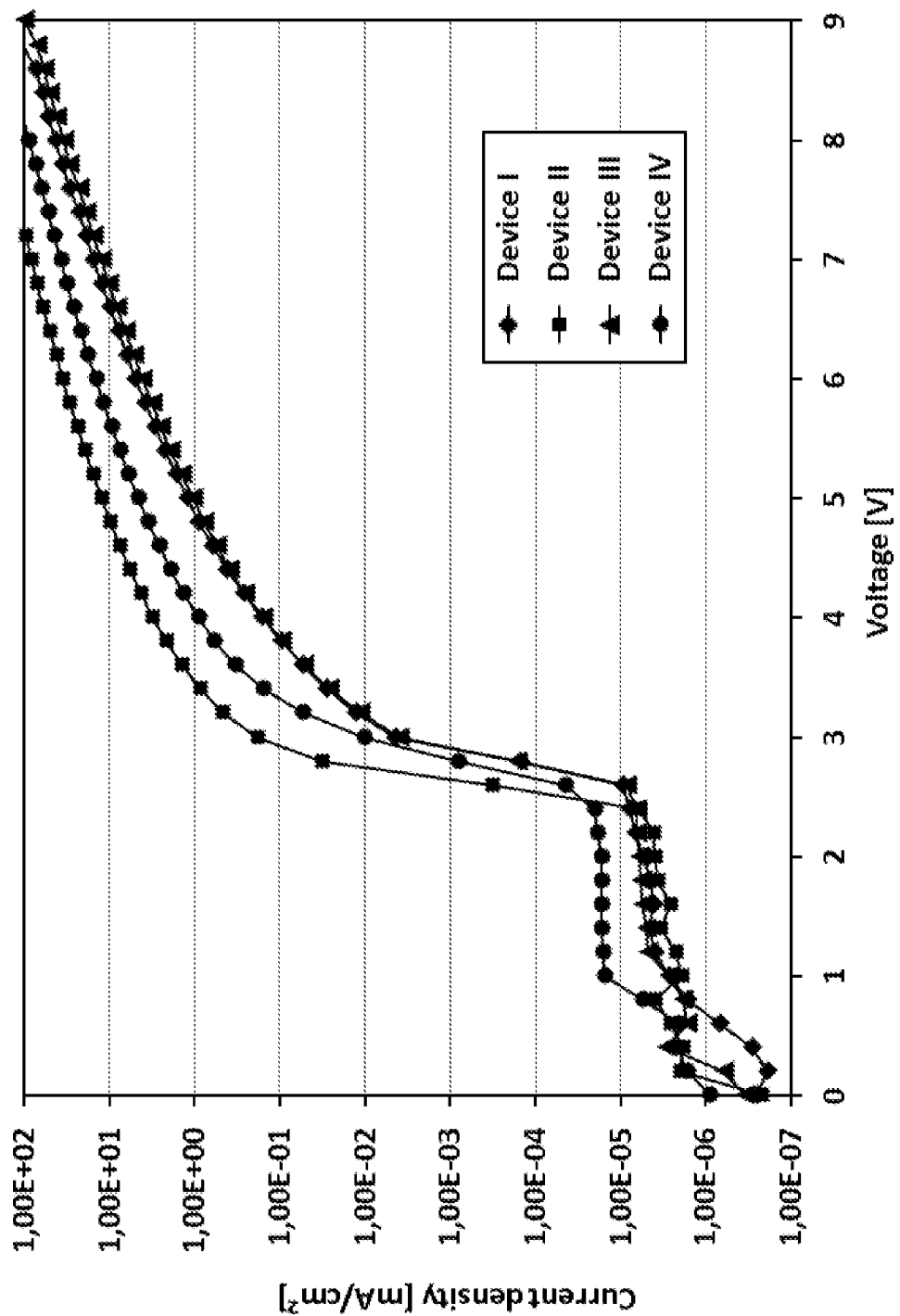
FIG. 1 shows the current density in dependence of the voltage for devices I to IV of Example 9.
Figure 2:
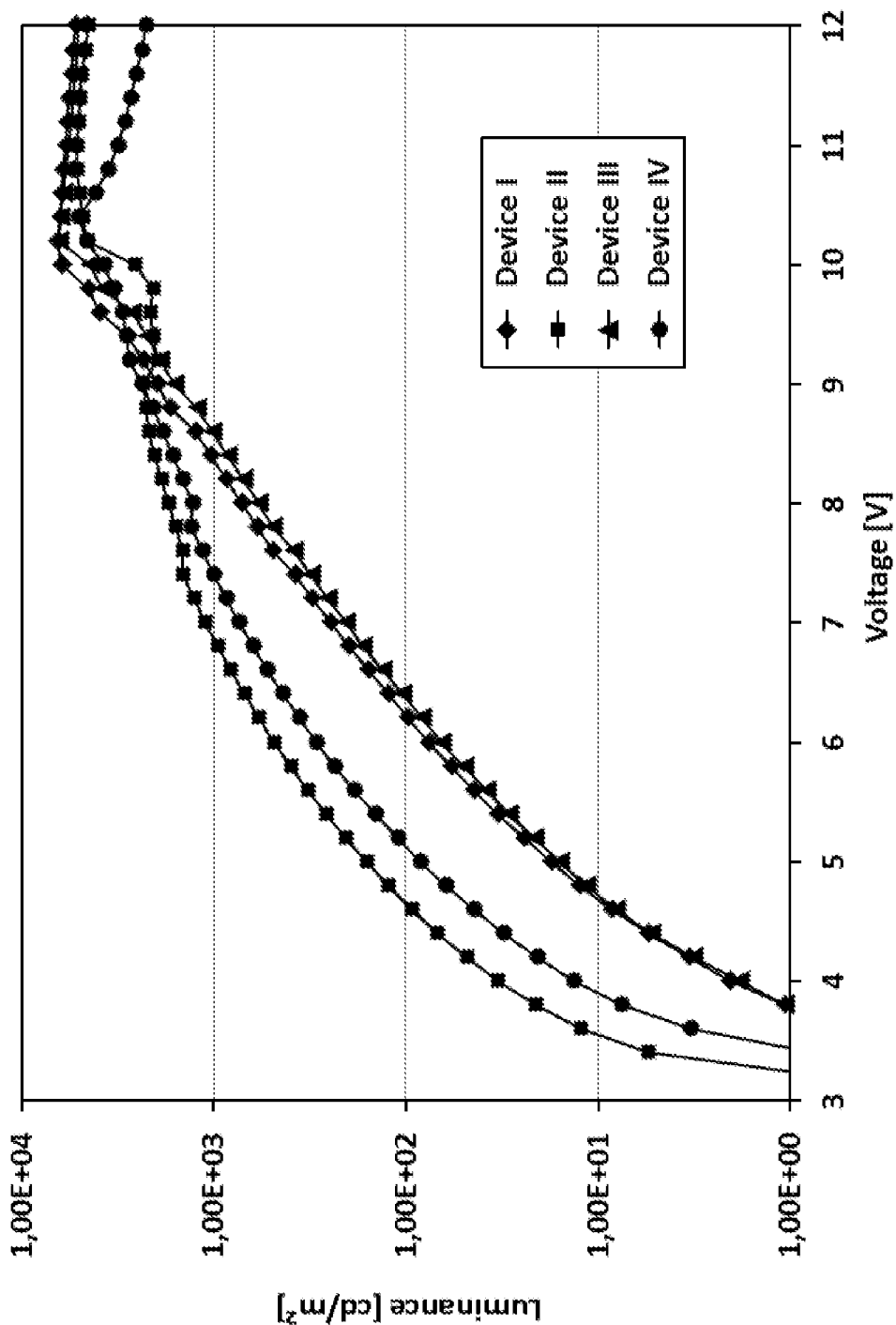
FIG. 2 shows the luminance in dependence of the voltage for devices I to IV of Example 9.
Figure 3:
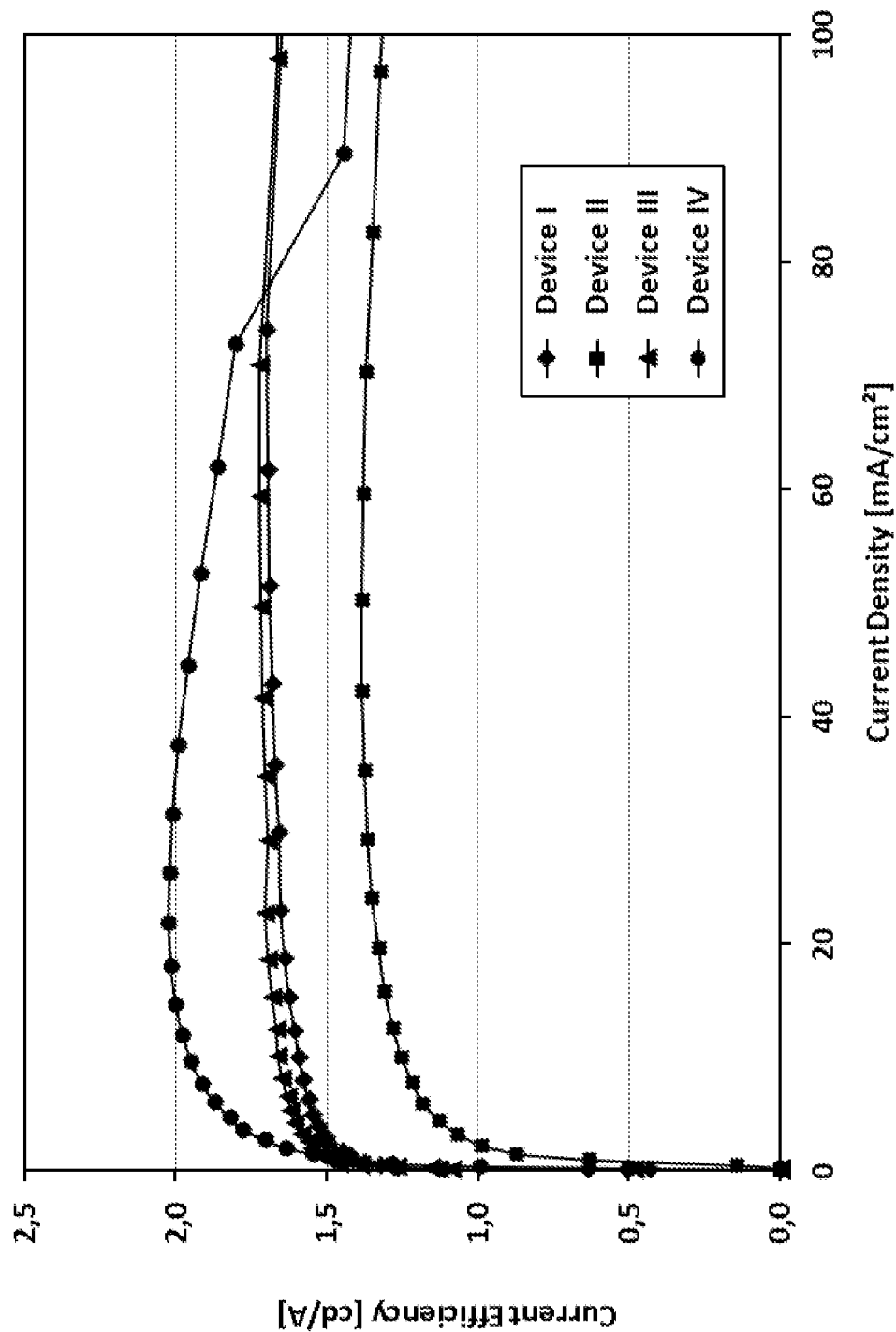
FIG. 3 shows the current efficiency in dependence of the current density for devices I to IV of Example 9.
Figure 4:
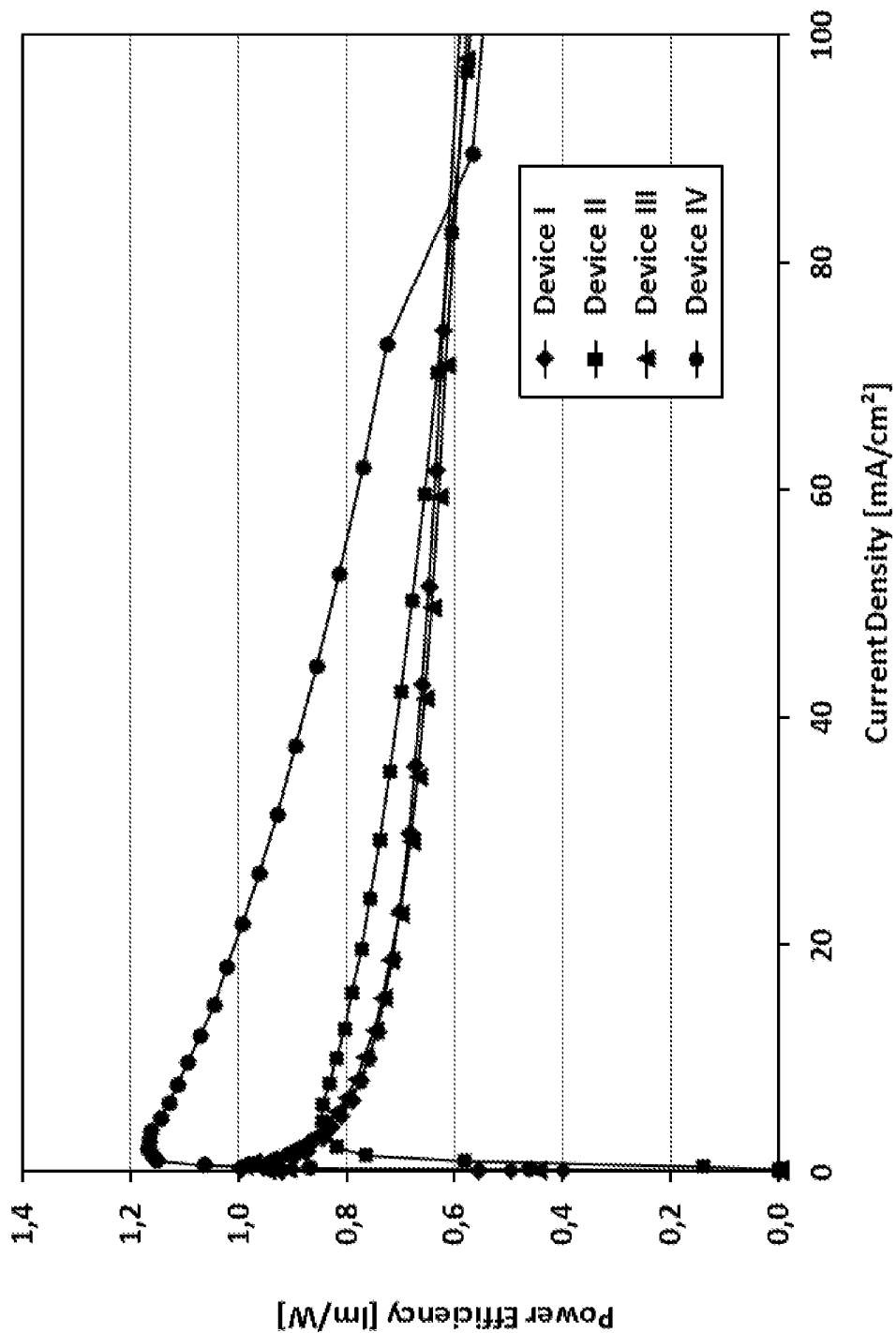
FIG. 4 shows the power efficiency in dependence of the current density for devices I to IV of Example 9.
Figure 5:
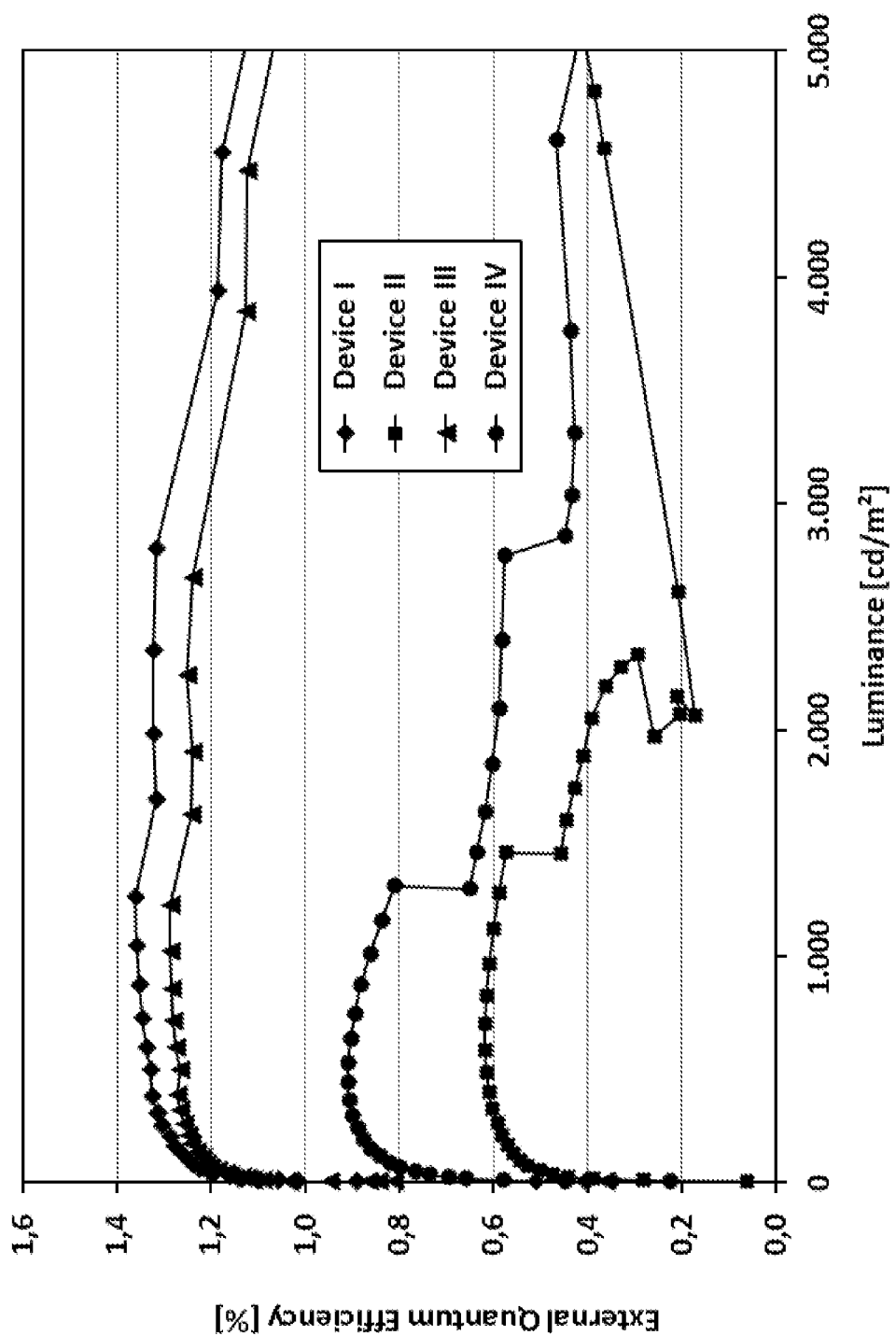
FIG. 5 shows the external quantum efficiency ("EQE") in dependence of the luminance for devices I to IV of Example 9.
Figure 6:
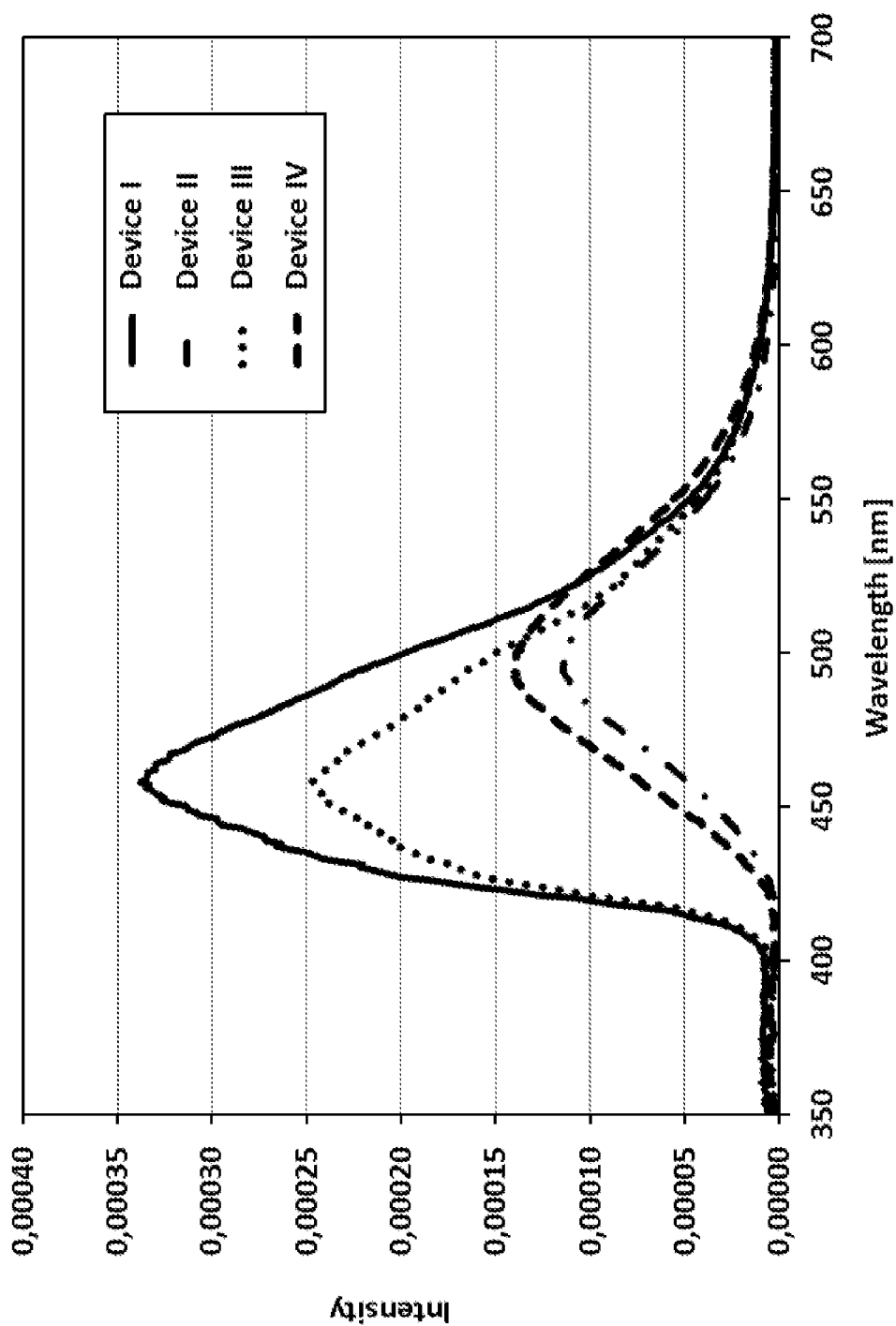
FIG. 6 shows the electroluminescence spectra for devices I to IV of Example 9.
Figure 7:
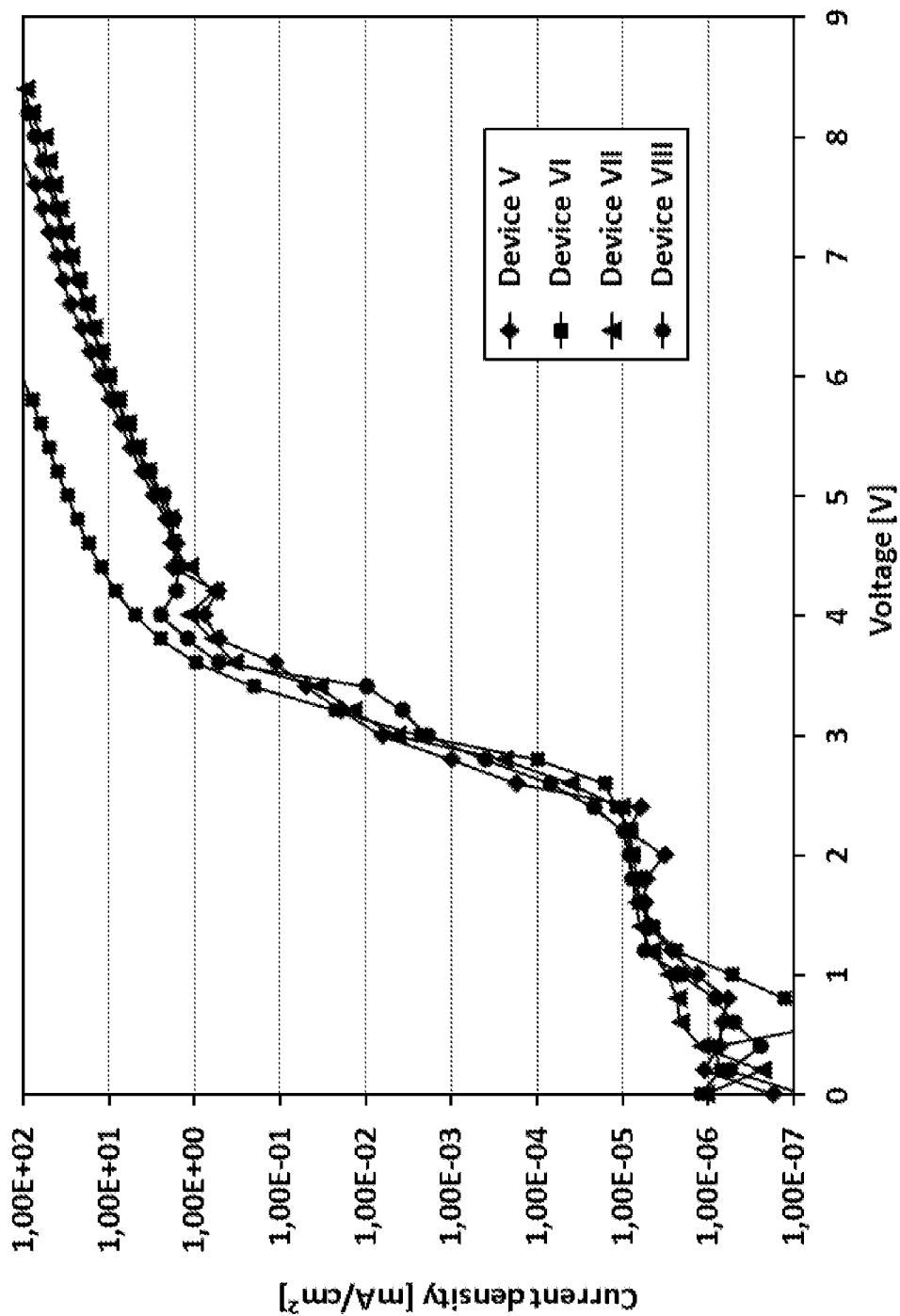
FIG. 7 shows the current density in dependence of the voltage for devices V to VIII of Example 9.
Figure 8:
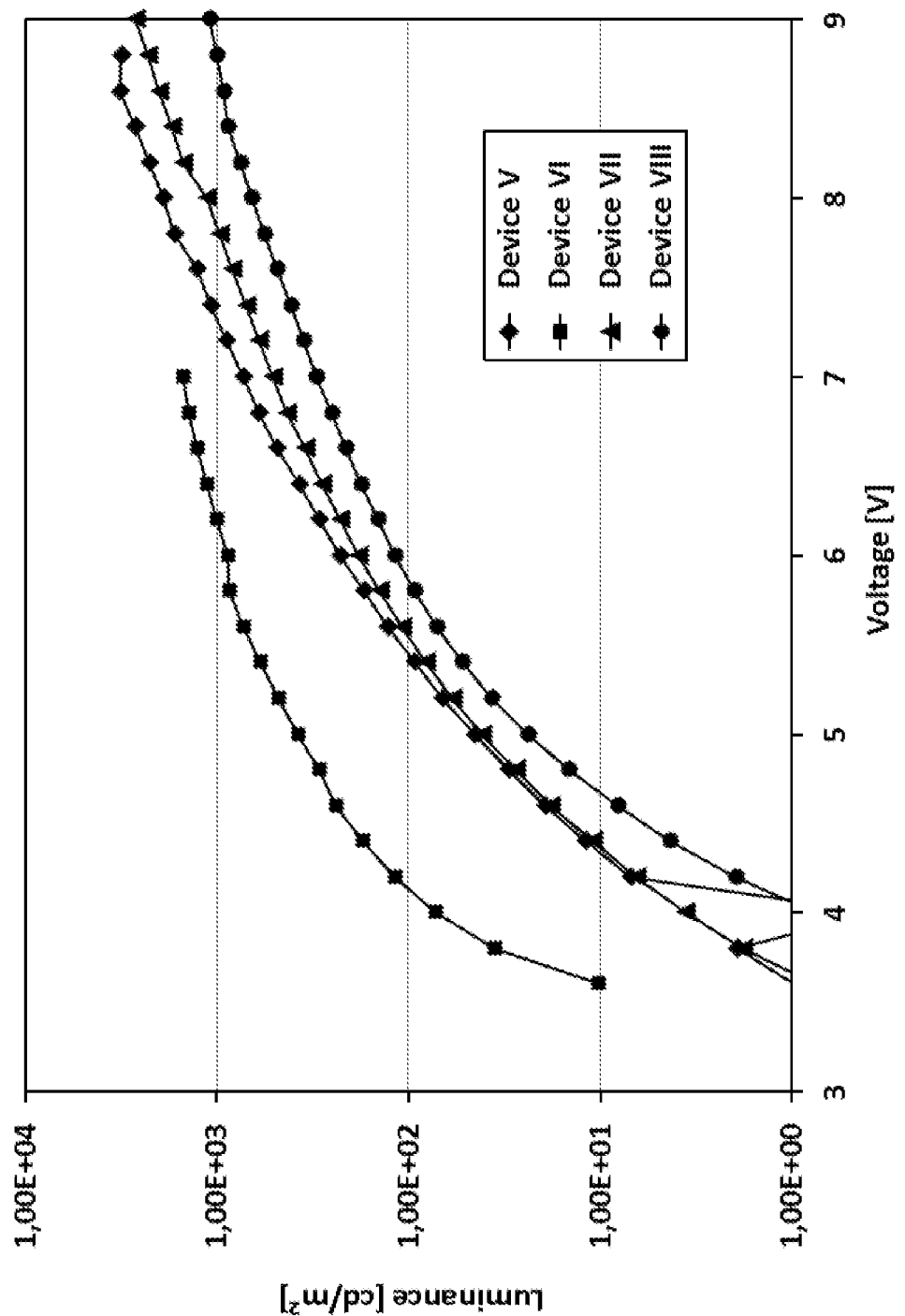
FIG. 8 shows the luminance in dependence of the voltage for devices V to VIII of Example 9.
Figure 9:
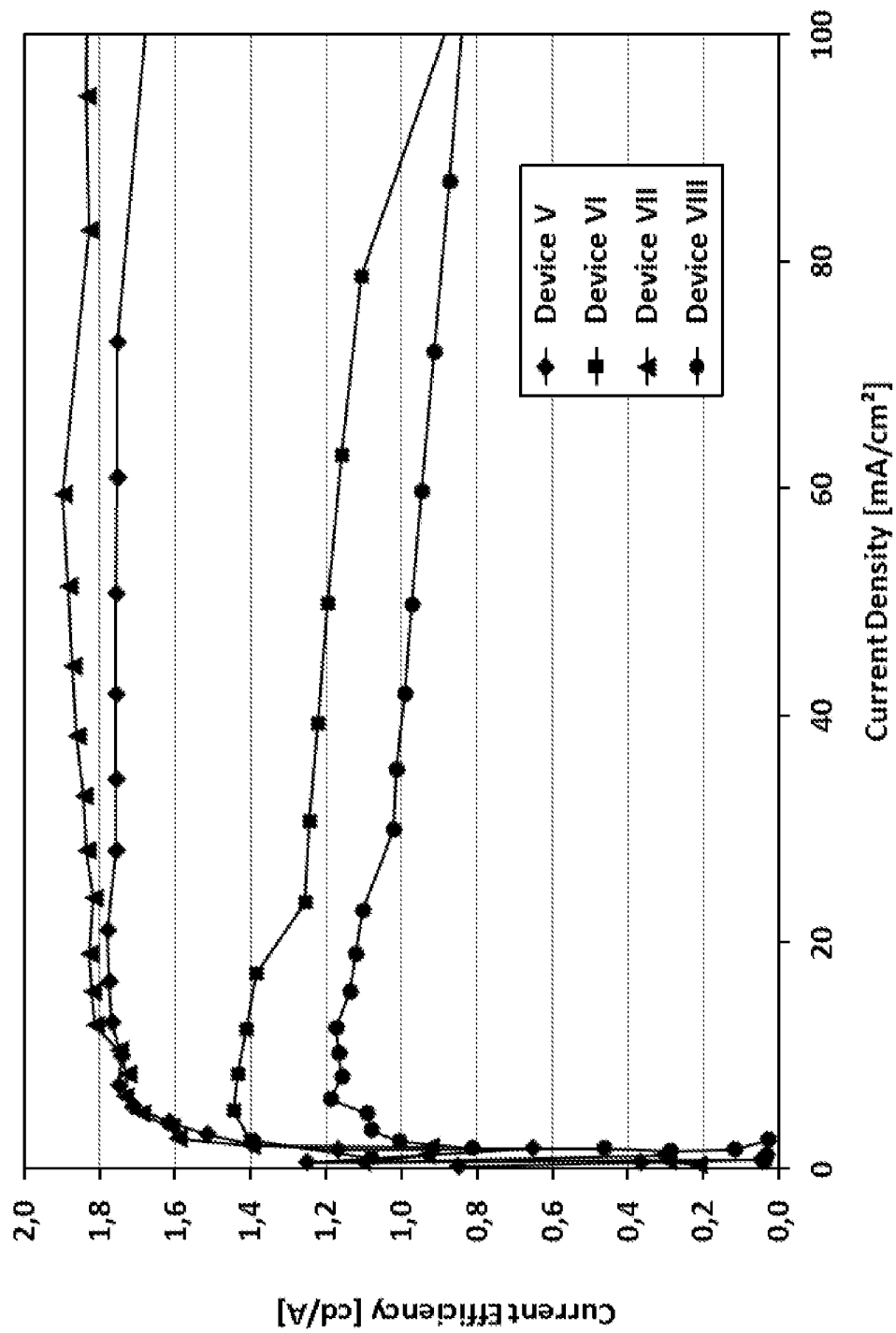
FIG. 9 shows the current efficiency in dependence of the current density for devices V to VIII of Example 9.
Figure 10:
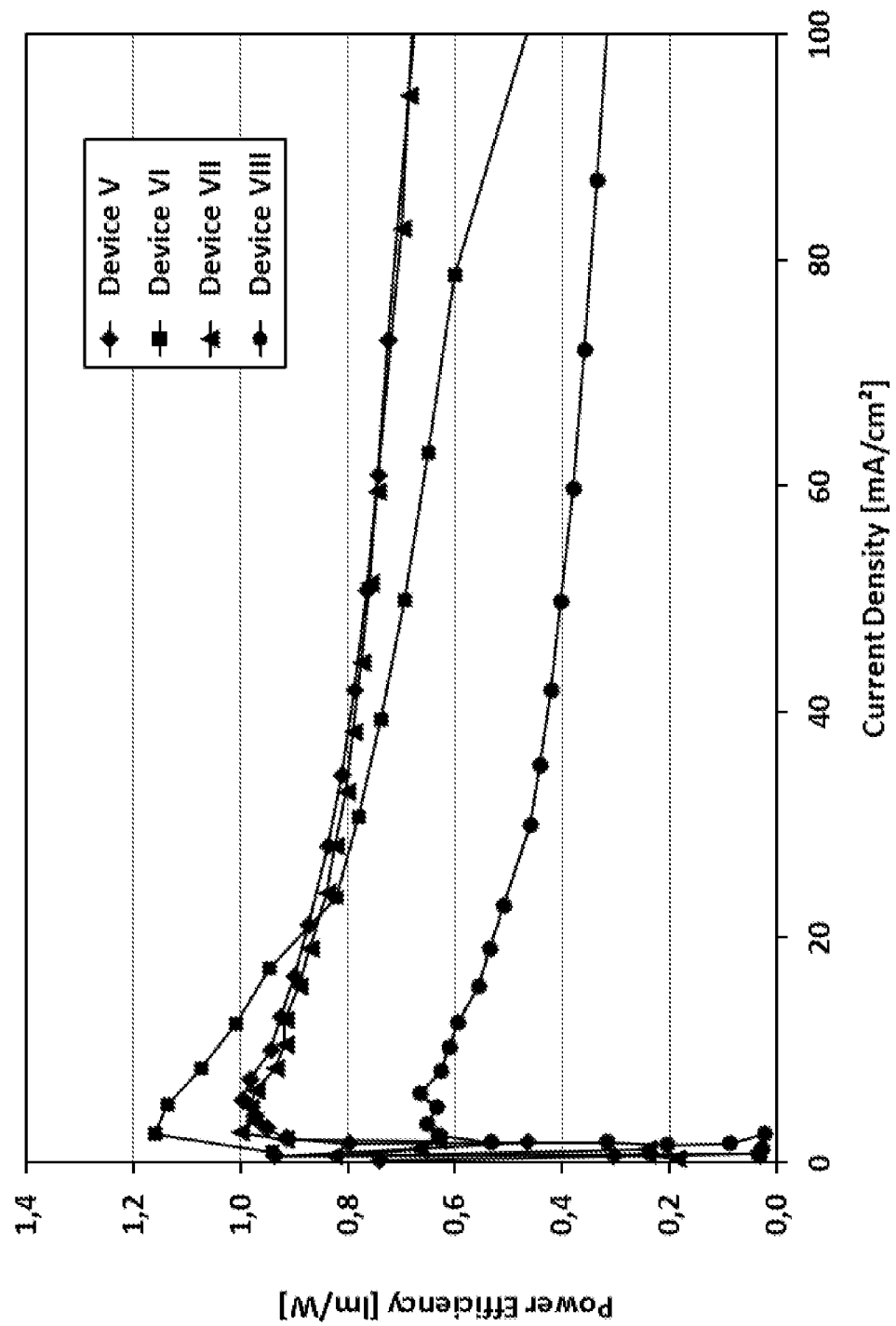
FIG. 10 shows the power efficiency in dependence of the current density for devices V to VIII of Example 9.
Figure 11:
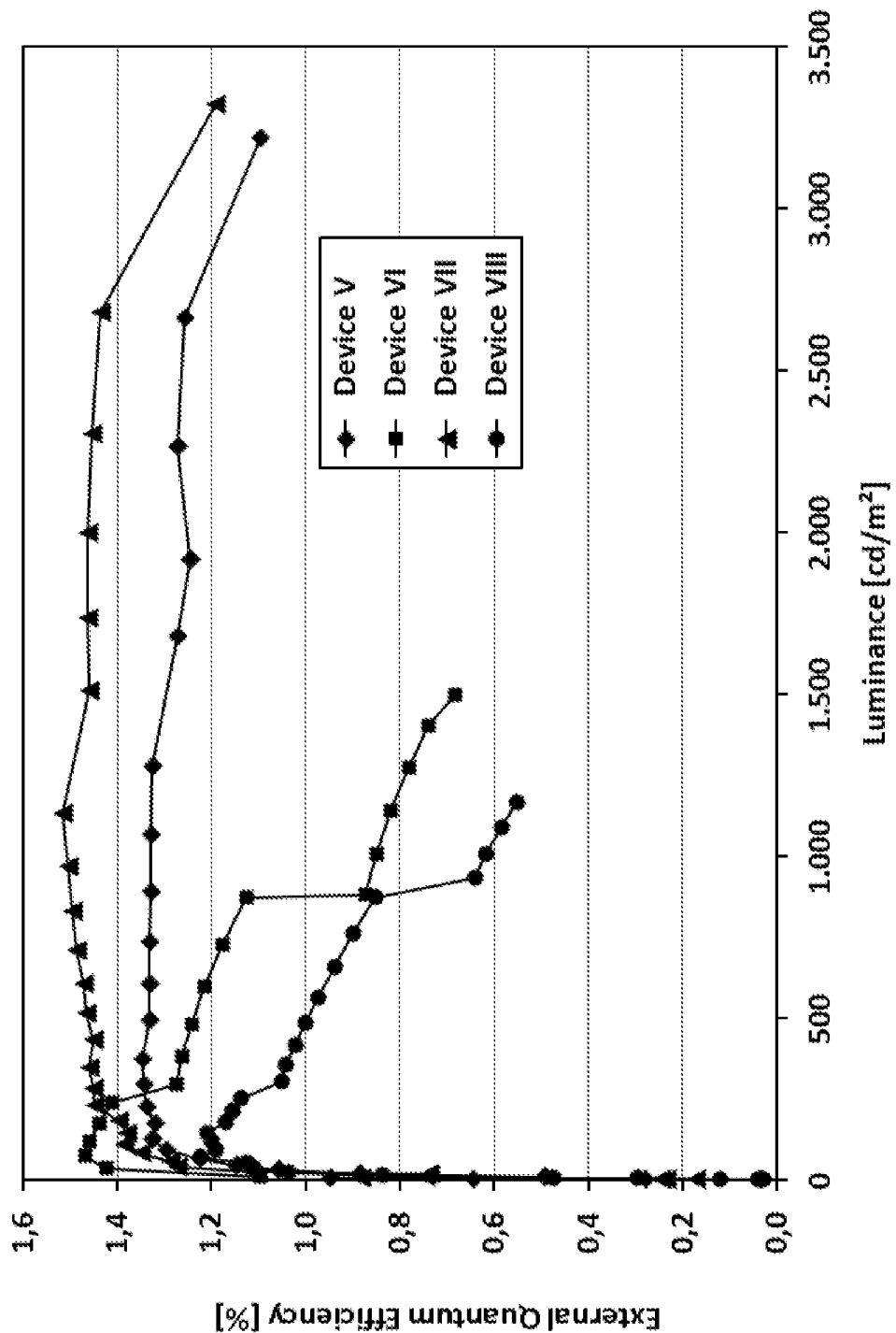
FIG. 11 shows the external quantum efficiency ("EQE") in dependence of the luminance for devices V to VIII of Example 9.
Figure 12:
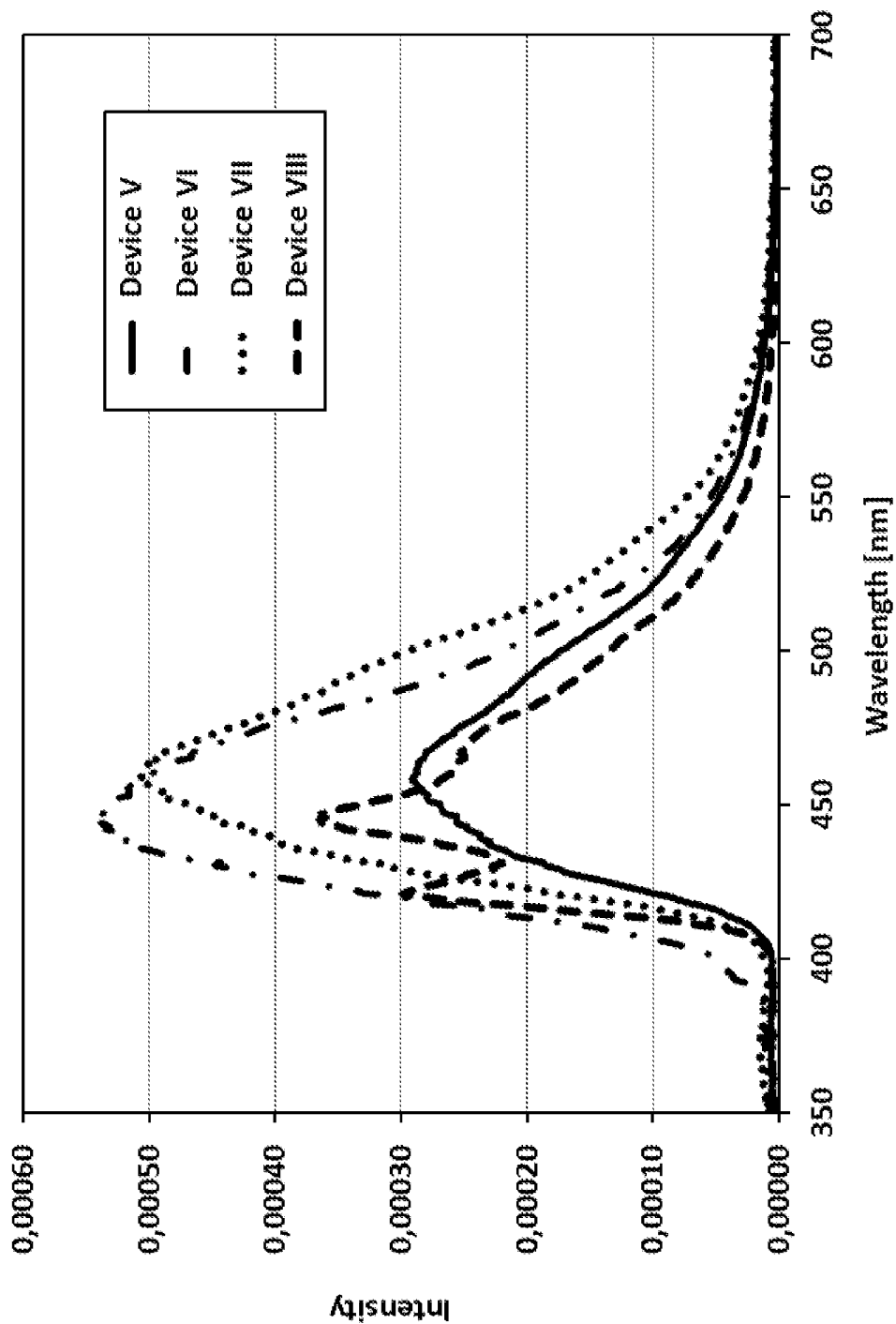
FIG. 12 shows the electroluminescence spectra for devices V to VIII of Example 9.

For the purposes of the present application the term "azaborinine" is used to denote an aromatic six-membered ring wherein of two neighbouring ring atoms one is boron and the other is nitrogen.

For the purposes of the present application the terms "fused" and "annealed" are used synonymously.

For the purposes of the present application an asterisk ("*") denotes a linkage to an adjacent unit or group, and in case of an oligomer or a polymer it may denote a link to an adjacent repeating unit or to a terminal group of the polymer chain. The asterisk is further used to denote the ring atoms at which aromatic or heteroaromatic rings are fused to other aromatic or heteroaromatic rings. It is noted that two adjacent asterisks ("*") mark the bond by which (II-1) to (II-29) are fused to the neighbouring azaborinine ring.

The term "fusion atom" is used to indicate any atom of a fused ring system which is common to two or more rings (see Pure & Appl. Chem., Vol. 70, No. 1, pp. 143-216, 1988, particularly page 147).

For the purposes of the present application the term "substituted" is used to denote substitution, i.e. replacement of a hydrogen, by a substituent selected from the group consisting of halogen atoms, alkyl having from 1 to 10 carbon atoms, alkyl having from 1 to 10 carbon atoms wherein at least one of the hydrogen atoms is replaced by a halogen atom, aryl having from 5 to 20 ring atoms with the ring atoms being independently of each other selected from the group consisting of carbon and heteroatoms as defined below, and aryl having from 5 to 20 ring atoms with the ring atoms being independently of each other selected from the group consisting of carbon and heteroatoms as defined below and at least one hydrogen is replaced by a halogen atom.

For the purposes of the present application the term "polymer" will be understood to mean a molecule of high relative molecular mass, the structure of which essentially comprises the multiple repetition of units derived, actually or conceptually, from molecules of low relative molecular mass (Pure Appl. Chem., 1996, 68, 2291). The term "oligomer" will be understood to mean a molecule of intermediate relative molecular mass, the structure of which essentially comprises a small plurality of units derived, actually or conceptually, from molecules of lower relative molecular mass (Pure Appl. Chem., 1996, 68, 2291). In a preferred meaning as used herein a polymer will be understood to mean a compound having >1, i.e. at least 2 repeat units, preferably ≥5 repeat units, and an oligomer will be understood to mean a compound with >1 and <10, preferably <5, repeat units.

Further, as used herein, the term "polymer" will be understood to mean a molecule that encompasses a backbone (also referred to as "main chain") of one or more distinct types of repeat units (the smallest constitutional unit of the molecule) and is inclusive of the commonly known terms "oligomer", "copolymer", "homopolymer" and the like. Further, it will be understood that the term polymer is inclusive of, in addition to the polymer itself, residues from initiators, catalysts and other elements attendant to the synthesis of such a polymer, where such residues are understood as not being covalently incorporated thereto. Further, such residues and other elements, while normally removed during post polymerization purification processes, are typically mixed or co-mingled with the polymer such that they generally remain with the polymer when it is transferred between vessels or between solvents or dispersion media.

As used herein, the terms "repeat unit", "repeating unit" and "monomeric unit" are used interchangeably and will be understood to mean the constitutional repeating unit (CRU), which is the smallest constitutional unit the repetition of which constitutes a regular macromolecule, a regular oligomer molecule, a regular block or a regular chain (Pure Appl. Chem., 1996, 68, 2291). As further used herein, the term "unit" will be understood to mean a structural unit which can be a repeating unit on its own, or can together with other units form a constitutional repeating unit.

As used herein, a "terminal group" will be understood to mean a group that terminates a polymer backbone. The expression "in terminal position in the backbone" will be understood to mean a divalent unit or repeat unit that is linked at one side to such a terminal group and at the other side to another repeat unit. Such terminal groups include endcap groups or reactive groups that are attached to a monomer forming the polymer backbone which did not participate in the polymerisation reaction, like for example a group having the meaning of $R^e$ or $R^f$ as defined below.

As used herein, the term "endcap group" will be understood to mean a group that is attached to, or replacing, a terminal group of the polymer backbone. The endcap group can be introduced into the polymer by an endcapping process. Endcapping can be carried out for example by reacting the terminal groups of the polymer backbone with a monofunctional compound ("endcapper") like for example an alkyl- or arylhalide, an alkyl- or arylstannane or an alkyl- or arylboronate. The endcapper can be added for example after the polymerisation reaction. Alternatively the endcapper can be added in situ to the reaction mixture before or during the polymerisation reaction. In situ addition of an endcapper can also be used to terminate the polymerisation reaction and thus control the molecular weight of the forming polymer. Typical endcap groups are for example H, phenyl and alkyl having from 1 to 10 carbon atoms.

As used herein, the terms "donor" or "donating" and "acceptor" or "accepting" will be understood to mean an electron donor and electron acceptor, respectively. "Electron donor" will be understood to mean a chemical entity that donates electrons to another compound or another group of atoms of a compound. "Electron acceptor" will be understood to mean a chemical entity that accepts electrons transferred to it from another compound or another group of atoms of a compound. See also International Union of Pure and Applied Chemistry, Compendium of Chemical Technology, Gold Book, Version 2.3.2, 19. August 2012, pages 477 and 480.

As used herein, the term "n-type" or "n-type semiconductor" will be understood to mean an extrinsic semiconductor in which the conduction electron density is in excess of the mobile hole density, and the term "p-type" or "p-type semiconductor" will be understood to mean an extrinsic semiconductor in which mobile hole density is in excess of the conduction electron density (see also, J. Thewlis, Concise Dictionary of Physics, Pergamon Press, Oxford, 1973).

As used herein, the term "leaving group" will be understood to mean an atom or group (which may be charged or uncharged) that becomes detached from an atom in what is considered to be the residual or main part of the molecule taking part in a specified reaction (see also Pure Appl. Chem., 1994, 66, 1134).

As used herein, the term "conjugated" will be understood to mean a compound (for example a polymer) that contains mainly C atoms with $sp^2$-hybridisation (or optionally also sp-hybridization), and wherein these C atoms may also be replaced by hetero atoms. In the simplest case this is for example a compound with alternating C—C single and double (or triple) bonds, but is also inclusive of compounds with aromatic units like for example 1,4-phenylene. The term "mainly" in this connection will be understood to mean that a compound with naturally (spontaneously) occurring defects, or with defects included by design, which may lead to interruption of the conjugation, is still regarded as a conjugated compound. See also International Union of Pure and Applied Chemistry, Compendium of Chemical Technology, Gold Book, Version 2.3.2, 19. August 2012, pages 322-323.

As used herein, unless stated otherwise the molecular weight is given as the number average molecular weight $M_n$ or weight average molecular weight $M_w$, which is determined by gel permeation chromatography (GPC) against polystyrene standards in eluent solvents such as tetrahydrofuran, trichloromethane (TCM, chloroform), chlorobenzene or 1,2,4-trichlorobenzene. Unless stated otherwise, 1,2,4-trichlorobenzene is used as solvent. The molecular weight distribution ("MWD"), which may also be referred to as polydispersity index ("PDI"), of a polymer is defined as the ratio $M_w/M_n$. The degree of polymerization, also referred to as total number of repeat units, m, will be understood to mean the number average degree of polymerization given as $m=M_n/M_U$, wherein $M_n$ is the number average molecular weight and $M_U$ is the molecular weight of the single repeat unit, see J. M. G. Cowie, *Polymers: Chemistry & Physics of Modern Materials*, Blackie, Glasgow, 1991.

As used herein, the term "carbyl group" will be understood to mean any monovalent or multivalent organic radical moiety which comprises at least one carbon atom either without any non-carbon atoms (like for example —C≡C—), or optionally comprising one or more heteroatoms (for example carbonyl etc.).

The term "hydrocarbyl group" will be understood to mean a carbyl group that does additionally contain one or more H atoms and optionally contains one or more hetero atoms.

As used herein, the term "hetero atom" will be understood to mean an atom in an organic compound that is not a H- or C-atom, and preferably will be understood to mean N, O, S, P, Si, Se, As, Te or Ge.

A carbyl or hydrocarbyl group comprising a chain of 3 or more C atoms may be straight-chain, branched and/or cyclic, including spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms, wherein all these groups do optionally contain one or more hetero atoms, preferably selected from N, O, S, P, Si, Se, As, Te and Ge.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be straight-chain or branched. The $C_1$-$C_{40}$ carbyl or hydrocarbyl group includes for example: a $C_1$-$C_{40}$ alkyl group, a $C_1$-$C_{40}$ fluoroalkyl group, a $C_1$-$C_{40}$ alkoxy or oxaalkyl group, a $C_2$-$C_{40}$ alkenyl group, a $C_2$-$C_{40}$ alkynyl group, a $C_3$-$C_{40}$ allyl group, a $C_4$-$C_{40}$ alkyldienyl group, a $C_4$-$C_{40}$ polyenyl group, a $C_2$-$C_{40}$ ketone group, a $C_2$-$C_{40}$ ester group, a $C_6$-$C_{18}$ aryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_1$-$C_{20}$ fluoroalkyl group, a $C_2$-$C_{20}$ alkenyl group, a $C_2$-$C_{20}$ alkynyl group, a $C_3$-$C_{20}$ allyl group, a $C_4$-$C_{20}$ alkyldienyl group, a $C_2$-$C_{20}$ ketone group, a $C_2$-$C_{20}$ ester group, a $C_6$-$C_{12}$ aryl group, and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

The terms "aryl" and "heteroaryl" as used herein preferably mean a mono-, bi- or tricyclic aromatic or heteroaromatic group with 4 to 30 ring C atoms that may also comprise condensed rings and is optionally substituted with one or more groups L, wherein L is selected from halogen, —CN, —NC, —NCO, —NCS, —OCN, —SCN, —C(=O)NR$^O$R$^{OO}$, —C(=O)X$^O$, —C(=O)R$^O$, —NH$_2$, —NR$^O$R$^{OO}$, —SH, —SR$^O$, —SO$_3$H. —SO$_2$R$^O$, —OH, —NO$_2$, —CF$_3$, —SF$_5$, P-Sp-, optionally substituted silyl, or carbyl or hydrocarbyl with 1 to 40 C atoms that is optionally substituted and optionally comprises one or more hetero atoms, and is preferably alkyl, alkoxy, thiaalkyl, alkylcarbonyl, alkoxycarbonyl or alkoxycarbonyloxy with 1 to 20 C atoms that is optionally fluorinated, and R$^O$, R$^{OO}$, X$^O$, P and Sp have the meanings given above and below.

Very preferred substituents L are selected from halogen, most preferably F, or alkyl, alkoxy, oxaalkyl, thioalkyl, fluoroalkyl and fluoroalkoxy with 1 to 12 C atoms or alkenyl, and alkynyl with 2 to 12 C atoms.

Especially preferred aryl and heteroaryl groups are phenyl, phenyl whereinone or more CH groups are replaced by N, naphthalene, thiophene, selenophene, thienothiophene, dithienothiophene, fluorene and oxazole, all of which can be unsubstituted, mono- or polysubstituted with L as defined above. Very preferred rings are selected from pyrrole, preferably N-pyrrole, furan, pyridine, preferably 2- or 3-pyridine, pyrimidine, pyridazine, pyrazine, triazole, tetrazole, pyrazole, imidazole, isothiazole, thiazole, thiadiazole, isoxazole, oxazole, oxadiazole, thiophene, preferably 2-thiophene, selenophene, preferably 2-selenophene, thieno[3,2-b]thiophene, thieno[2,3-b]thiophene, furo[3,2-b]furan, furo[2,3-b]furan, seleno[3,2-b]selenophene, seleno[2,3-b]selenophene, thieno[3,2-b]selenophene, thieno[3,2-b]furan, indole, isoindole, benzo[b]furan, benzo[b]thiophene, benzo[1,2-b; 4,5-b']dithiophene, benzo[2,1-b;3,4-b']dithiophene, quinole, 2-methylquinole, isoquinole, quinoxaline, quinazoline, benzotriazole, benzimidazole, benzothiazole, benzisothiazole, benzisoxazole, benzoxadiazole, benzoxazole, benzothiadiazole, all of which can be unsubstituted, mono- or polysubstituted with L as defined above. Further examples of aryl and heteroaryl groups are those selected from the groups shown hereinafter.

An alkyl or alkoxy radical, i.e. where the terminal CH$_2$ group is replaced by —O—, can be straight-chain or branched. It is preferably straight-chain (or linear). Suitable examples of such alkyl and alkoxy radical are methyl, ethyl, propyl, butyl, pentyl, hexyl, heptyl, octyl, nonyl, decyl, undecyl, dodecyl, tridecyl, tetradecyl, pentadecyl, methoxy, ethoxy, propoxy, butoxy, pentoxy, hexoxy, heptoxy, octoxy, nonoxy, decoxy, undecoxy, dodecoxy, tridecoxy or tetradecoxy. Preferred alkyl and alkoxy radicals have 1, 2, 3, 4, 5, 6, 7, 8, 9 or 10 carbon atoms. Suitable examples of such preferred alkyl and alkoxy radicals may be selected from the group consisting of methyl, ethyl, propyl, butyl, pentyl, hexyl, heptyl, octyl, nonyl, decyl, methoxy, ethoxy, propoxy, butoxy, pentoxy, hexoxy, heptoxy, octoxy, nonoxy and decoxy.

An alkenyl group, wherein one or more CH$_2$ groups are replaced by —CH=CH— can be straight-chain or branched. It is preferably straight-chain, has 2 to 10 C atoms and accordingly is preferably vinyl, prop-1-enyl, or prop-2-enyl, but-1-enyl, but-2-enyl or but-3-enyl, pent-1-enyl, pent-2-enyl, pent-3-enyl or pent-4-enyl, hex-1-enyl, hex-2-enyl, hex-3-enyl, hex-4-enyl or hex-5-enyl, hept-1-enyl, hept-2-enyl, hept-3-enyl, hept-4-enyl, hept-5-enyl or hept-6-enyl, oct-1-enyl, oct-2-enyl, oct-3-enyl, oct-4-enyl, oct-5-enyl, oct-6-enyl or oct-7-enyl, non-1-enyl, non-2-enyl, non-3-enyl, non-4-enyl, non-5-enyl, non-6-enyl, non-7-enyl or non-8-enyl, dec-1-enyl, dec-2-enyl, dec-3-enyl, dec-4-enyl, dec-5-enyl, dec-6-enyl, dec-7-enyl, dec-8-enyl or dec-9-enyl.

Especially preferred alkenyl groups are $C_2$-$C_7$-1E-alkenyl, $C_4$-$C_7$-3E-alkenyl, $C_5$-$C_7$-4-alkenyl, $C_6$-$C_7$-5-alkenyl and $C_7$-6-alkenyl, in particular $C_2$-$C_7$-1E-alkenyl, $C_4$-$C_7$-3E-alkenyl and $C_5$-$C_7$-4-alkenyl. Examples for particularly preferred alkenyl groups are vinyl, 1E-propenyl, 1E-butenyl, 1E-pentenyl, 1E-hexenyl, 1E-heptenyl, 3-butenyl, 3E-pentenyl, 3E-hexenyl, 3E-heptenyl, 4-pentenyl, 4Z-hexenyl, 4E-hexenyl, 4Z-heptenyl, 5-hexenyl, 6-heptenyl and the like. Alkenyl groups having up to 5 C atoms are generally preferred.

An oxaalkyl group, i.e. where one CH$_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example. Oxaalkyl, i.e. where one CH$_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

In an alkyl group wherein one CH$_2$ group is replaced by —O— and one by —C(O)—, these radicals are preferably neighboured. Accordingly these radicals together form a carbonyloxy group —C(O)—O— or an oxycarbonyl group —O—C(O)—. Preferably this group is straight-chain and has 2 to 6 C atoms. It is accordingly preferably selected from the group consisting of acetyloxy, propionyloxy, butyryloxy, pentanoyloxy, hexanoyloxy, acetyloxymethyl, propionyloxymethyl, butyryloxymethyl, pentanoyloxymethyl, 2-acetyloxyethyl, 2-propionyloxyethyl, 2-butyryloxyethyl, 3-acetyloxypropyl, 3-propionyloxypropyl, 4-acetyloxybutyl, methoxycarbonyl, ethoxycarbonyl, propoxycarbonyl, butoxycarbonyl, pentoxycarbonyl, methoxycarbonylmethyl, ethoxycarbonylmethyl, propoxycarbonylmethyl, butoxycarbonylmethyl, 2-(methoxycarbonyl)ethyl, 2-(ethoxycarbonyl)ethyl, 2-(propoxycarbonyl)ethyl, 3-(methoxycarbonyl)propyl, 3-(ethoxycarbonyl)propyl, and 4-(methoxycarbonyl)-butyl.

An alkyl group wherein two or more CH$_2$ groups are replaced by —O— and/or —C(O)O— can be straight-chain or branched. It is preferably straight-chain and has 3 to 12 C atoms. Accordingly it is preferably selected from the group consisting of bis-carboxy-methyl, 2,2-bis-carboxyethyl, 3,3-bis-carboxy-propyl, 4,4-bis-carboxy-butyl, 5,5-bis-carboxy-pentyl, 6,6-bis-carboxy-hexyl, 7,7-bis-carboxyheptyl, 8,8-bis-carboxy-octyl, 9,9-bis-carboxy-nonyl, 10,10-bis-carboxy-decyl, bis-(methoxycarbonyl)-methyl, 2,2-bis-(methoxycarbonyl)-ethyl, 3,3-bis-(methoxycarbonyl)-propyl, 4,4-bis-(methoxycarbonyl)-butyl, 5,5-bis-(methoxycarbonyl)-pentyl, 6,6-bis-(methoxycarbonyl)-hexyl, 7,7-bis-(methoxycarbonyl)-heptyl, 8,8-bis-(methoxycarbonyl)-octyl, bis-(ethoxycarbonyl)-methyl, 2,2- bis-(ethoxycarbonyl)-ethyl, 3,3-bis-(ethoxycarbonyl)-propyl, 4,4-bis-(ethoxycarbonyl)-butyl, and 5,5-bis-(ethoxycarbonyl)-hexyl.

A thioalkyl group, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

A fluoroalkyl group is preferably perfluoroalkyl $C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or partially fluorinated alkyl, in particular 1,1-difluoroalkyl, all of which are straight-chain or branched.

Alkyl, alkoxy, alkenyl, oxaalkyl, thioalkyl, carbonyl and carbonyloxy groups can be achiral or chiral groups. Particularly preferred chiral groups are 2-butyl (=1-methylpropyl), 2-methylbutyl, 2-methylpentyl, 3-methylpentyl, 2-ethylhexyl, 2-propylpentyl, in particular 2-methylbutyl, 2-methylbutoxy, 2-methylpentoxy, 3-methylpentoxy, 2-ethylhexoxy, 1-methylhexoxy, 2-octyloxy, 2-oxa-3-methylbutyl, 3-oxa-4-methyl-pentyl, 4-methylhexyl, 2-hexyl, 2-octyl, 2-nonyl, 2-decyl, 2-dodecyl, 6-meth-oxyoctoxy, 6-methyloctoxy, 6-methyloctanoyloxy, 5-methylheptyloxy-carbonyl, 2-methylbutyryloxy, 3-methylvaleroyloxy, 4-methylhexanoyloxy, 2-chloropropionyloxy, 2-chloro-3-methylbutyryloxy, 2-chloro-4-methyl-valeryl-oxy, 2-chloro-3-methylvaleryloxy, 2-methyl-3-oxapentyl, 2-methyl-3-oxa-hexyl, 1-methoxypropyl-2-oxy, 1-ethoxypropyl-2-oxy, 1-propoxypropyl-2-oxy, 1-butoxypropyl-2-oxy, 2-fluorooctyloxy, 2-fluorodecyloxy, 1,1,1-trifluoro-2-octyloxy, 1,1,1-trifluoro-2-octyl, 2-fluoromethyloctyloxy for example. Very preferred are 2-hexyl, 2-octyl, 2-octyloxy, 1,1,1-trifluoro-2-hexyl, 1,1,1-trifluoro-2-octyl and 1,1,1-trifluoro-2-octyloxy.

Preferred achiral branched groups are isopropyl, isobutyl (=methylpropyl), isopentyl (=3-methylbutyl), tert. butyl, isopropoxy, 2-methyl-propoxy and 3-methylbutoxy.

In a preferred embodiment, the hydrocarbyl groups are independently of each other selected from primary, secondary or tertiary alkyl or alkoxy with 1 to 30 C atoms, wherein one or more H atoms are optionally replaced by F, or aryl, aryloxy, heteroaryl or heteroaryloxy that is optionally alkylated or alkoxylated and has 4 to 30 ring atoms. Very preferred groups of this type are selected from the group consisting of the following formulae

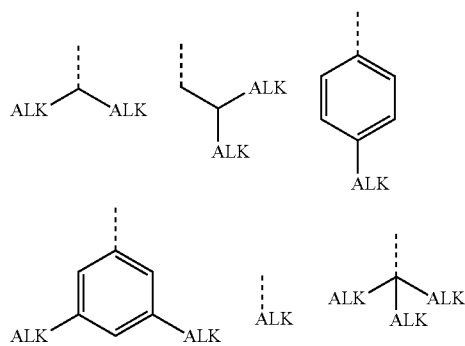

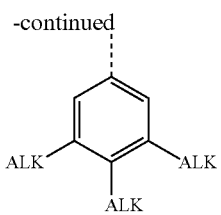

wherein "ALK" denotes optionally fluorinated, preferably linear, alkyl or alkoxy with 1 to 20, preferably 1 to 12 C-atoms, in case of tertiary groups very preferably 1 to 9 C atoms, and the dashed line denotes the link to the ring to which these groups are attached. Especially preferred among these groups are those wherein all ALK subgroups are identical.

—$CY^1$=$CY^2$— is preferably —CH=CH—, —CF=CF— or —CH=C(CN)—.

As used herein, "halogen" includes F, Cl, Br or I, preferably F, Cl or Br.

As used herein, —CO—, —C(=O)— and —C(O)— will be understood to mean a carbonyl group, i.e. a group having the structure

For the purposes of the present application $R^S$ is at each occurrence independently of each other chosen from the group consisting of F, Br, Cl, —CN, —NC, —NCO, —NCS, —OCN, —SCN, —C(O)$NR^0R^{00}$, —C(O)$X^0$, —C(O)$R^0$, —C(O)$OR^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, carbyl or hydrocarbyl with 1 to 40 C atoms that is optionally substituted and optionally comprises one or more hetero atoms.

$R^0$ and $R^{00}$ are at each occurrence independently of each other H or optionally substituted $C_{1-40}$ carbyl or hydrocarbyl, and preferably denote H, alkyl with 1 to 12 C-atoms or phenyl.

$X^0$ is used to denote halogen, preferably F, Cl or Br.

The compounds, units and polymers according to the present invention may also be substituted with a polymerisable or crosslinkable reactive group P, which is optionally protected during the process of forming the polymer. Particular preferred groups P may be selected from the group consisting of $CH_2$=$CW^1$—C(O)—O—, $CH_2$=$CW^1$—C(O)—,

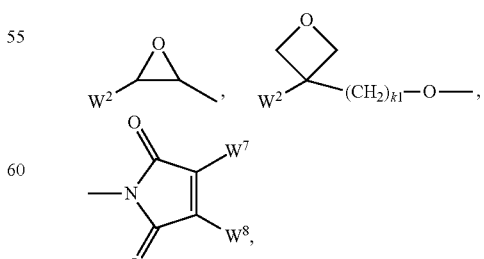

$CH_2$=$CW^2$—(O)$_{k1}$—, $CW^1$=CH—C(O)—(O)$_{k3}$—, $CW^1$=CH—C(O)—NH—, $CH_2$=$CW^1$—C(O)—NH—,

CH₃—CH=CH—O—, (CH₂=CH)₂CH—OC(O)—, (CH₂=CH—CH₂)₂CH—O—C(O)—, (CH₂=CH)₂CH—O—, (CH₂=CH—CH₂)₂N—, (CH₂=CH—CH₂)₂N—C(O)—, HO—CW²W³—, HS—CW²W³—, HW²N—, HO—CW²W³—NH—, CH₂=CH—(C(O)—O)$_{k1}$-Phe-(O)$_{k2}$—, CH₂=CH—(C(O))$_{k1}$-Phe-(O)$_{k2}$—, Phe-CH=CH—, HOOC—, OCN—, and W⁴W⁵W⁶Si—, with W¹ being H, F, Cl, CN, CF₃, phenyl or alkyl with 1 to 5 C-atoms, in particular H, Cl or CH₃, W² and W³ being independently of each other H or alkyl with 1 to 5 C-atoms, in particular H, methyl, ethyl or n-propyl, W⁴, W⁵ and W⁶ being independently of each other Cl, oxaalkyl or oxacarbonylalkyl with 1 to 5 C-atoms, W⁷ and W⁸ being independently of each other H, Cl or alkyl with 1 to 5 C-atoms, Phe being 1,4-phenylene that is optionally substituted by one or more groups L as defined above, $k_1$, $k_2$ and $k_3$ being independently of each other 0 or 1, $k_3$ preferably being 1, and $k_4$ being an integer from 1 to 10.

Alternatively P is a protected derivative of these groups which is non-reactive under the conditions described for the process according to the present invention. Suitable protective groups are known to the ordinary expert and described in the literature, for example in Green, "Protective Groups in Organic Synthesis", John Wiley and Sons, New York (1981), like for example acetals or ketals.

Especially preferred groups P are CH₂=CH—C(O)—O—, CH₂=C(CH₃)—C(O)—O—, CH₂=CF—C(O)—O—, CH₂=CH—O—, (CH₂=CH)₂CH—O—C(O)—, (CH₂=CH)₂CH—O—,

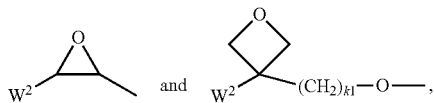

or protected derivatives thereof. Further preferred groups P are selected from the group consisting of vinyloxy, acrylate, methacrylate, fluoroacrylate, chloroacrylate, oxetan and epoxy groups, very preferably from an acrylate or methacrylate group.

Polymerisation of group P can be carried out according to methods that are known to the ordinary expert and described in the literature, for example in D. J. Broer; G. Challa; G. N. Mol, *Macromol. Chem.*, 1991, 192, 59.

The term "spacer group" is known in prior art and suitable spacer groups Sp are known to the ordinary expert (see e.g. *Pure Appl. Chem.*, 2011, 73(5), 888. The spacer group Sp is preferably of formula Sp'-X', such that P-Sp- is P-Sp'-X'—, wherein Sp' is alkylene with up to 30 C atoms which is unsubstituted or mono- or polysubstituted by F, Cl, Br, I or CN, it being also possible for one or more non-adjacent CH₂ groups to be replaced, in each case independently from one another, by —O—, —S—, —NH—, —NR⁰—, —SiR⁰R⁰⁰—, —C(O)—, —C(O)O—, —OC(O)—, —OC(O)—O—, —S—C(O)—, —C(O)—S—, —CH=CH— or —C≡C— in such a manner that O and/or S atoms are not linked directly to one another, X' is —O—, —S—, —C(O)—, —C(O)O—, —OC(O)—, —O—C(O)O—, —C(O)—NR⁰—, —NR⁰—C(O)—, —NR⁰—C(O)—NR⁰⁰—, —OCH₂—, —CH₂O—, —SCH₂—, —CH₂S—, —CF₂O—, —OCF₂—, —CF₂S—, —SCF₂—, —CF₂CH₂—, —CH₂CF₂—, —CF₂CF₂—, —CH=N—, —N=CH—, —N=N—, —CH=CR⁰—, —CY¹=CY²—, —C≡C—, —CH=CH—C(O)O—, —OC(O)—CH=CH— or a single bond, R⁰ and R⁰⁰ are as defined above; and Y¹ and Y² are independently of each other H, F, Cl or CN.

X' is preferably —O—, —S—, —OCH₂—, —CH₂O—, —SCH₂—, —CH₂S—, —CF₂O—, —OCF₂—, —CF₂S—, —SCF₂—, —CH₂CH₂—, —CF₂CH₂—, —CH₂CF₂—, —CF₂CF₂—, —CH=N—, —N=CH—, —N=N—, —CH=CR⁰—, —CY¹=CY²—, —C≡C— or a single bond, in particular —O—, —S—, —C≡C—, —CY¹=CY²— or a single bond. In another preferred embodiment X' is a group that is able to form a conjugated system, such as —C≡C— or —CY¹=CY²—, or a single bond.

Typical groups Sp' are, for example, —(CH₂)$_p$—, —(CH₂CH₂O)$_q$—CH₂CH₂—, —CH₂CH₂—S—CH₂CH₂— or —CH₂CH₂—NH—CH₂CH₂— or —(SiR⁰R⁰⁰—O)$_p$—, with p being an integer from 2 to 12, q being an integer from 1 to 3 and R⁰ and R⁰⁰ having the meanings given above.

Preferred groups Sp' are ethylene, propylene, butylene, pentylene, hexylene, heptylene, octylene, nonylene, decylene, undecylene, dodecylene, octadecylene, ethyleneoxyethylene, methyleneoxybutylene, ethylene-thioethylene, ethylene-N-methyl-iminoethylene, 1-methylalkylene, ethenylene, propenylene and butenylene for example.

Structural Unit

The compound of the present application comprises a structural unit of formula (I-1) or (I-2)

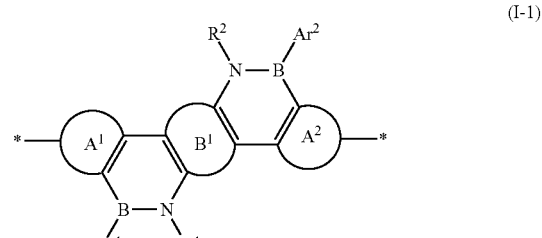

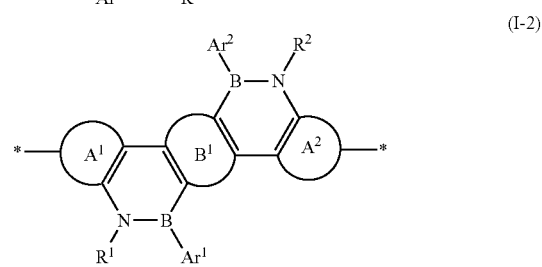

wherein A¹, A², B¹, Ar¹, Ar², R¹ and R² are as defined in the following. All of A¹, A², B¹, Ar¹, Ar², R¹ and R² may independently of each other be substituted or unsubstituted.

R¹ and R² are independently of each other selected from the group consisting of hydrogen, carbyl and hydrocarbyl.

Preferably, R¹ and R² are independently of each other selected from the group consisting of hydrogen, alkyl having from 1 to 20 carbon atoms, aryl having from 5 to 30 aromatic ring atoms and heteroaryl having from 5 to 30 aromatic ring atoms.

Ar¹ and Ar² are independently of each other aryl or heteroaryl.

Preferred Ar¹ and Ar$^e$ may for example each comprise from 5 to 30 aromatic ring atoms, or alternatively be selected from cyclopentadiene, mono-, di-, tri- and tetracyclic aromatic or heteroaromatic ring systems and their respective derivatives wherein one or more aromatic ring atom may be replaced by N and/or one or more of the non-aromative ring atoms may be replaced by a group selected from O, S, Se, $NR^3$ and $SiR^3_2$, preferably selected from O, S, $NR^3$ and $SiR^3_2$, more preferably selected from O, S and $NR^3$, with $R^3$ being $R^0$ as defined above.

Suitable examples of $Ar^1$ and $Ar^2$ may be selected from the group consisting of benzene, napthalene, anthracene, phenantrene, phenalene, tetracene, pyrene, chrysene, linear and angular pentacene, linear and angular hexacene, cyclopentadiene, indene, indacene, fluorene, acenaphthylene and the respective derivatives wherein one or more aromatic ring atoms may be replaced by N and/or one or more of the non-aromatic ring atoms may be replaced by a group selected from O, S, Se, $NR^3$ and $SiR^3_2$, preferably selected from O, S, $NR^3$ and $SiR^3_2$, more preferably selected from O, S and $NR^3$, with $R^3$ being $R^0$ as defined above.

It is most preferred that $Ar^1$ and $Ar^2$ are phenyl or phenyl wherein one or more aromatic ring atom may be replaced by N.

$A^1$ and $A^2$ are independently of each other mono- or polycyclic aromatic or heteroaromatic ring systems annealed to the neighbouring azaborinine ring.

Preferred $A^1$ and $A^2$ may for example each comprise from 5 to 30 aromatic ring atoms, or alternatively be selected from cyclopentadiene, mono-, di-, tri- and tetracyclic aromatic or heteroaromatic ring systems and their respective derivatives wherein one or more aromatic ring atom may be replaced by N and/or one or more of the non-aromatic ring atoms may be replaced by a group selected from O, S, Se, $NR^3$ and $SiR^3_2$, preferably selected from O, S, $NR^3$ and $SiR^3_2$, more preferably selected from O, S and $NR^3$, with $R^3$ being $R^0$ as defined above.

Suitable examples of $A^1$ and $A^2$ may be selected from the group consisting of benzene, napthalene, anthracene, phenantrene, phenalene, tetracene, pyrene, chrysene, linear and angular pentacene, linear and angular hexacene, cyclopentadiene, indene, indacene, fluorene, acenaphthylene and the respective derivatives wherein one or more aromatic ring atoms may be replaced by N and/or one or more of the non-aromatic ring atoms may be replaced by a group selected from O, S, Se, $NR^3$ and $SiR^3_2$, preferably selected from O, S, $NR^3$ and $SiR^3_2$, more preferably selected from O, S and $NR^3$, with $R^3$ being $R^0$ as defined above.

Suitable examples of $A^1$ and $A^2$ are also illustrated by the following formulae (II-1) to (II-29) and may be selected therefrom

(II-1)

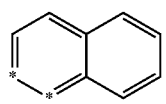

(II-2)

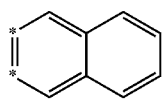

(II-3)

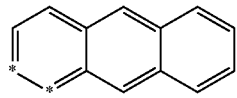

(II-4)

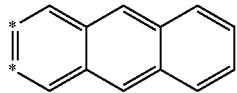

(II-5)

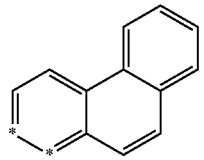

(II-6)

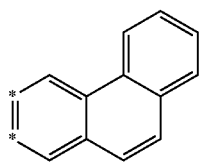

(II-7)

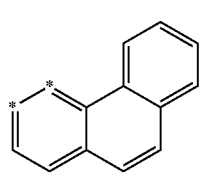

(II-8)

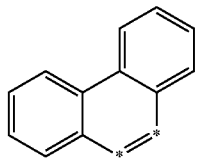

(II-9)

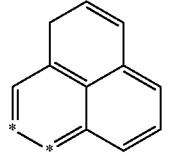

(II-10)

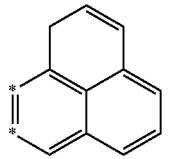

(II-11)

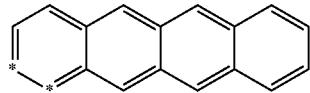

(II-12)

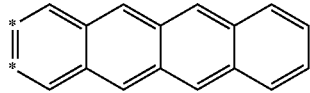

(II-13)

-continued

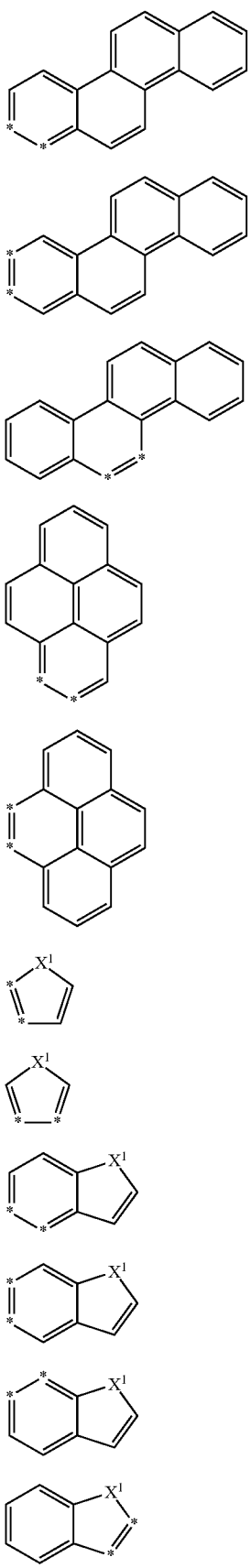

(II-14)
(II-15)
(II-16)
(II-17)
(II-18)
(II-19)
(II-20)
(II-21)
(II-22)
(II-23)
(II-24)

-continued

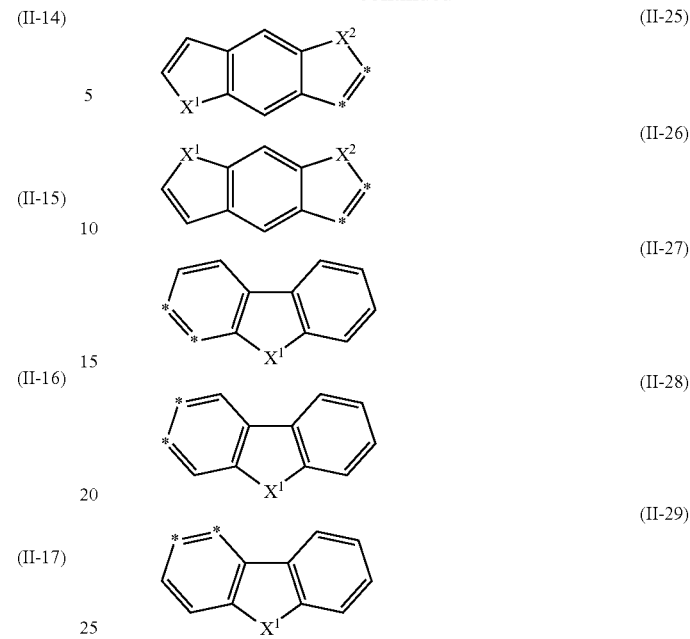

(II-25)
(II-26)
(II-27)
(II-28)
(II-29)

wherein asterisks ("*") denote fusion atoms, i.e. the ring atoms to which the neighbouring azaborinine ring is fused; wherein $X^1$ and $X^2$ are independently of each other selected from the group consisting of O, S, Se, $NR^3$, $CR^3_2$ and $SiR^3_2$, preferably selected from O, S, $NR^3$ and $SiR^3_2$, more preferably selected from O, S and $NR^3$, with $R^3$ being $R^0$ as defined above; and wherein each aromatic ring carbon atom that is not a fusion atom may be replaced by N.

More preferably $A^1$ and $A^2$ are independently of each other selected from the group consisting of formula (II-19) to (II-24), phenyl and substituted phenyl. In case $Ar^1$ and $Ar^2$ are substituted phenyl, it is preferably substituted with F, alkyl having from 1 to 10 carbon atoms or fluoroalkyl having from 1 to 10 carbon atoms.

Most preferred $A^1$ and $A^2$ are independently of each selected from the group consisting of (II-19) to (II-24) with $X^1$ being O or S.

$B^1$ is a mono- or polycyclic aromatic or heteroaromatic ring system annealed to the two neighboring azaborinine rings.

Preferably $B^1$ is selected from the group consisting of $Ar^3$, $Ar^4$-$Ar^5$ and $Ar^6$-$Ar^7$-$Ar^8$, wherein $Ar^3$, $Ar^4$, $Ar^5$, $Ar^6$, $Ar^7$, and $Ar^8$ are independently of each other mono- or polycyclic aromatic or heteroaromatic ring systems, which may be substituted or unsubstituted.

More preferably $B^1$ is selected from the group consisting of $Ar^3$, $Ar^4$-$Ar^5$ and $Ar^6$-$Ar^7$-$Ar^8$, wherein $Ar^3$, $Ar^4$, $Ar^5$, $Ar^6$, $Ar^7$, and $Ar^8$ are independently of each other selected from the group consisting of benzene, napthalene, anthracene, phenantrene, phenalene, tetracene, pyrene, chrysene, linear and angular pentacene, linear and angular hexacene, cyclopentadiene, indene, indacene, fluorene, acenaphthylene and the respective derivatives wherein one or more aromatic ring atoms may be replaced by N and/or one or more of the non-aromatic ring atoms may be replaced by a group selected from O, S, Se, $NR^3$, $CR^3_2$ and $SiR^3_2$, preferably selected from O, S, $NR^3$ and $SiR^3_2$, more preferably selected from O, S and $NR^3$, with $R^3$ being $R^0$ as defined above.

Even more preferably $B^1$ is selected from the group consisting of $Ar^3$, $Ar^4$-$Ar^5$ and $Ar^6$-$Ar^7$-$Ar^8$, wherein $Ar^3$, Ar$^4$, Ar$^5$, Ar$^6$, Ar$^7$, and Ar$^8$ are independently of each other selected from the group consisting of benzene, naphthalene, cyclopentadiene, indene and their respective derivatives wherein one or more aromatic ring atoms may be replaced by N and/or one or more of the non-aromatic ring atoms may be replaced by a group selected from O, S, Se, NR$^3$, CR$^3_2$ and SiR$^3_2$, preferably selected from O, S, NR$^3$ and SiR$^3_2$, more preferably selected from O, S and NR$^3$, with R$^3$ being R$^0$ as defined above.

Suitable examples of B$^1$ may be selected from the group consisting of the following formulae (III-1) to (III-46)

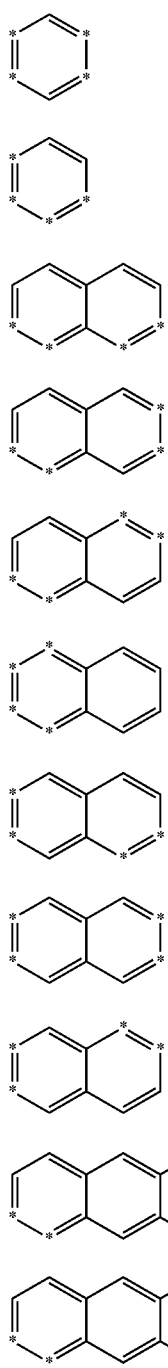

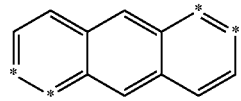
(III-12)

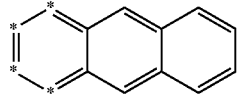
(III-13)

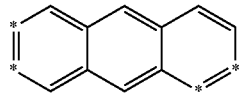
(III-14)

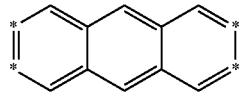
(III-15)

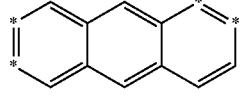
(III-16)

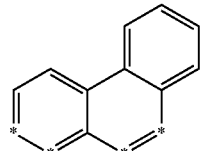
(III-17)

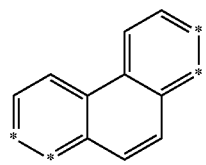
(III-18)

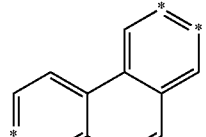
(III-19)

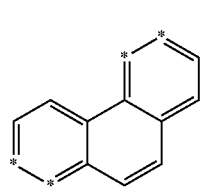
(III-20)

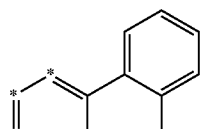
(III-21)

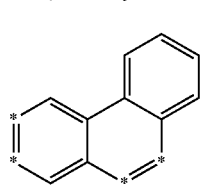
(III-22)

(III-23)
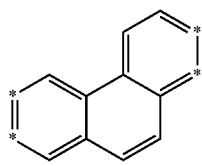
(III-24)
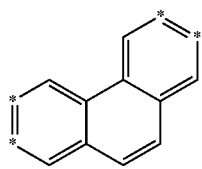
(III-25)
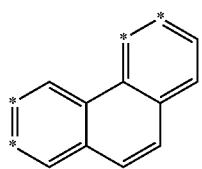
(III-26)
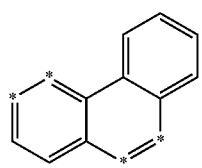
(III-27)
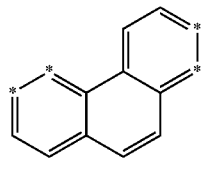
(III-28)
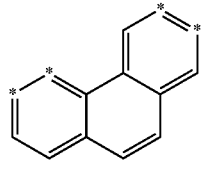
(III-29)
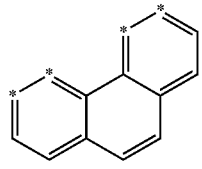
(III-30)
(III-31)
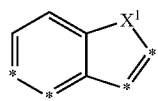
(III-32)
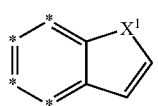
(III-33)
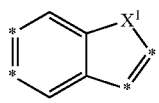
(III-34)
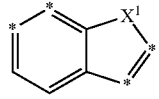
(III-35)
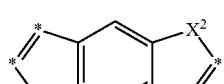
(III-36)
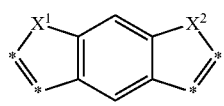
(III-37)
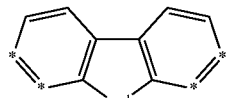
(III-38)
(III-39)
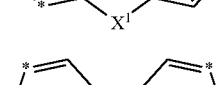
(III-40)
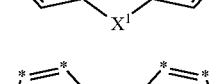
(III-41)
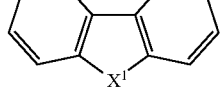
(III-42)
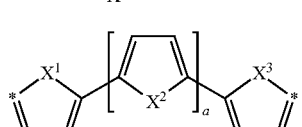
(III-43)
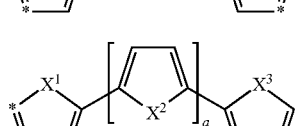
(III-44)
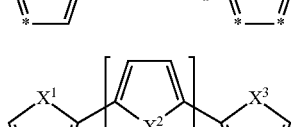
(III-45)
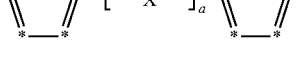

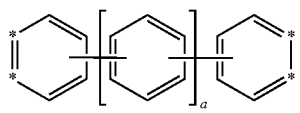
(III-46)

wherein asterisks ("*") denote fusion atoms, i.e. the ring atoms to which the neighbouring azaborinine ring is fused; wherein $X^1$, $X^2$ and $X^3$ are independently of each other selected from the group consisting of O, S, Se, $NR^3$, $CR^3_2$ and $SiR^3_2$, preferably selected from O, S, $NR^3$ and $SiR^3_2$, more preferably selected from O, S and $NR^3$, with $R^3$ being $R^0$ as defined above; wherein a may be 0 or 1, preferably 0; and wherein each aromatic ring carbon atom that is not a fusion atom may be replaced by N.

Of formulae (III-1) to (III-46), formulae (III-1), (III-45) and (III-46) with a=0 are preferred. Examples of such compounds are illustrated by the following formulae (I-1-a) to (I-1-f) and (I-2-a) to (I-2-f)

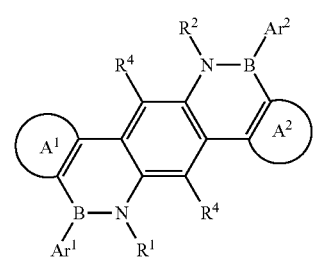
(I-1-a)

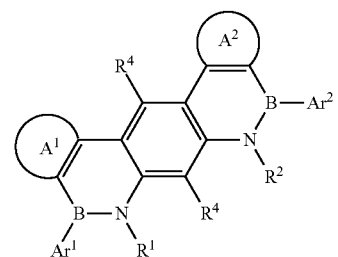
(I-1-b)

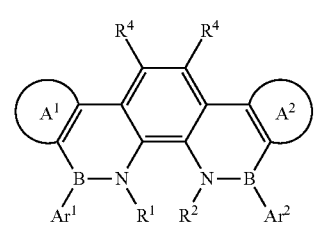
(I-1-c)

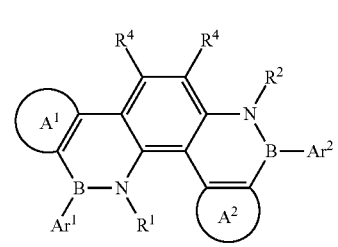
(I-1-d)

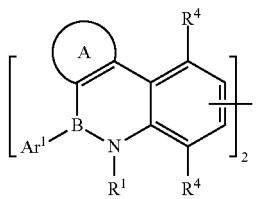
(I-1-e)

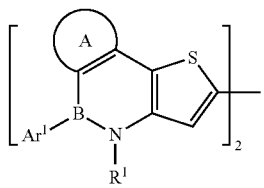
(I-1-f)

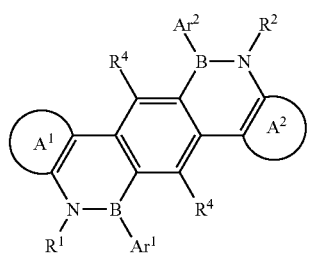
(I-2-a)

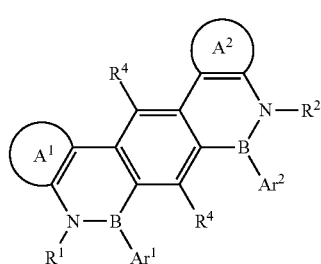
(I-2-b)

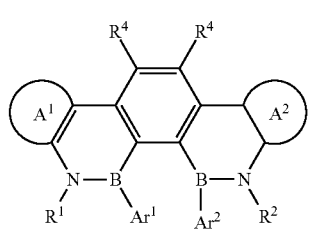
(I-2-c)

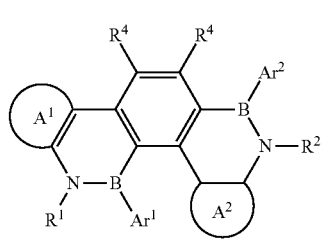
(I-2-d)

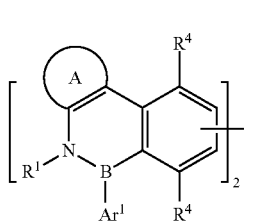
(I-2-e)

(I-2-f)

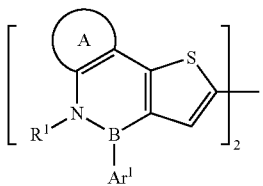

wherein R⁴ is at each occurrence selected from the group consisting of H, F and alkyl having from 1 to 20 carbon atoms.

Compounds comprising the structural unit of formulae (I-1) or (I-2) as defined above may preferably be selected from the group consisting of small molecules, monomers and polymers. As used herein, the term "small molecule" will be used to denote a compound comprising a structural unit of formulae (I-1) or (I-2) and two inert chemical groups, which are inert under use condition and thus inhibit such a small molecule from being polymerized. In contrast hereto, the term "monomer" is used to denote a compound comprising a structural unit of formulae (I-1) or (I-2) and at least one reactive chemical group, which allows such monomer to be reacted so as to form part of a polymer.

The present compounds may be synthesized from commercially available starting materials or from starting materials that are easily accessible by standard literature procedures. The azaborinine ring may for example be synthesized as shown in Scheme 1 by first reacting an amino-substituted biphenyl (1) with dichlorphenyl-borane to produce a chloro-N-aryl-borane amine (2), wherein the azaborinine ring can be closed to produce compound (3) by a Friedel-Crafts type cyclization with aluminum trichloride as for example described by P. R. Ashton et al., J. Chem. Soc., Perkin Trans. 2, 2001, 2166-2173.

Scheme 1

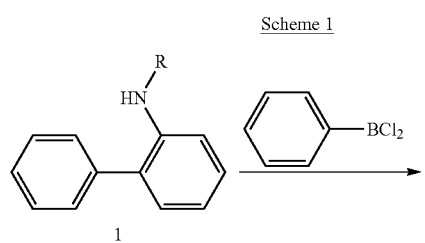

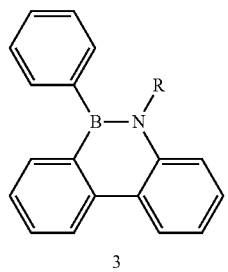

Applying the same methodology to aromatic diamines yields the compounds of the present invention which have two azaborinine rings as illustrated in the following Schemes 2a and 2b with TMS denoting trimethylsilyl. The starting material can be synthesized by standard literature procedures (see for example Houben-Weyl Methods in organic chemistry) as exemplified by the Suzuki-coupling of diaminodibromobenzene and benzene boronic acid to give the terphenyl derivative (5), which in turn can be used to produce compound (6) as shown above.

Scheme 2a

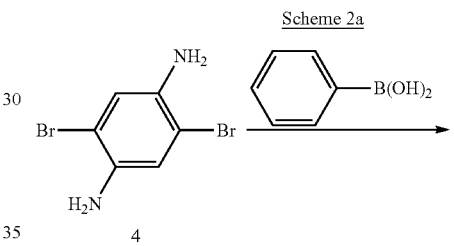

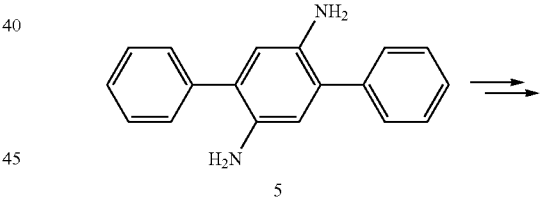

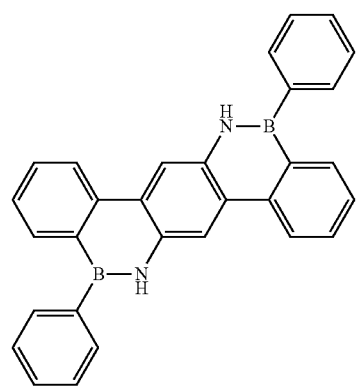

Scheme 2b

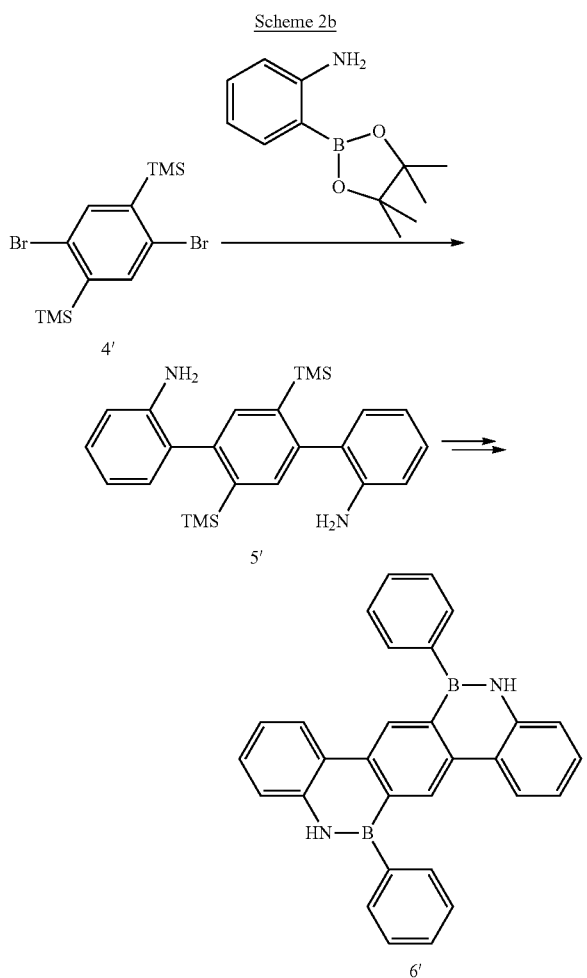

Small Molecule and Monomer

In one aspect the present application provides for a small molecule, i.e. for a compound comprising a structural unit of formula (I-1) or (I-2) and two inert chemical groups $R^a$ and $R^b$. Such a small molecule may for example be represented by formula (IV-a)

$$R^a\text{-M-}R^b \qquad (IV\text{-}a)$$

wherein M comprises a structural unit of formula (I-1) or (I-2) and $R^a$ and $R^b$ are inert chemical groups. Such inert chemical groups $R^a$ and $R^b$ may independently of each other for example be chosen from the group consisting of hydrogen, fluorine, alkyl having from 1 to 10 carbon atoms, fluoroalkyl having from 1 to 10 carbon atoms, aromatic ring systems of from 5 to 30 carbon atoms and aromatic ring systems of from 5 to 30 carbon atoms wherein one or more hydrogen atom may independently of each other be replaced by fluorine or alkyl having from 1 to 10 carbon atoms.

In another aspect the present application provides for a monomer, i.e. for a compound comprising a structural unit of formula (I-1) or (I-2) and at least one reactive chemical group $R^c$ which may be selected from group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —CCH, —C≡CSi(Z$^1$)$_3$, —ZnX$^0$ and —Sn(Z$^4$)$_3$, wherein X$^0$ is as defined above, and Z$^1$, Z$^2$, Z$^3$ and Z$^4$ are selected from the group consisting of alkyl and aryl, each being optionally substituted, and two groups Z$^2$ may also together form a cyclic group. Alternatively such a monomer may comprise two reactive chemical groups and is for example represented by formula (IV-b)

$$R^c\text{-M-}R^d \qquad (IV\text{-}b)$$

wherein M comprises a structural unit of formula (I-1) or (I-2) and $R^c$ and $R^d$ are reactive chemical groups as defined above for $R^c$.

Preferably, M in formulae (IV-a) and (IV-b) may further comprise one or more (for example 2, 3, 4, 5, 6, 7, 8, 9 or 10) aryl or heteroaryl as defined above. Preferred examples of M may be comprise, preferably consist of, the following $$\text{*—}U^a{}_{m1}\text{—Ar}^a{}_{m2}\text{—}U^b{}_{m3}\text{—Ar}^b{}_{m4}\text{—Ar}^c{}_{m5}\text{—*} \qquad (V)$$

wherein $U^a$ and $U^b$ are independently of each other selected from the structural unit of formula (I-1) or (I-2) and any of its subformulae as defined above;

Ar$^a$, Ar$^b$ and Ar$^c$ are independently of each other aryl or heteroaryl different from $U^a$ and $U^b$;

m1, m2, m3 and m4 are independently of each other selected from the group consisting of 0, 1 and 2, with the provision that at least one of m1 and m3 is not 0; and m5 is 0 or an integer from 1 to 10 (for example 2, 3, 4, 5, 6, 7, 8 or 9).

Preferably Ar$^a$, Ar$^b$ and Ar$^c$ are selected from aryl having from 5 to 30 ring atoms and heteroaryl having from 5 to 30 ring atoms. Said aryl and heteroaryl may optionally be substituted with at least one substituent L as defined earlier. Preferred substituents L are selected from alkyl having from 1 to 20 carbon atoms, more preferably from alkyl having from 1 to 10 carbon atoms. Optionally, said alkyl may be partially or completely fluorinated.

Preferred small molecules and monomers are those with M selected from one of the following formula (V-a-1) and (V-a-2)

$$\text{*—Ar}^a{}_{m2}\text{—}U^b\text{—Ar}^b{}_{m4}\text{—*} \qquad (V\text{-}a\text{-}1)$$

$$\text{*—}U^a{}_{m1}\text{—Ar}^a{}_{m2}\text{—}U^b{}_{m3}\text{—*} \qquad (V\text{-}a\text{-}2)$$

with Ar$^a$, Ar$^b$, $U^a$, $U^b$, m1, m2, m3 and m4 as defined above.

Especially preferred small molecules and monomers are those with M selected from one of the following formulae (V-b-1) to (V-b-5)

$$\text{*—Ar}^a\text{—}U^a\text{—Ar}^b\text{—*} \qquad (V\text{-}b\text{-}1)$$

$$\text{*—}U^a\text{—*} \qquad (V\text{-}b\text{-}2)$$

$$\text{*—Ar}^a\text{—}U^a\text{—*} \qquad (V\text{-}b\text{-}3)$$

$$\text{*—}U^a\text{—Ar}^b\text{—*} \qquad (V\text{-}b\text{-}4)$$

$$\text{*—}U^a\text{—Ar}^a\text{—}U^b\text{—*} \qquad (V\text{-}b\text{-}5)$$

with Ar$^a$, Ar$^b$, $U^a$ and $U^b$ as defined above.

Particularly preferred examples of M of formulae (V), (V-a-1), (V-a-2) and (V-b-1) to (V-b-5) are those wherein one or more of Ar$^a$, Ar$^b$ and Ar$^c$ denote aryl or heteroaryl, preferably having electron donor properties or electron acceptor properties.

Suitable examples of aryl and heteroaryl with electron donor properties may be selected from the group consisting of the following formulae (D1) to (D126)

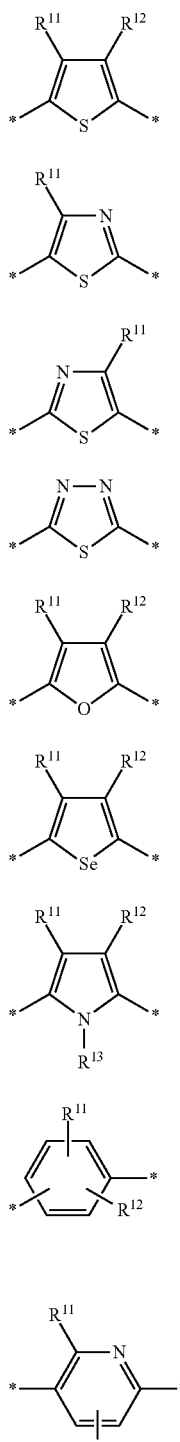
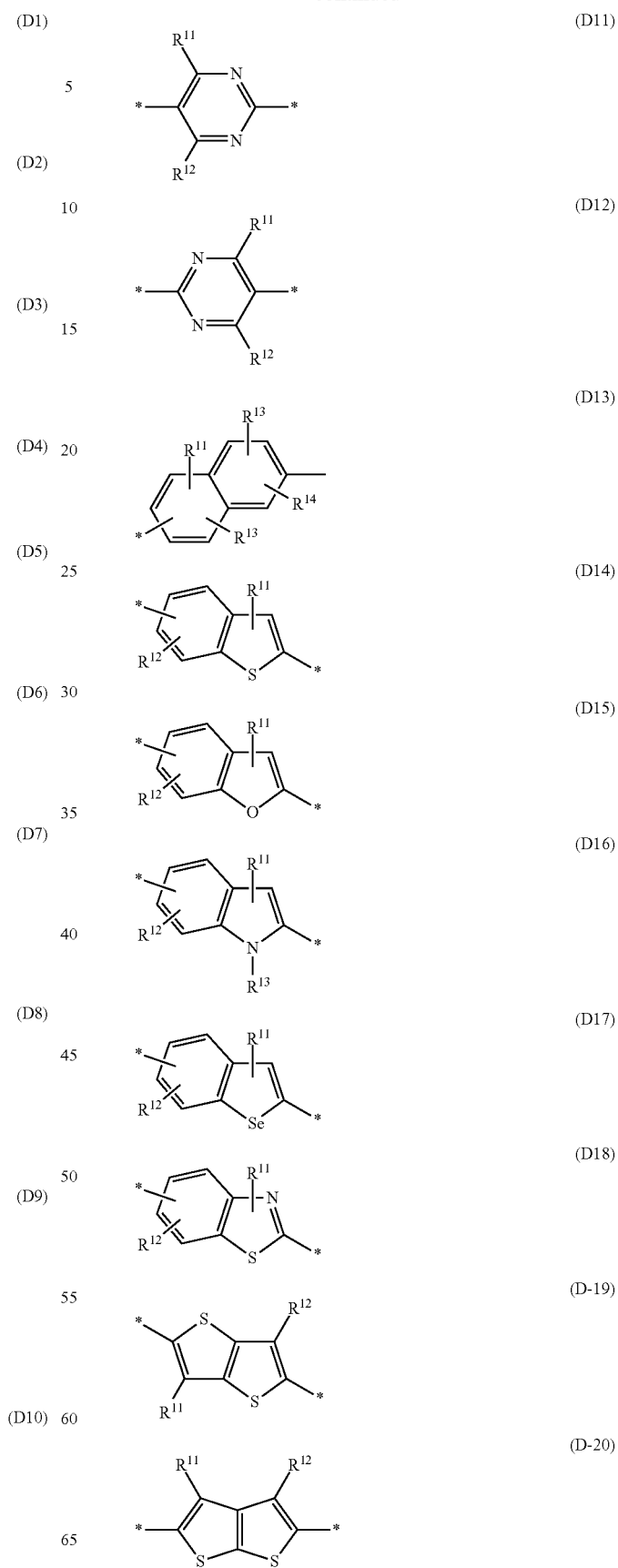

(D-21) 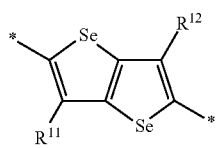
(D-22) 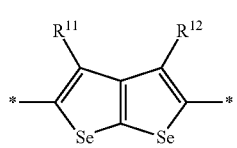
(D-23) 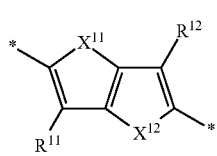
(D-24) 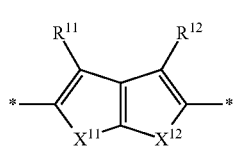
(D-25) 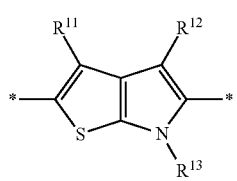
(D-26) 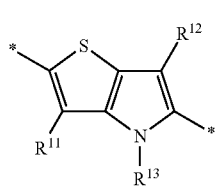
(D-27) 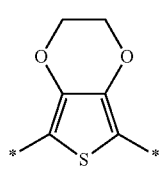
(D-28) 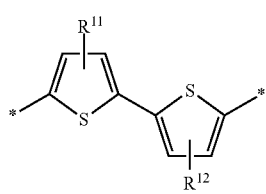
(D-29) 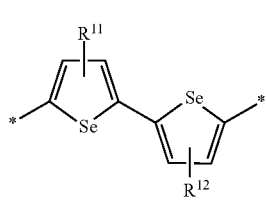
(D30) 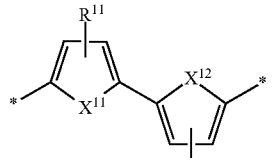
(D31) 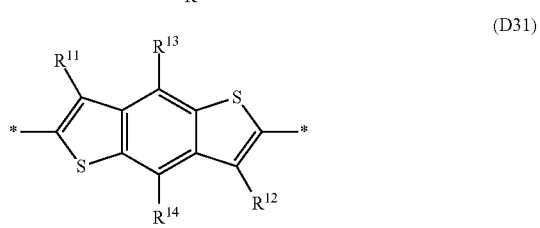
(D32) 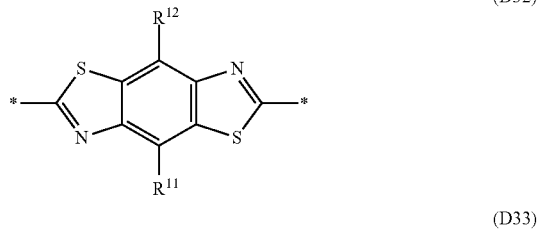
(D33) 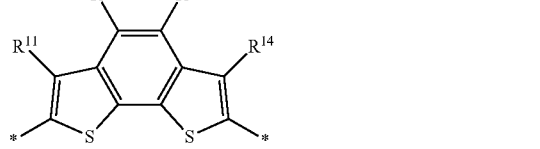
(D34) 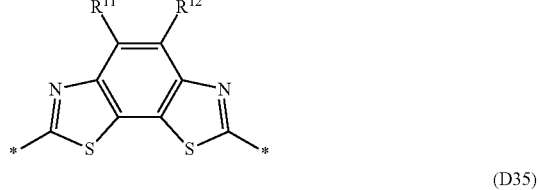
(D35) 
(D36) 

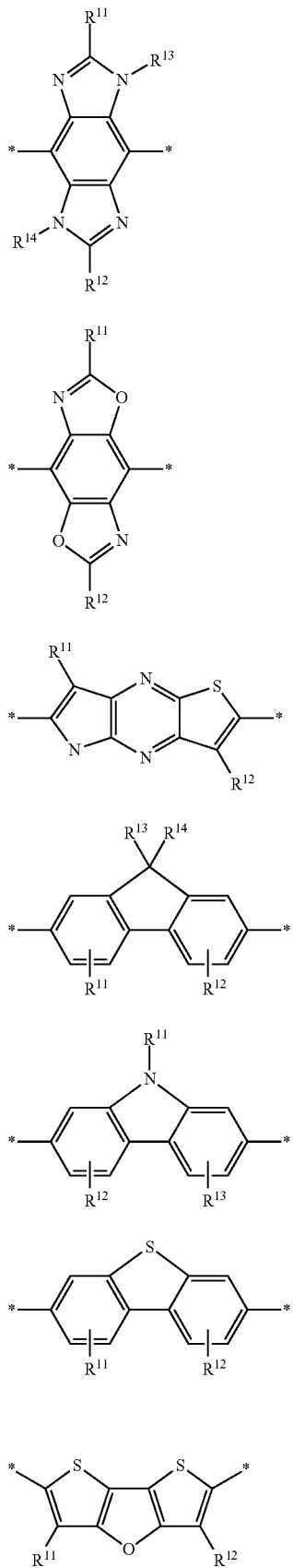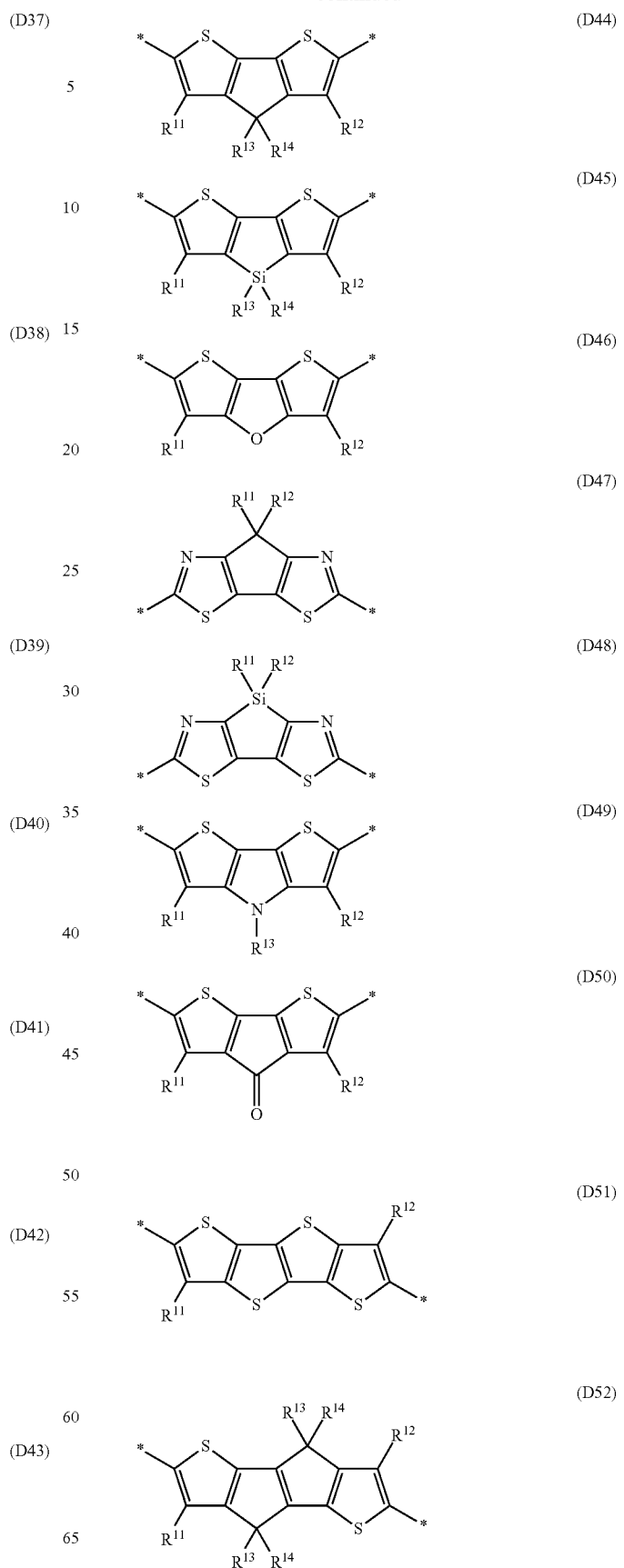

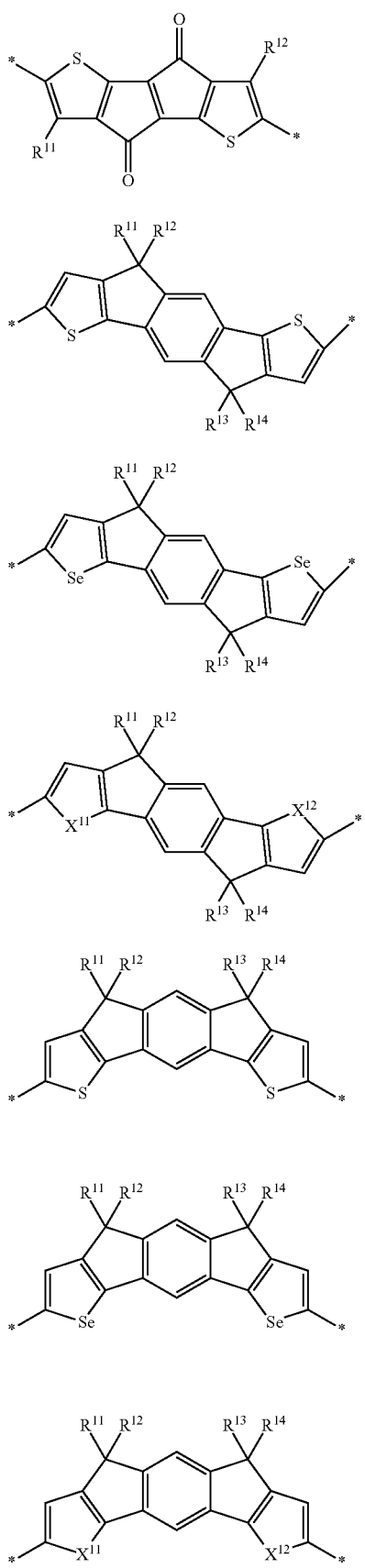
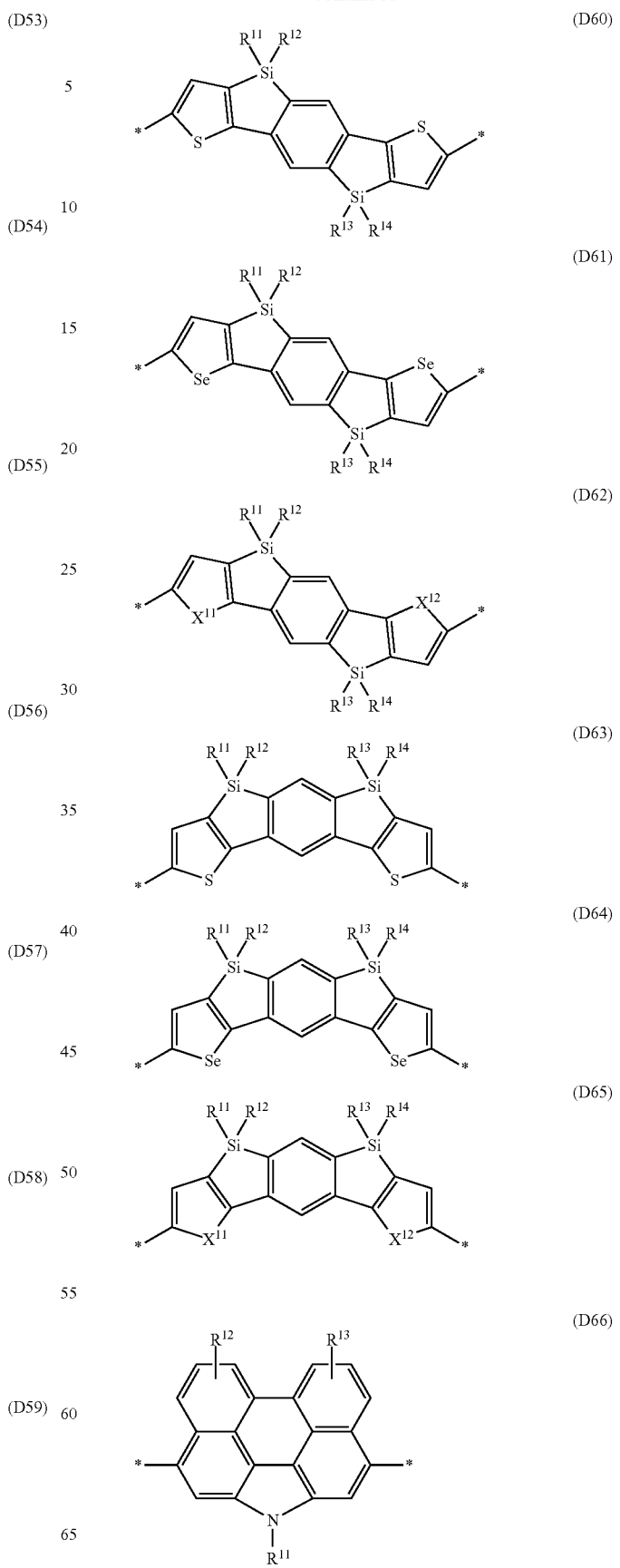

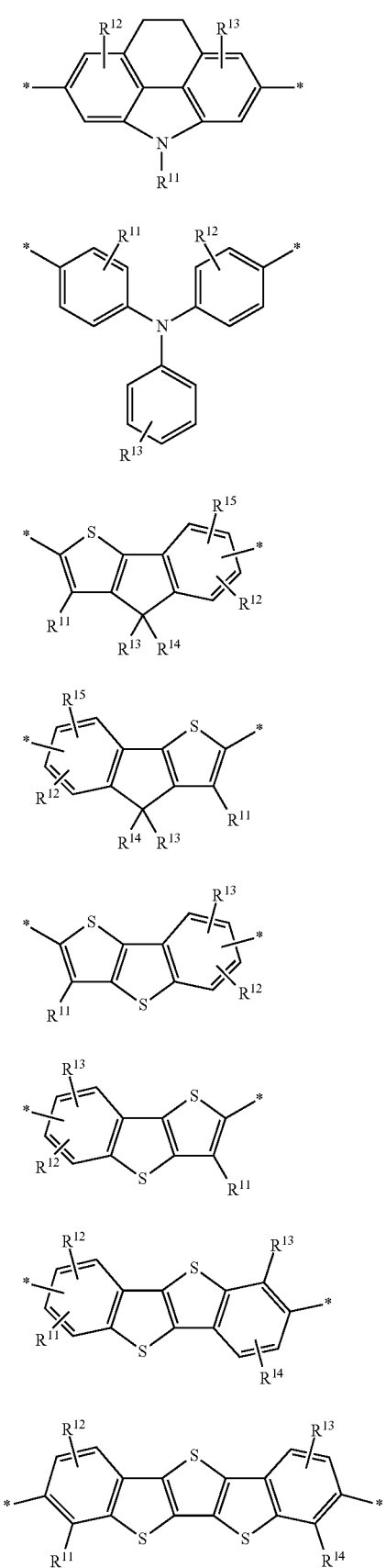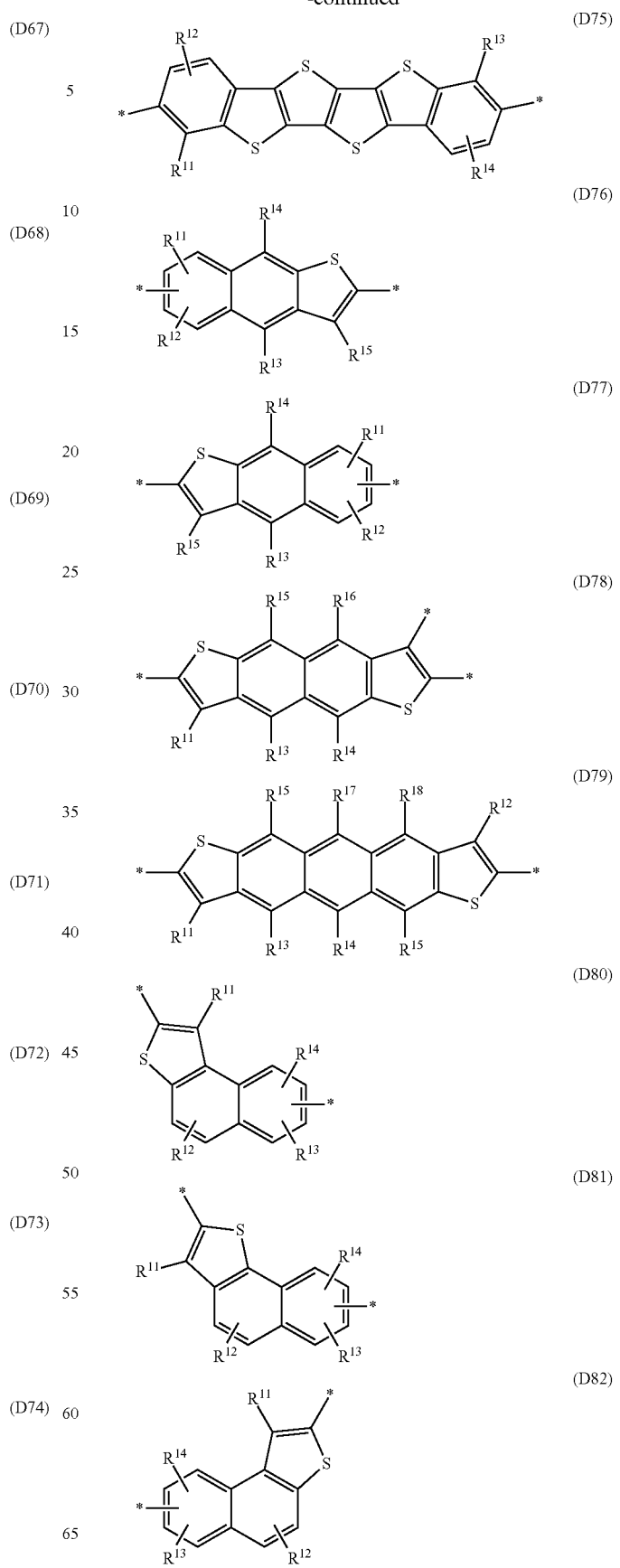

-continued
(D83) 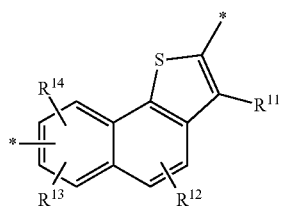
(D84) 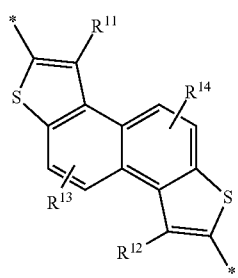
(D85) 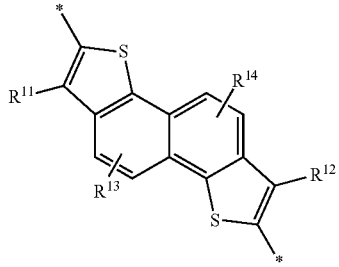
(D86) 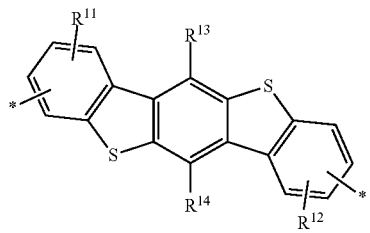
(D87) 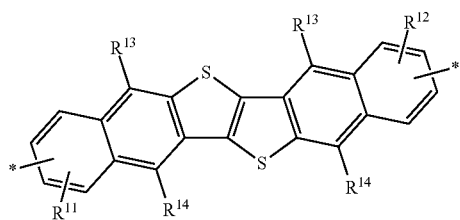
(D88) 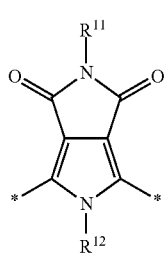
(D89) 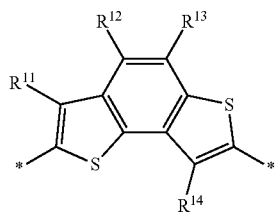
(D90) 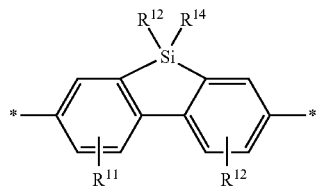
(D91) 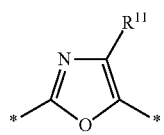
(D92) 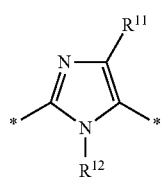
(D93) 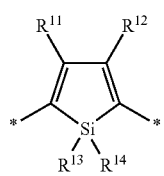
(D94) 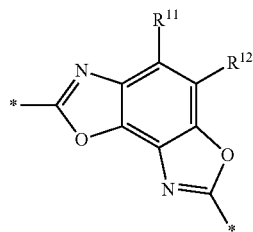
(D95) 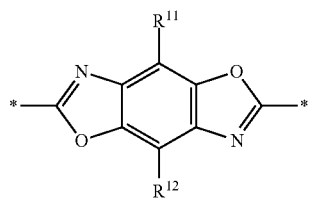
(D96) 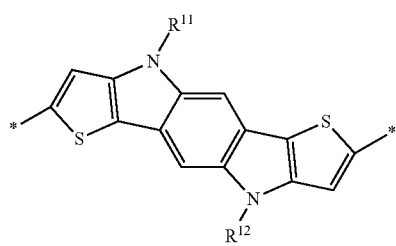

-continued
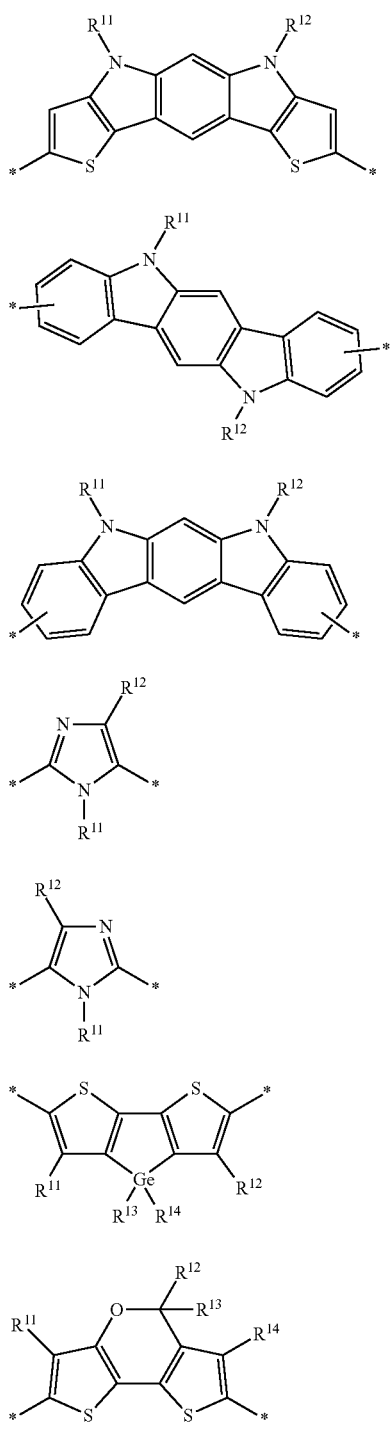
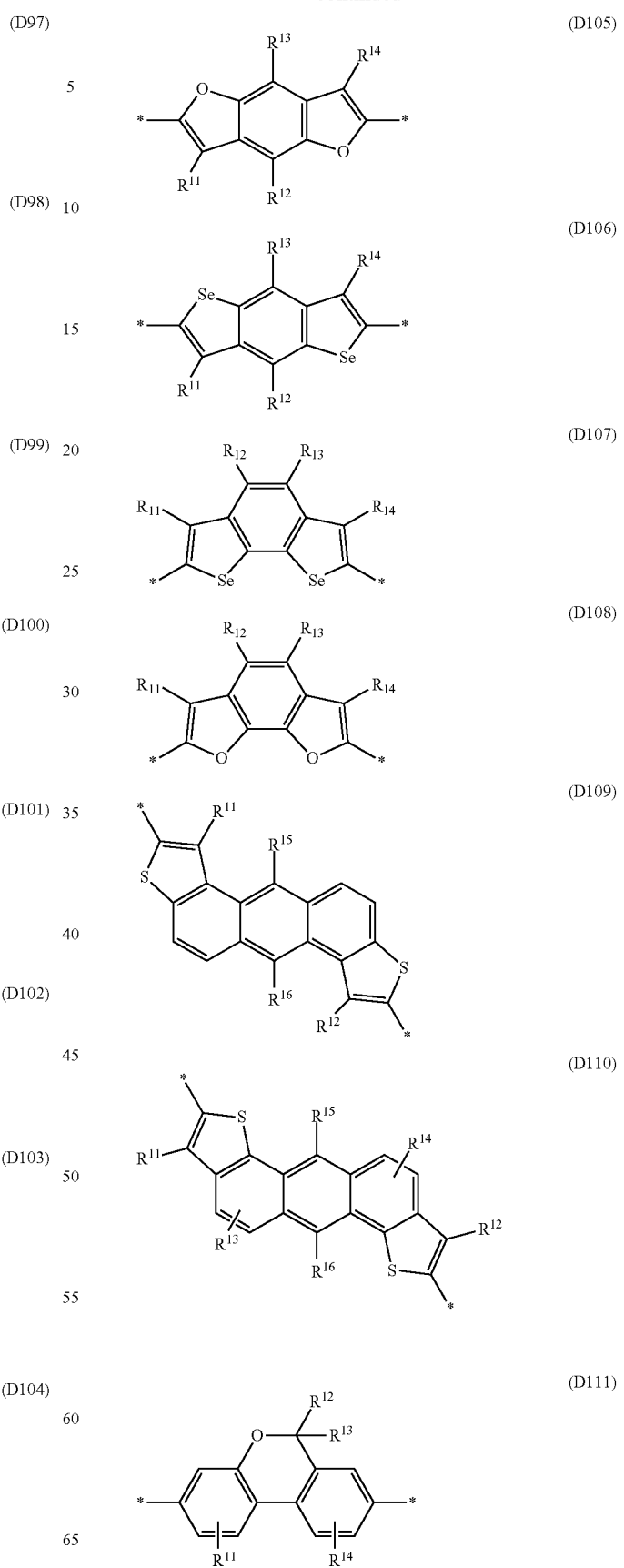

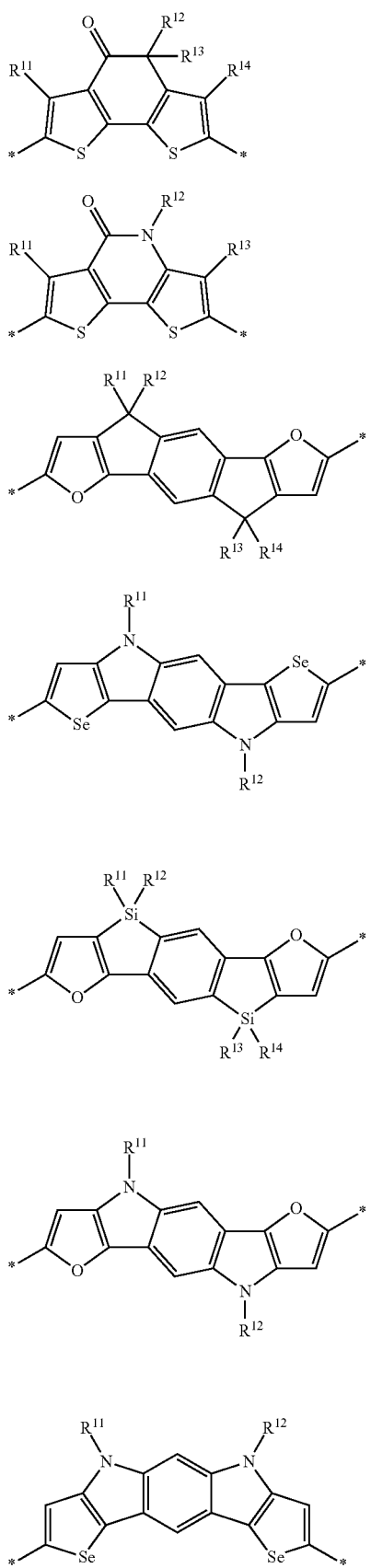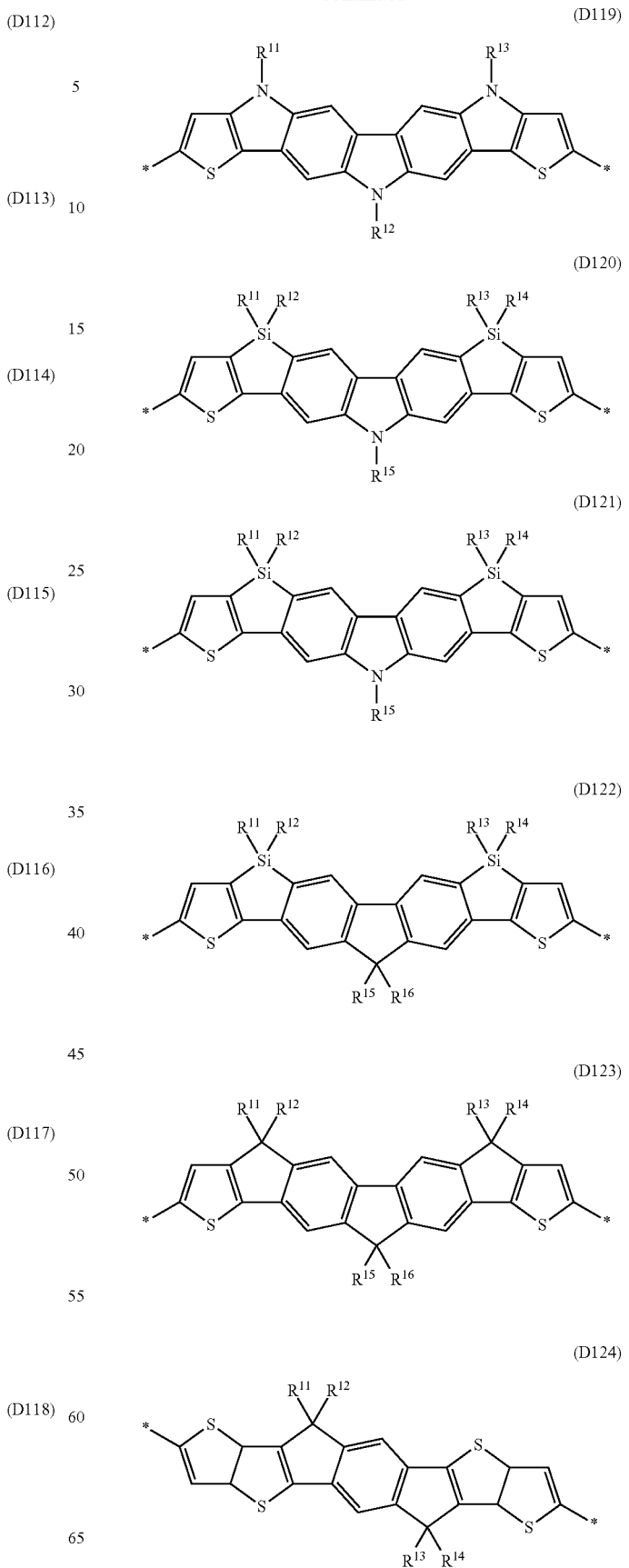

(D125)

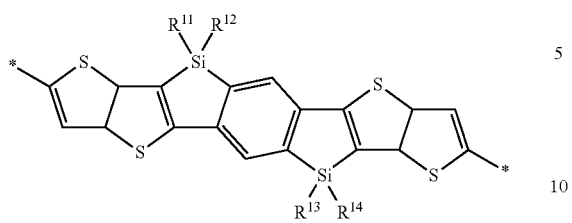

(D126)

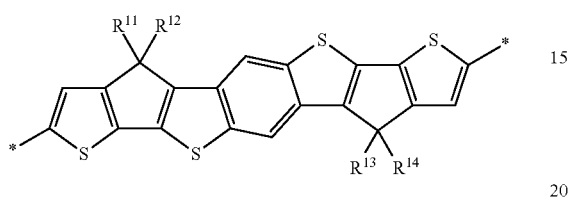

wherein one of $X^{11}$ and $X^{12}$ is S and the other is Se, and $R^{11}$, $R^{12}$, $R^{13}$, $R^{14}$, $R^{15}$, $R^{16}$, $R^{17}$ and $R^{18}$ being independently of each other selected from the group consisting of hydrogen, F, Br, Cl, —CN, —NC, —NCO, —NCS, —OCN, —SCN, —C(O)NR°R°°, —C(O)X°, —C(O)R°, —NH$_2$, —NR°R°°, —SH, —SR°, —SO$_3$H, —SO$_2$R°, —OH, —NO$_2$, —CF$_3$, —SF$_5$, optionally substituted silyl or hydrocarbyl with 1 to 40 C atoms that is optionally substituted and optionally comprises one or more hetero atoms, with X°, R° and R°° as defined earlier.

Suitable examples of aryl and heteroaryl with electron acceptor properties may be selected from the group consisting of the following formula (A-1) to (A-91)

(A1)

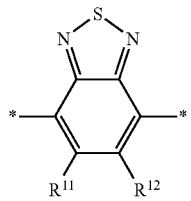

(A2)

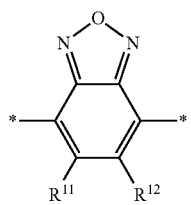

(A3)

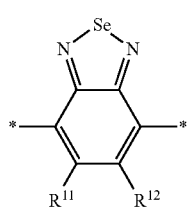

(A4)

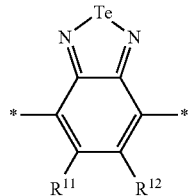

(A5)

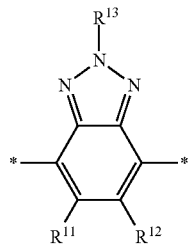

(A6)

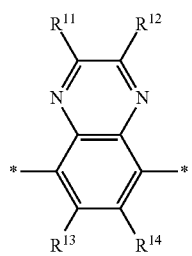

(A7)

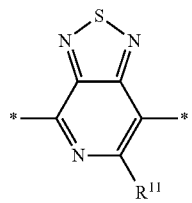

(A8)

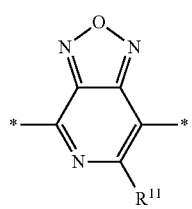

(A9)

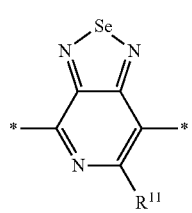

(A10)

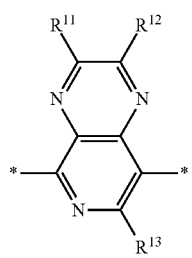

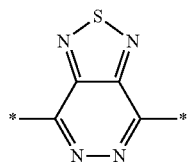 (A11)
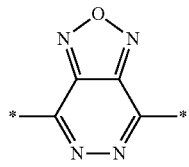 (A12)
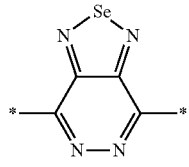 (A13)
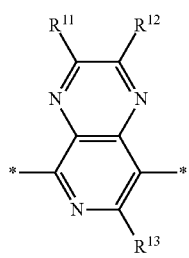 (A14)
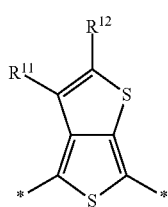 (A15)
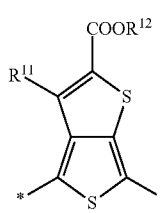 (A16)
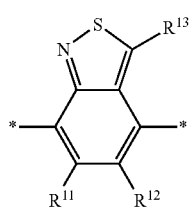 (A17)
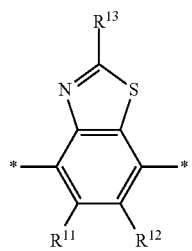 (A18)
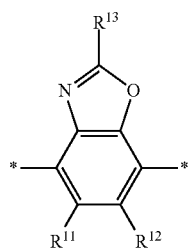 (A19)
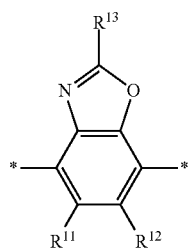 (A20)
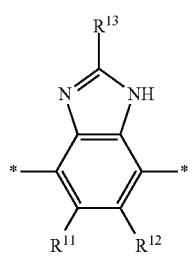 (A21)
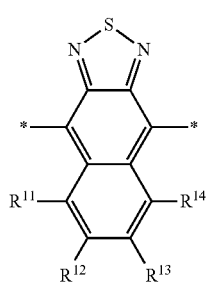 (A22)
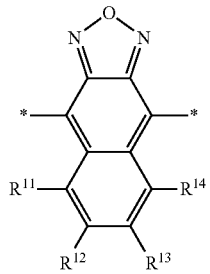 (A23)
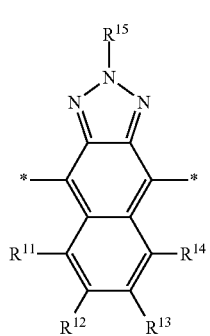

-continued
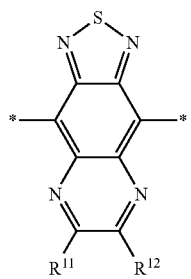 (A24)
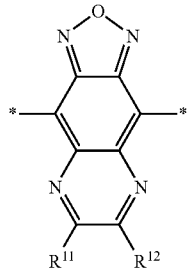 (A25)
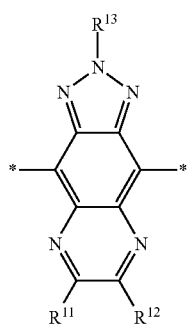 (A26)
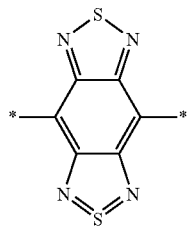 (A27)
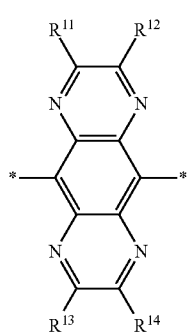 (A28)
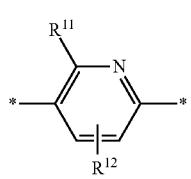 (A29)
-continued
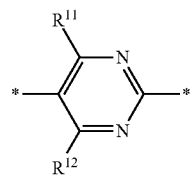 (A30)
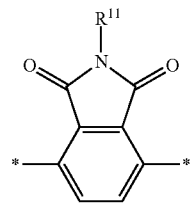 (A31)
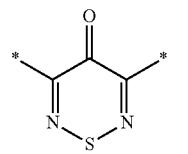 (A32)
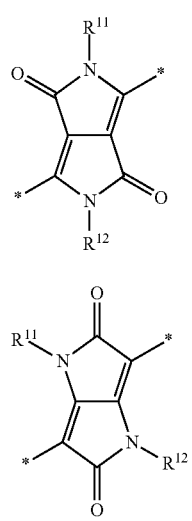 (A33)
(A34)
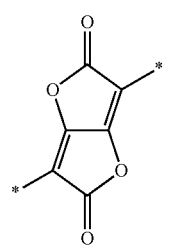 (A35)
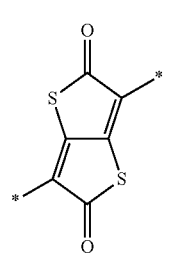 (A36)

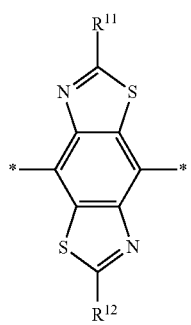 (A37)
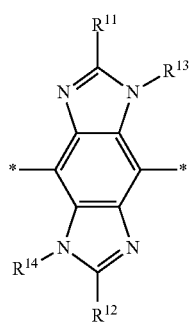 (A38)
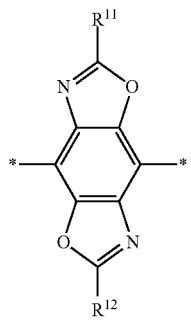 (A39)
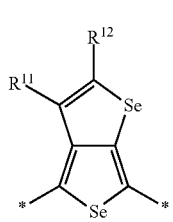 (A40)
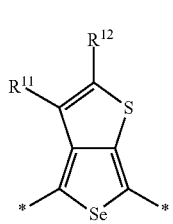 (A41)
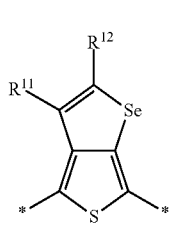 (A42)
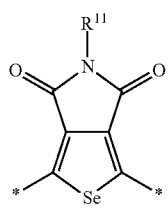 (A43)
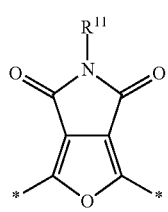 (A44)
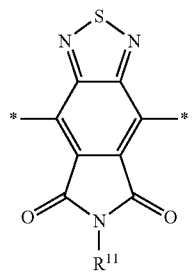 (A45)
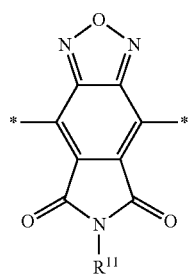 (A46)
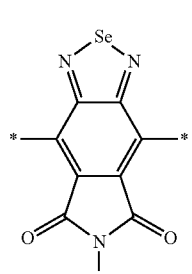 (A47)
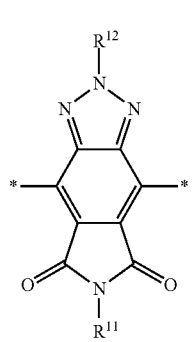 (A48)

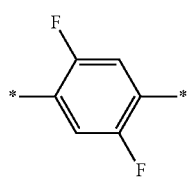 (A49)
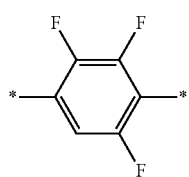 (A50)
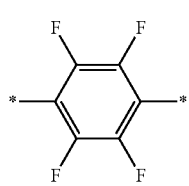 (A51)
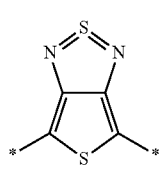 (A52)
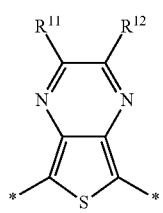 (A53)
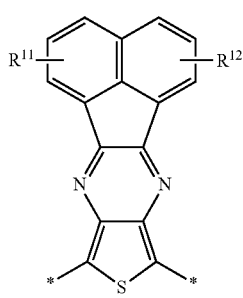 (A54)
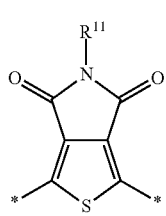 (A55)
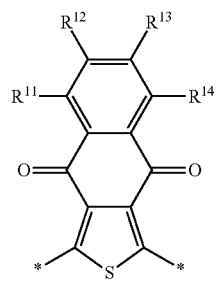 (A56)
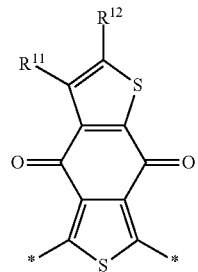 (A57)
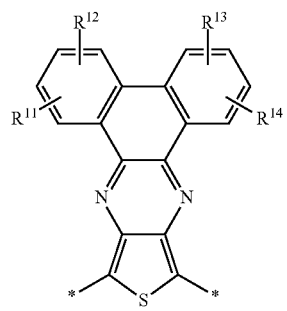 (A58)
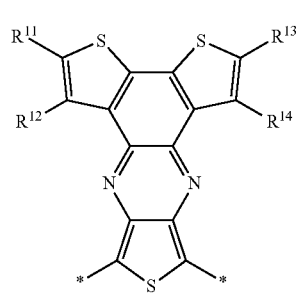 (A59)
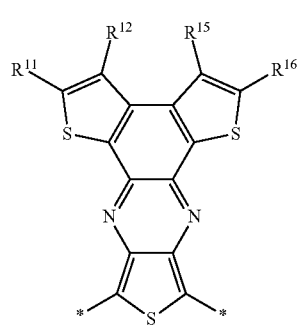 (A60)

(A61) 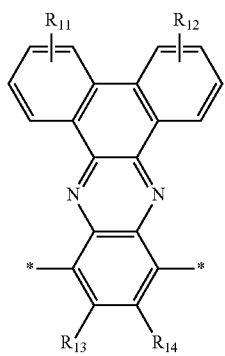
(A62) 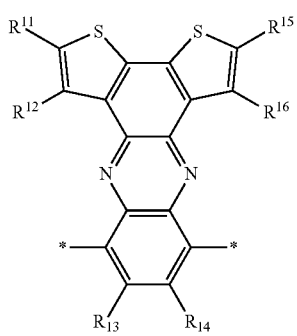
(A63) 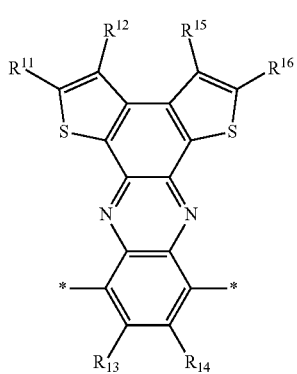
(A64) 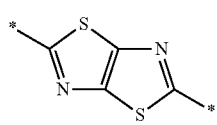
(A65) 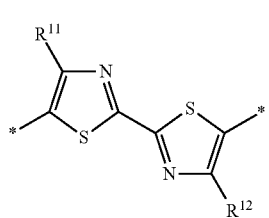
(A66) 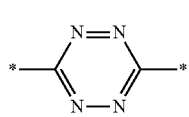
(A67) 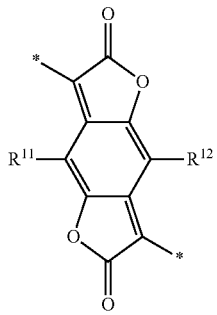
(A68) 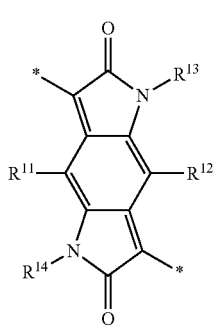
(A69) 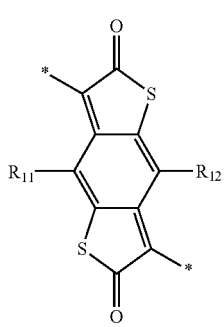
(A70) 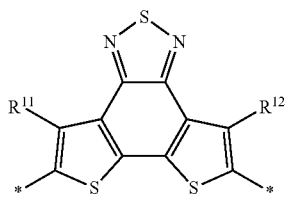
(A71) 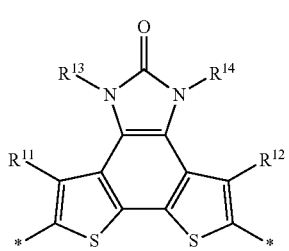

-continued
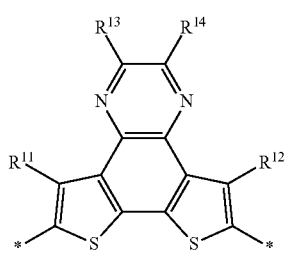
(A72)
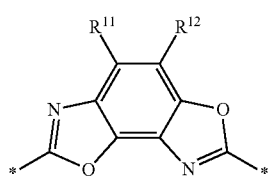
(A73)
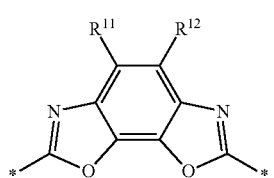
(A74)
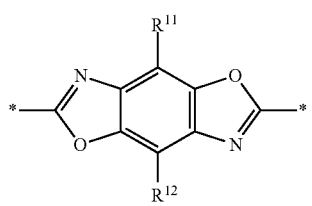
(A75)
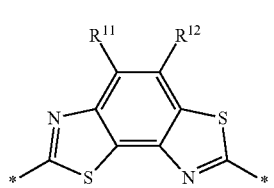
(A76)
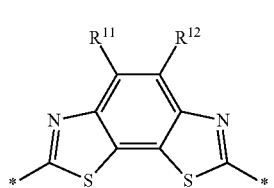
(A77)
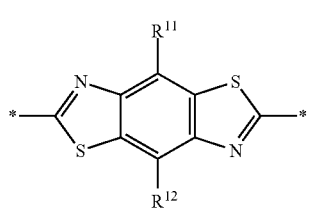
(A78)
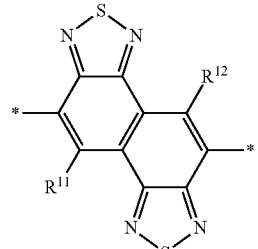
(A79)
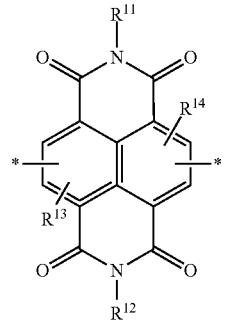
(A80)
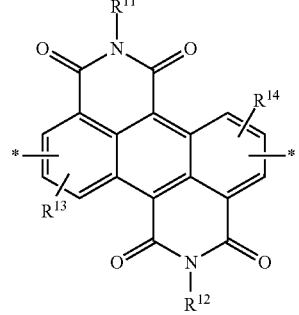
(A81)
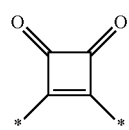
(A82)
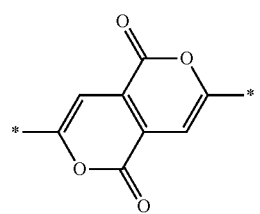
(A83)
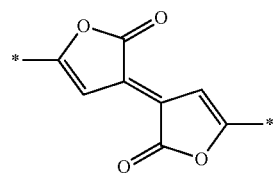
(A84)

-continued (A85) 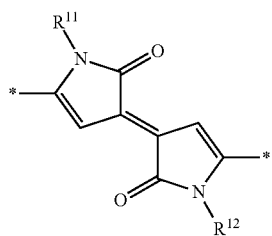

(D86) 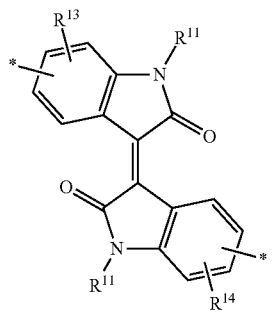

(D87) 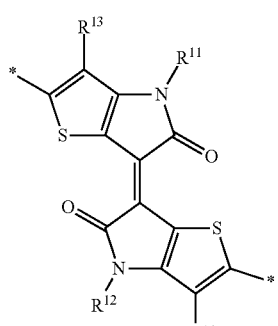

(D88) 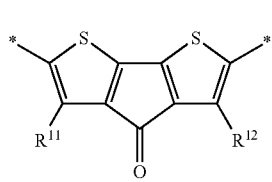

(D89) 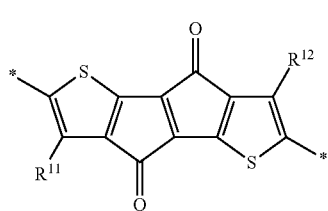

(D90) 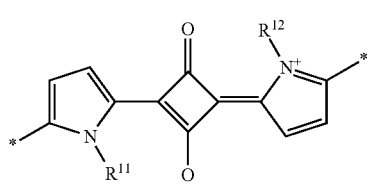

(D91) 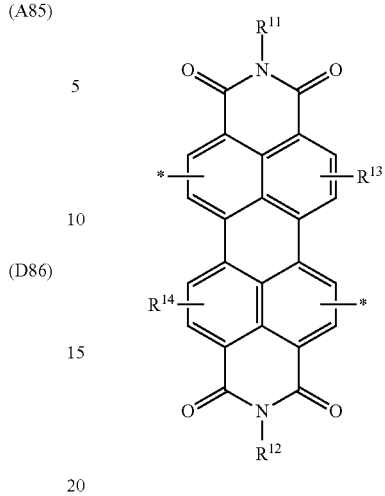

wherein one of $X^{11}$ and $X^{12}$ is S and the other is Se, and $R^{11}$, $R^{12}$, $R^{13}$, $R^{14}$ and $R^{15}$ being independently of each other selected from the group consisting of hydrogen, F, Br, Cl, —CN, —NC, —NCO, —NCS, —OCN, —SCN, —C(O)NR°R°°, —C(O)X°, —C(O)R°, —NH$_2$, —NR°R°°, —SH, —SR°, —SO$_3$H, —SO$_2$R°, —OH, —NO$_2$, —CF$_3$, —SF$_5$, optionally substituted silyl or hydrocarbyl with 1 to 40 C atoms that is optionally substituted and optionally comprises one or more hetero atoms, with X°, R° and R°° as defined earlier.

Polymer

In a further aspect the present application provides for an oligomer or polymer, i.e. for a compound comprising more than one structural unit of formula (I-1) or (I-2). Preferably such oligomer or polymer comprises more than one group M as defined in any one of formulae (V), (V-a-1), (V-a-2) and (V-b-1) to (V-b-5). At each occurrence M may be the same or different.

Optionally, such oligomer or polymer may further comprise a repeating unit comprising a group selected from monocyclic or polycyclic aryl or heteroaryl groups that are optionally substituted. Preferably such further repeating units are selected from one of the following $$*-[-Ar^d{}_{m6}-Ar^a{}_{m2}-Ar^e{}_{m7}-Ar^b{}_{m4}-Ar^c{}_{m5}]-* \quad (VI)$$

wherein $Ar^a$, $Ar^b$, $Ar^c$, m2, m4 and m5 are as defined above;

$Ar^d$ and $Ar^e$ are independently of each aryl or heteroaryl with electron donor properties or electron acceptor properties, preferably independently of each other chosen from the group consisting of formulae (D-1) to (D-126) and (A-1) to (A-91); and m6 and m7 are independently of each other 0, 1 or 2, provided that at least one of m6 and m7 is not 0 (for example m6 is 0 and m7 is 1, or m6 is 1 and m7 is 0, or m6 is 1 and m7 is 1).

Preferred oligomers and polymers may for example comprise a polymer chain of formula (VII)

$$*-[-(M^1)_{mx}-(M^2)_{my}-(M^3)_{mz}-]_m-* \quad (VII)$$

wherein m is an integer >1;

$M^1$, $M^2$ and $M^3$ are independently of each other monomeric units as defined below, provided that at least one of $M^1$, $M^2$ and $M^3$ comprises a structural unit of formula (I-1) or (I-2);

mx is >0 and ≤1;

my is >0 and <1; and mz is >0 and <1, with the provision that mx+my+mz=1.

Preferably $M^1$, $M^2$ and $M^3$ are independently of each other selected from the group consisting of M as defined in and for above formulae (V), (V-a-1), (V-a-2) and (V-b-1) to (V-b-5).

Examples of suitable polymer chains of formula (VI) may be selected from the following formulae (VII-1) to (VII-10)

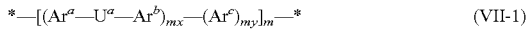  (VII-1)

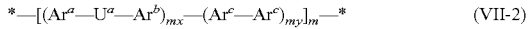  (VII-2)

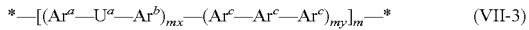  (VII-3)

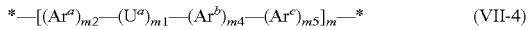  (VII-4)

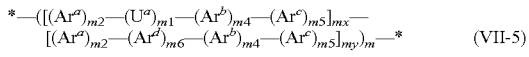  (VII-5)

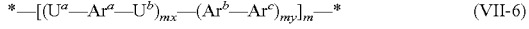  (VII-6)

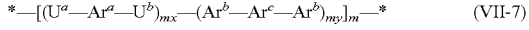  (VII-7)

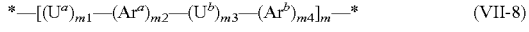  (VII-8)

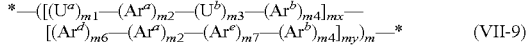  (VII-9)

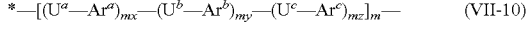  (VII-10)

wherein $Ar^a$, $Ar^b$, $Ar^c$, $Ar^d$, $Ar^e$, $U^a$, $U^b$, m1, m2, m3, m4, m5, m6, m7, m, mx, my and mz are as defined above, and $U^c$ is as defined above for $U^a$ and $U^b$.

Such polymers can be alternating or random copolymers. With respect to formulae (VII-4) and (VII-6) it is preferred that in at least one of the repeating units $[(Ar^a)_{m2}-(U^a)_{m1}-(Ar^b)_{m4}-(Ar^c)_{m5}]$, and—if present—in at least one of the repeating units $[(Ar^a)_{m2}-(Ar^d)_{m6}-(Ar^b)_{m4}-(Ar^c)_{m5}]$ m1 is at least 1 and m4 is at least 1. With respect to formulae (VII-8) and (VII-9) it is preferred that in at least one of the repeating units $[(U^a)_{m1}-(Ar^a)_{m2}-(U^b)_{m3}-(Ar^b)_{m4}]$, and—if present—in at least one of the repeating units $[(Ar^d)_{m6}-(Ar^a)_{m2}-(Ar^e)_{m7}-(Ar^b)_{m4}]$ m1 is at least 1 and m6 is at least 1.

For the present oligomers and polymers the total number m of repeating units is preferably from 2 to 10000. For a polymer the total number m of repeating units is preferably at least 10 and most preferably at least 50. For a polymer the total number m of repeating units is preferably at most 2000, more preferably at most 1000 and most preferably at most 500. Any combination of these values is also possible.

The present oligomers and polymers include homopolymers and copolymers, such as for example statistical or random copolymers, alternating copolymers and block copolymers as well as any combination of these.

Particularly preferred are polymers selected from the following groups a) Group 1 consisting of homopolymers of the unit $U^a$ or $(Ar^a-U^a)$ or $(Ar^a-U^a-Ar^b)$ or $(Ar^a-U^a-Ar^c)$ or $(U^a-Ar^b-Ar^c)$ or $(Ar^a-U^a-Ar^b-Ar^c)$ or $(U^a-Ar^a-U^a)$, i.e. where all repeating units are identical, b) Group 2 consisting of random or alternating copolymers formed by identical units $(Ar^a-U^a-Ar^b)$ or $(U^a-Ar^a-U^a)$ and identical units $(Ar^c)$, c) Group 3 consisting of random or alternating copolymers formed by identical units $(Ar^a-U^a-Ar^b)$ or $(U^a-Ar^a-U^b)$ and identical units $(Ar^a)$, d) Group 4 consisting of random or alternating copolymers formed by identical units $(Ar^a-U^a-Ar^b)$ or $(U^a-Ar^a-U^b)$ and identical units $(Ar^a-Ar^d-Ar^b)$ or $(Ar^d-Ar^a-Ar^e)$, wherein in all these groups $Ar^a$, $Ar^b$, $Ar^c$, $Ar^d$, $Ar^e$, $U^a$ and $U^b$ are as defined above and below, in groups 1, 2 and 3 $Ar^a$, $Ar^b$ and $Ar^c$ are different from a single bond, and in group 4 one of $Ar^a$ and $Ar^b$ may also denote a single bond.

Preferred polymers may be those of formula (VIII)

  (VIII)

wherein "chain" denotes a polymer chain of any one of formulae (VII) or (VII-1) to (VII-10), and $R^e$ and $R^f$ have independently of each other one of the meanings of $R^S$ as defined above, or denote, independently of each other, H, F, Br, Cl, I, $-CH_2Cl$, $-CHO$, $-CR'=CR''_2$, $-SiR'R''R'''$, $-SiR'X''X'''$, $-SiR'R''X''$, $-SnR'R''R'''$, $-BR'R''$, $-B(OR')(OR'')$, $-B(OH)_2$, $-O-SO_2-R'$, $-C\equiv CH$, $-C\equiv C-SiR'_3$, $-ZnX''$ or an endcap group, $X''$ and $X'''$ denote halogen, R', R" and R''' have independently of each other one of the meanings of $R^0$ as defined earlier, and two of R', R" and R''' may also form a ring together with the atom to which they are attached.

Preferred endcap groups $R^e$ and $R^f$ are H, $C_{1-20}$ alkyl, or optionally substituted $C_{6-12}$ aryl or $C_{2-10}$ heteroaryl, very preferably H, alkyl having from 1 to 10 carbon atoms or phenyl.

In the polymer chains of formulae (VII) and (VII-1) to (VII-10) mx, my and mz denote the mole fraction of units $M^1$, $M^2$ and $M^3$, respectively, and m denotes the degree of polymerisation. These formulae are intended to include block copolymers, random or statistical copolymers and alternating copolymers of $M^1$, $M^2$ and $M^3$, as well as homopolymers of $M^1$ for the case when mx>0 and my=mz=0.

Further preferred are repeating units, monomers, oligomers and polymers of formulae (IV-a), (IV-b), (V), (V-a-1), (V-a-2), (V-b-1) to (V-b-5), (VI), (VII), (VII-1) to (VII-10) and (VIII) characterised by one or more of the following preferred or alternative aspects provided that such aspects are not mutually exclusive:

0<my<1 and mz=0;

0<my<1 and 0<mz<1;

$M_w$ is at least 5,000, preferably at least 8,000, more preferably at least 10,000;

$M_w$ is at most 300,000, preferably at most 100,000;

$R^1$ and $R^2$ are phenyl which is mono- or polysubstituted, preferably mono-substituted in the 4-position (i.e. the para-position), with substituents selected from linear or branched alkyl having from 1 to 20 carbon atoms, wherein one or more H may optionally be replaced by F;

all groups $R^s$ denote H;

at least one group $R^s$ is different from H;

$R^s$ may be selected independently at each occurrence from the group consisting of primary alkyl having from 1 to 30 carbon atoms, secondary alkyl having from 3 to 30 carbon atoms, and tertiary alkyl having from 4 to 30 carbon atoms, wherein one or more H may optionally be replaced by F;

$R^s$ may be selected independently at each occurrence from the group consisting of aryl and heteroaryl, each of which may optionally be fluorinated, alkylated or alkoxylated and has from 4 to 30 ring atoms;

$R^S$ is selected, on each occurrence identically or differently, from the group consisting of aryl and heteroaryl, each of which is optionally fluorinated, or alkylated and has 4 to 30 ring atoms, $R^S$ is selected, on each occurrence identically or differently, from the group consisting of primary alkoxy or sulfanylalkyl with 1 to 30 C atoms, secondary alkoxy or sulfanylalkyl with 3 to 30 C atoms, and tertiary alkoxy or sulfanylalkyl with 4 to 30 C atoms, wherein in all these groups one or more H atoms are optionally replaced by F, $R^S$ is selected, on each occurrence identically or differently, from the group consisting of aryloxy and heteroaryloxy, each of which is optionally alkylated or alkoxylated and has 4 to 30 ring atoms, $R^S$ is selected, on each occurrence identically or differently, from the group consisting of alkylcarbonyl, alkoxycarbonyl and alkylcarbonyloxy, all of which are straight-chain or branched, are optionally fluorinated, and have from 1 to 30 C atoms, $R^S$ denotes, on each occurrence identically or differently, F, Cl, Br, I, CN, $R^g$, —C(O)—$R^g$, —C(O)—O—$R^g$, or —O—C(O)—$R^g$, —SO$_2$—$R^g$, —SO$_3$—$R^g$, wherein $R^g$ is straight-chain, branched or cyclic alkyl with 1 to 30 C atoms, in which one or more non-adjacent C atoms are optionally replaced by —O—, —S—, —C(O)—, —C(O)—O—, —O—C(O)—, —O—C(O)—O—, —SO$_2$—, —SO$_3$—, —CR$^0$=CR$^{00}$— or —C≡C— and in which one or more H atoms are optionally replaced by F, Cl, Br, I or CN, or $R^g$ is aryl or heteroaryl having 4 to 30 ring atoms which is unsubstituted or which is substituted by one or more halogen atoms or by one or more groups $R^1$ as defined above, $R^0$ and $R^{00}$ are selected from H or $C_1$-$C_{10}$-alkyl, $R^e$ and $R^f$ are independently of each other selected from H, halogen, —CH$_2$Cl, —CHO, —CH=CH$_2$, —SiR'R"R'", —SnR'R"R'", —BR'R", —B(OR')(OR"), —B(OH)$_2$, P-Sp, $C_1$-$C_{20}$-alkyl, $C_1$-$C_{20}$-alkoxy, $C_2$-$C_{20}$-alkenyl, $C_1$-$C_{20}$-fluoroalkyl and optionally substituted aryl or heteroaryl, preferably phenyl, $R^c$ and $R^d$ are independently of each other selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^4$)$_2$, —C≡CH, C≡CSi(Z$^1$)$_3$, —ZnX$^0$ and —Sn(Z$^4$)$_3$, wherein X$^0$ is halogen, and Z$^1$, Z$^2$, Z$^3$ and Z$^4$ are selected from the group consisting of alkyl and aryl, each being optionally substituted, and two groups Z$^2$ may also form a cyclic group.

The compounds of the present invention can be synthesized according to or in analogy to methods that are known to the skilled person and are described in the literature. Other methods of preparation can be taken from the examples. For example, the polymers can be suitably prepared by aryl-aryl coupling reactions, such as Yamamoto coupling, Suzuki coupling, Stille coupling, Sonogashira coupling, Heck coupling or Buchwald coupling. Suzuki coupling, Stille coupling and Yamamoto coupling are especially preferred. The monomers which are polymerized to form the repeat units of the polymers can be prepared according to methods which are known to the person skilled in the art.

Thus, the process for preparing the present polymers comprises the step of coupling monomers, therein comprised a monomer comprising the structural unit of formula (I-1) or (I-2), said monomers comprising at least one or alternatively two functional monovalent group selected from the group consisting of Cl, Br, I, O-tosylate, O-triflate, O-mesylate, O-nonaflate, —SiMe$_2$F, —SiMeF$_2$, —O—SO$_2$Z$^1$, —B(OZ$^2$)$_2$, —CZ$^3$=C(Z$^3$)$_2$, —CCH, —C≡CSi(Z$^1$)$_3$, —ZnX$^0$ and —Sn(Z$^4$)$_3$, wherein X$^0$ is halogen, and Z$^1$, Z$^2$, Z$^3$ and Z$^4$ are independently of each other selected from the group consisting of alkyl and aryl, each being optionally substituted, and two groups Z$^2$ may also together form a cyclic group.

Preferably the polymers are prepared from monomers of general formula (IV-b) or their preferred subformulae as described above and below.

Another aspect of the invention is a process for preparing a polymer by coupling one or more identical or different monomeric units comprising a structural unit of formula (I-1) or (I-2), or monomers of general formula (IV-a) with each other and/or with one or more co-monomers in a polymerisation reaction, preferably in an aryl-aryl coupling reaction.

Suitable and preferred comonomers may be selected from the following formulae

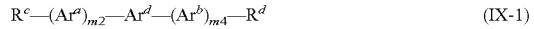  (IX-1)

  (IX-2)

  (IX-3)

wherein Ar$^a$, Ar$^b$, Ar$^d$, m2, m4, R$^c$ and R$^d$ are as defined herein.

Very preferred is a process for preparing a polymer by coupling one or more monomers selected from formula (V-a-1) or (V-a-2) with one or more monomers of formula (IX-1), and optionally with one or more monomers selected from formula (IX-2) and (IX-3), in an aryl-aryl coupling reaction, wherein preferably R$^c$ and R$^d$ are selected from Cl, Br, I, —B(OZ$^2$)$_2$ and —Sn(Z$^4$)$_3$.

For example, preferred embodiments of the present invention relate to a) a process of preparing a polymer by coupling a monomer of formula (IX-1)

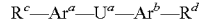

with a monomer of formula (IX-2)

  (IX-2)

in an aryl-aryl coupling reaction; or b) a process of preparing a polymer by coupling a monomer of formula

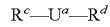

with a monomer of formula (IX-1)

  (IX-1)

in an aryl-aryl coupling reaction; or c) a process of preparing a polymer by coupling a monomer of formula

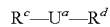

with a monomer of formula (IX-3)

  (IX-3)

in an aryl-aryl coupling reaction; or d) a process of preparing a polymer by coupling a monomer of formula

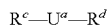

with a monomer of formula (IX-3)

$R^c-Ar^d-R^d$      (IX-3)

and a monomer of formula (IX-2)

$R^c-Ar^a-R^d$      (IX-2)

in an aryl-aryl coupling reaction; or e) a process of preparing a polymer by coupling a monomer of formula

with a monomer of formula (IX-2)

$R^c-Ar^a-R^d$      (IX-2)

in an aryl-aryl coupling reaction; or f) a process of preparing a polymer by coupling a monomer of formula

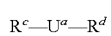

with a monomer of formula (IX-2)

$R^c-Ar^a-R^d$      (IX-2)

and a monomer of formula (IX-3)

$R^c-Ar^d-R^d$      (IX-3)

in an aryl-aryl coupling reaction,
wherein $Ar^a$, $Ar^b$, $Ar^d$, $U^a$, $U^b$, $R^c$ and $R^d$ are as defined herein, with $R^c$ and $R^d$ preferably selected from Cl, Br, I, $-B(OZ^2)_2$ and $-Sn(Z^4)_3$ as defined in respect to formulae (VI-a) and (IV-b).

Preferred aryl-aryl coupling and polymerisation methods used in the processes described above and below are Yamamoto coupling, Kumada coupling, Negishi coupling, Suzuki coupling, Stille coupling, Sonogashira coupling, Heck coupling, C—H activation coupling, Ullmann coupling or Buchwald coupling. Especially preferred are Suzuki coupling, Negishi coupling, Stille coupling and Yamamoto coupling. Suzuki coupling is described for example in WO 00/53656 A1. Negishi coupling is described for example in *J. Chem. Soc., Chem. Commun.*, 1977, 683-684. Yamamoto coupling is described for example in T. Yamamoto et al., *Prog. Polym. Sci.*, 1993, 17, 1153-1205, or WO 2004/022626 A1, and Stille coupling is described for example in Z. Bao et al., *J. Am. Chem. Soc.*, 1995, 117, 12426-12435. For example, when using Yamamoto coupling, monomers having two reactive halide groups are preferably used. When using Suzuki coupling, compounds of formula (IV-b) having two reactive boronic acid or boronic acid ester groups or two reactive halide groups are preferably used. When using Stille coupling, monomers having two reactive stannane groups or two reactive halide groups are preferably used. When using Negishi coupling, monomers having two reactive organozinc groups or two reactive halide groups are preferably used.

Preferred catalysts, especially for Suzuki, Negishi or Stille coupling, are selected from Pd(0) complexes or Pd(II) salts. Preferred Pd(0) complexes are those bearing at least one phosphine ligand, for example Pd(Ph$_3$P)$_4$. Another preferred phosphine ligand is tris(ortho-tolyl)phosphine, for example Pd(o-Tol$_3$P)$_4$. Preferred Pd(II) salts include palladium acetate, for example Pd(OAc)$_2$. Alternatively the Pd(0) complex can be prepared by mixing a Pd(0) dibenzylideneacetone complex, for example tris(dibenzyl-ideneacetone) dipalladium(0), bis(dibenzylideneacetone)-palladium(0), or Pd(II) salts e.g. palladium acetate, with a phosphine ligand, for example triphenylphosphine, tris(ortho-tolyl)phosphine or tri(tert-butyl)phosphine. Suzuki polymerisation is performed in the presence of a base, for example sodium carbonate, potassium carbonate, lithium hydroxide, potassium phosphate or an organic base such as tetraethylammonium carbonate or tetraethylammonium hydroxide. Yamamoto polymerisation employs a Ni(0) complex, for example bis(1,5-cyclooctadienyl) nickel(0).

Suzuki and Stille polymerisation may be used to prepare homopolymers as well as statistical, alternating and block random copolymers. Statistical or block copolymers can be prepared for example from the above monomers of formula (VI) or its subformulae, wherein one of the reactive groups is halogen and the other reactive group is a boronic acid, boronic acid derivative group or and alkylstannane. The synthesis of statistical, alternating and block copolymers is described in detail for example in WO 03/048225 A2 or WO 2005/014688 A2.

As alternatives to halogens as described above, leaving groups of formula $-O-SO_2Z^1$ can be used wherein $Z^1$ is as described above. Particular examples of such leaving groups are tosylate, mesylate and triflate.

Blends, Formulations and Devices

The compounds and polymers according to the present invention can also be used in mixtures or polymer blends, for example together with small molecules or monomeric compounds or together with other polymers having charge-transport, semiconducting, electrically conducting, photo-conducting and/or light emitting semiconducting properties, or for example with polymers having hole blocking or electron blocking properties for use as interlayers or charge blocking layers in OLED devices. Thus, another aspect of the invention relates to a polymer blend comprising one or more polymers according to the present invention and one or more further polymers having one or more of the above-mentioned properties. These blends can be prepared by conventional methods that are described in prior art and known to the skilled person. Typically the polymers are mixed with each other or dissolved in suitable solvents and the solutions combined.

Another aspect of the invention relates to a formulation comprising one or more small molecules, polymers, mixtures or polymer blends as described above and below and one or more organic solvents.

Preferred solvents are aliphatic hydrocarbons, chlorinated hydrocarbons, aromatic hydrocarbons, ketones, ethers and mixtures thereof. Additional solvents which can be used include 1,2,4-trimethylbenzene, 1,2,3,4-tetra-methyl benzene, pentylbenzene, mesitylene, cumene, cymene, cyclohexylbenzene, diethylbenzene, tetralin, decalin, 2,6-lutidine, 2-fluoro-m-xylene, 3-fluoro-o-xylene, 2-chlorobenzotrifluoride, N,N-dimethylformamide, 2-chloro-6-fluorotoluene, 2-fluoroanisole, anisole, 2,3-dimethylpyrazine, 4-fluoroanisole, 3-fluoroanisole, 3-trifluoro-methylanisole, 2-methylanisole, phenetol, 4-methylanisole, 3-methylanisole, 4-fluoro-3-methylanisole, 2-fluorobenzonitrile, 4-fluoroveratrol, 2,6-dimethylanisole, 3-fluorobenzo-nitrile, 2,5-dimethylanisole, 2,4-dimethylanisole, benzonitrile, 3,5-dimethyl-anisole, N,N-dimethylaniline, ethyl benzoate, 1-fluoro-3,5-dimethoxy-benzene, 1-methylnaphthalene, N-methylpyrrolidinone, 3-fluorobenzo-trifluoride, benzotrifluoride, dioxane, trifluoromethoxy-benzene, 4-fluorobenzotrifluoride, 3-fluoropyridine, toluene, 2-fluoro-toluene, 2-fluorobenzotrifluoride, 3-fluorotoluene, 4-isopropylbiphenyl, phenyl ether, pyridine, 4-fluorotoluene, 2,5-difluorotoluene, 1-chloro-2,4-difluorobenzene, 2-fluoropyridine, 3-chlorofluoro-benzene, 1-chloro-2,5-difluorobenzene, 4-chlorofluorobenzene, chloro-benzene, o-dichlorobenzene, 2-chlorofluorobenzene, p-xylene, m-xylene, o-xylene or mixture of o-, m-, and p-isomers. Solvents with relatively low polarity are generally preferred. For inkjet printing solvents and solvent mixtures with high boiling temperatures are preferred. For spin coating alkylated benzenes like xylene and toluene are preferred.

Examples of especially preferred solvents include, without limitation, dichloromethane, trichloromethane, chlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, N,N-dimethylformamide, dimethylacetamide, dimethylsulfoxide, tetraline, decaline, indane, methyl benzoate, ethyl benzoate, mesitylene and/or mixtures thereof.

The concentration of the compounds or polymers in the solution is preferably 0.1 to 10% by weight, more preferably 0.5 to 5% by weight, with % by weight given relative to the total weight of the solution. Optionally, the solution also comprises one or more binders to adjust the rheological properties, as described for example in WO 2005/055248 A1.

After appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in J. D. Crowley et al., *Journal of Paint Technology*, 1966, 38 (496), 296. Solvent blends may also be used and can be identified as described in Solvents, W. H. Ellis, Federation of Societies for Coatings Technology, p. 9-10, 1986. Such a procedure may lead to a blend of 'non'-solvents that will dissolve both the polymers of the present invention, although it is desirable to have at least one true solvent in a blend.

The compounds and polymers according to the present invention can also be used in patterned OSC layers in the devices as described above and below. For applications in modern microelectronics it is generally desirable to generate small structures or patterns to reduce cost (more devices/unit area), and power consumption. Patterning of thin layers comprising a polymer according to the present invention can be carried out for example by photolithography, electron beam lithography or laser patterning.

For use as thin layers in electronic or electrooptical devices the compounds, polymers, polymer blends or formulations of the present invention may be deposited by any suitable method. Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing.

Ink jet printing is particularly preferred when high resolution layers and devices need to be prepared. Selected formulations of the present invention may be applied to prefabricated device substrates by ink jet printing or microdispensing. Preferably industrial piezoelectric print heads such as but not limited to those supplied by Aprion, Hitachi-Koki, InkJet Technology, On Target Technology, Picojet, Spectra, Trident, Xaar may be used to apply the organic semiconductor layer to a substrate. Additionally semi-industrial heads such as those manufactured by Brother, Epson, Konica, Seiko Instruments Toshiba TEC or single nozzle microdispensers such as those produced by Microdrop and Microfab may be used.

In order to be applied by ink jet printing or microdispensing, the compounds or polymers should be first dissolved in a suitable solvent. Solvents must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1\text{-}2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1\text{-}2}$-alkylanilines and other fluorinated or chlorinated aromatics.

A preferred solvent for depositing a compound or polymer according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the compound or polymer, which reduces or prevents clogging of the jets and separation of the components during spraying. The solvent(s) may include those selected from the following list of examples: dodecylbenzene, 1-methyl-4-tert-butylbenzene, terpineol, limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The polymer blends and formulations according to the present invention can additionally comprise one or more further components or additives selected for example from surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

The compounds and polymers to the present invention are useful as charge transport, semiconducting, electrically conducting, photoconducting or light emitting materials in optical, electrooptical, electronic, electroluminescent or photoluminescent components or devices. In these devices, the polymers of the present invention are typically applied as thin layers or films.

Thus, the present invention also provides the use of the semiconducting compound, polymer, polymers blend, formulation or layer in an electronic device. The formulation may be used as a high mobility semiconducting material in various devices and apparatus. The formulation may be used, for example, in the form of a semiconducting layer or film. Accordingly, in another aspect, the present invention provides a semiconducting layer for use in an electronic device, the layer comprising a compound, polymer blend or formulation according to the invention. The layer or film may be less than about 30 microns. For various electronic device applications, the thickness may be less than about 1 micron thick. The layer may be deposited, for example on a part of an electronic device, by any of the aforementioned solution coating or printing techniques.

The invention additionally provides an electronic device comprising a compound, polymer, polymer blend, formulation or organic semiconducting layer according to the present invention. Preferred devices are OFETs, TFTs, ICs, logic circuits, capacitors, RFID tags, OLEDs, OLETs, OPEDs, OPVs, OPDs, solar cells, laser diodes, photoconductors, photodetectors, electrophotographic devices, electrophotographic recording devices, organic memory devices, sensor devices, charge injection layers, Schottky diodes, planarising layers, antistatic films, conducting substrates and conducting patterns. Particularly preferred devices are OLEDs.

Especially preferred electronic device are OFETs, OLEDs, OPV and OPD devices, in particular bulk heterojunction (BHJ) OPV devices. In an OFET, for example, the active semiconductor channel between the drain and source may comprise the layer of the invention. As another example, in an OLED device, the charge (hole or electron) injection or transport layer may comprise the layer of the invention.

For use in OPV or OPD devices the polymer according to the present invention is preferably used in a formulation that comprises or contains, more preferably consists essentially of, very preferably exclusively of, a p-type (electron donor) semiconductor and an n-type (electron acceptor) semiconductor. The p-type semiconductor is constituted by a polymer according to the present invention. The n-type semiconductor can be an inorganic material such as zinc oxide ($ZnO_x$), zinc tin oxide (ZTO), titan oxide ($TiO_x$), molybdenum oxide ($MoO_x$), nickel oxide ($NiO_x$), or cadmium selenide (CdSe), or an organic material such as graphene or a fullerene or a substituted fullerene, for example an indene-$C_{60}$-fullerene bisadduct like ICBA, or a (6,6)-phenyl-butyric acid methyl ester derivatized methano $C_{60}$ fullerene, also known as "PCBM-$C_{60}$" or "$C_{60}$PCBM", as disclosed for example in G. Yu, J. Gao, J. C. Hummelen, F. Wudl, A. J. Heeger, Science 1995, Vol. 270, p. 1789 ff and having the structure shown below, or structural analogous compounds with e.g. a $C_{61}$ fullerene group, a $C_{70}$ fullerene group, or a $C_{71}$ fullerene group, or an organic polymer (see for example Coakley, K. M. and McGehee, M. D. *Chem. Mater.* 2004, 16, 4533).

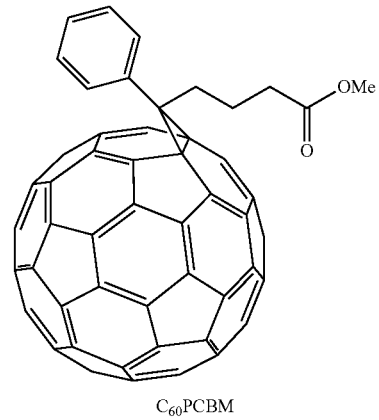 [SMILES: COC(=O)CCCC1(c2ccccc2)C23C=C4Cc5cc6cc7c8c9c(cc%10cc%11c%12c(c%13c%14c%15c(c4c5c4c6c8c(c%154)c4c9c%10c%12c%144)C%1321)C(=C3)C%11)C7]

$C_{60}$PCBM

Preferably the polymer according to the present invention is blended with an n-type semiconductor such as a fullerene or substituted fullerene, like for example PCBM-$C_{60}$, PCBM-$C_{70}$, PCBM-$C_{61}$, PCBM-$C_{71}$, bis-PCBM-$C_{61}$, bis-PCBM-$C_{71}$, ICMA-$c_{60}$ (1',4'-Dihydro-naphtho[2',3':1,2][5,6]fullerene-$C_{60}$), ICBA-$C_{60}$, oQDM-$C_{60}$ (1',4'-dihydro-naphtho[2',3'1,9][5,6]fullerene-C60-1h), bis-oQDM-$C_{60}$, graphene, or a metal oxide, like for example, $ZnO_x$, $TiO_x$, ZTO, $MoO_x$, $NiO_x$ or quantum dots like for example CdSe or CdS, to form the active layer in an OPV or OPD device. The device preferably further comprises a first transparent or semi-transparent electrode on a transparent or semi-transparent substrate on one side of the active layer, and a second metallic or semi-transparent electrode on the other side of the active layer.

Further preferably the OPV or OPD device comprises, between the active layer and the first or second electrode, one or more additional buffer layers acting as hole transporting layer and/or electron blocking layer, which comprise a material such as metal oxide, like for example, ZTO, $MoO_x$, $NiO_x$ a conjugated polymer electrolyte, like for example PEDOT:PSS, a conjugated polymer, like for example polytriarylamine (PTAA), an organic compound, like for example N,N'-diphenyl-N,N'-bis(1-naphthyl) (1,1'-biphenyl)-4,4'diamine (NPB), N,N'-diphenyl-N,N'-(3-methylphenyl)-1, 1'-biphenyl-4,4'-diamine (TPD), or alternatively as hole blocking layer and/or electron transporting layer, which comprise a material such as metal oxide, like for example, $ZnO_x$, $TiO_x$, a salt, like for example LiF, NaF, CsF, a conjugated polymer electrolyte, like for example poly[3-(6-trimethylammoniumhexyl)thiophene], poly(9,9-bis(2-ethylhexyl)-fluorene]-b-poly[3-(6-trimethylammoniumhexyl)thiophene], or poly[(9,9-bis(3"-(N,N-dimethylamino)propyl)-2,7-fluorene)-alt-2,7-(9,9-dioctylfluorene)] or an organic compound, like for example tris(8-quinolinolato)-aluminium(III) (Alq$_3$), 4,7-diphenyl-1,10-phenanthroline.

In a blend or mixture of a polymer according to the present invention with a fullerene or modified fullerene, the ratio polymer:fullerene is preferably from 5:1 to 1:5 by weight, more preferably from 1:1 to 1:3 by weight, most preferably 1:1 to 1:2 by weight. A polymeric binder may also be included, from 5 to 95% by weight. Examples of binder include polystyrene (PS), polypropylene (PP) and polymethylmethacrylate (PMMA).

To produce thin layers in BHJ OPV devices the compounds, polymers, polymer blends or formulations of the present invention may be deposited by any suitable method.

Liquid coating of devices is more desirable than vacuum deposition techniques. Solution deposition methods are especially preferred. The formulations of the present invention enable the use of a number of liquid coating techniques. Preferred deposition techniques include, without limitation, dip coating, spin coating, ink jet printing, nozzle printing, letter-press printing, screen printing, gravure printing, doctor blade coating, roller printing, reverse-roller printing, offset lithography printing, dry offset lithography printing, flexographic printing, web printing, spray coating, curtain coating, brush coating, slot dye coating or pad printing. For the fabrication of OPV devices and modules area printing method compatible with flexible substrates are preferred, for example slot dye coating, spray coating and the like.

Suitable solutions or formulations containing the blend or mixture of a polymer according to the present invention with a $C_{60}$ or $C_{70}$ fullerene or modified fullerene like PCBM must be prepared. In the preparation of formulations, suitable solvent must be selected to ensure full dissolution of both component, p-type and n-type and take into account the boundary conditions (for example rheological properties) introduced by the chosen printing method.

Organic solvent are generally used for this purpose. Typical solvents can be aromatic solvents, halogenated solvents or chlorinated solvents, including chlorinated aromatic solvents. Examples include, but are not limited to chlorobenzene, 1,2-dichlorobenzene, chloroform, 1,2-dichloroethane, dichloromethane, carbon tetrachloride, toluene, cyclohexanone, ethylacetate, tetrahydrofuran, anisole, morpholine, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetraline, decaline, indane, methyl benzoate, ethyl benzoate, mesitylene and combinations thereof.

The OPV device can for example be of any type known from the literature (see e.g. Waldauf et al., *Appl. Phys. Lett.,* 2006, 89, 233517).

A first preferred OPV device according to the invention comprises the following layers (in the sequence from bottom to top):

optionally a substrate,
a high work function electrode, preferably comprising a metal oxide, like for example ITO, serving as anode,
an optional conducting polymer layer or hole transport layer, preferably comprising an organic poymer or polymer blend, for example of PEDOT:PSS (poly(3,4-ethylenedioxythiophene): poly(styrene-sulfonate), or TBD (N,N'-dyphenyl-N—N'-bis(3-methylphenyl)-1,1'biphenyl-4,4'-diamine) or NBD (N,N'-dyphenyl-N—N'-bis(1-napthylphenyl)-1,1'biphenyl-4,4'-diamine),
a layer, also referred to as "active layer", comprising a p-type and an n-type organic semiconductor, which can exist for example as a p-type/n-type bilayer or as distinct p-type and n-type layers, or as blend or p-type and n-type semiconductor, forming a BHJ,
optionally a layer having electron transport properties, for example comprising LiF,
a low work function electrode, preferably comprising a metal like for example aluminum, serving as cathode,
wherein at least one of the electrodes, preferably the anode, is transparent to visible light, and
wherein the p-type semiconductor is a polymer according to the present invention.

A second preferred OPV device according to the invention is an inverted OPV device and comprises the following layers (in the sequence from bottom to top):

optionally a substrate,
a high work function metal or metal oxide electrode, comprising for example ITO, serving as cathode,
a layer having hole blocking properties, preferably comprising a metal oxide like $TiO_x$ or $Zn_x$,
an active layer comprising a p-type and an n-type organic semiconductor, situated between the electrodes, which can exist for example as a p-type/n-type bilayer or as distinct p-type and n-type layers, or as blend or p-type and n-type semiconductor, forming a BHJ,
an optional conducting polymer layer or hole transport layer, preferably comprising an organic polymer or polymer blend, for example of PEDOT:PSS or TBD or NBD,
an electrode comprising a high work function metal like for example silver, serving as anode,
wherein at least one of the electrodes, preferably the cathode, is transparent to visible light, and
wherein the p-type semiconductor is a polymer according to the present invention.

In the OPV devices of the present invention the p-type and n-type semiconductor materials are preferably selected from the materials, like the polymer/fullerene systems, as described above When the active layer is deposited on the substrate, it forms a BHJ that phase separates at nanoscale level. For discussion on nanoscale phase separation see Dennler et al, *Proceedings of the IEEE,* 2005, 93 (8), 1429 or Hoppe et al, *Adv. Func. Mater,* 2004, 14(10), 1005. An optional annealing step may be then necessary to optimize blend morpohology and consequently OPV device performance.

Another method to optimize device performance is to prepare formulations for the fabrication of OPV(BHJ) devices that may include high boiling point additives to promote phase separation in the right way. 1,8-Octanedithiol, 1,8-diiodooctane, nitrobenzene, chloronaphthalene, and other additives have been used to obtain high-efficiency solar cells. Examples are disclosed in J. Peet, et al, *Nat. Mater.,* 2007, 6, 497 or Fréchet et al. *J. Am. Chem. Soc.,* 2010, 132, 7595-7597.

The compounds, polymers, formulations and layers of the present invention are also suitable for use in an OFET as the semiconducting channel. Accordingly, the invention also provides an OFET comprising a gate electrode, an insulating (or gate insulator) layer, a source electrode, a drain electrode and an organic semiconducting channel connecting the source and drain electrodes, wherein the organic semiconducting channel comprises a compound, polymer, polymer blend, formulation or organic semiconducting layer according to the present invention. Other features of the OFET are well known to those skilled in the art.

OFETs where an OSC material is arranged as a thin film between a gate dielectric and a drain and a source electrode, are generally known, and are described for example in U.S. Pat. No. 5,892,244, U.S. Pat. No. 5,998,804, U.S. Pat. No. 6,723,394 and in the references cited in the background section. Due to the advantages, like low cost production using the solubility properties of the compounds according to the invention and thus the processibility of large surfaces, preferred applications of these FETs are such as integrated circuitry, TFT displays and security applications.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

An OFET device according to the present invention preferably comprises:
- a source electrode,
- a drain electrode,
- a gate electrode,
- a semiconducting layer,
- one or more gate insulator layers, and
- optionally a substrate, wherein the semiconductor layer preferably comprises a compound, polymer, polymer blend or formulation as described above and below.

The OFET device can be a top gate device or a bottom gate device. Suitable structures and manufacturing methods of an OFET device are known to the skilled in the art and are described in the literature, for example in US 2007/0102696 A1.

The gate insulator layer preferably comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377). Especially preferred are organic dielectric materials having a low permittivity (or dielectric contant) from 1.0 to 5.0, very preferably from 1.8 to 4.0 ("low k materials"), as disclosed for example in US 2007/0102696 A1 or U.S. Pat. No. 7,095,044.

In security applications, OFETs and other devices with semiconducting materials according to the present invention, like transistors or diodes, can be used for RFID tags or security markings to authenticate and prevent counterfeiting of documents of value like banknotes, credit cards or ID cards, national ID documents, licenses or any product with monetry value, like stamps, tickets, shares, cheques etc.

Alternatively, the materials according to the invention can be used in OLEDs, e.g. as the active display material in a flat panel display applications, or as backlight of a flat panel display like e.g. a liquid crystal display. Common OLEDs are realized using multilayer structures. An emission layer is generally sandwiched between one or more electron-transport and/or hole-transport layers. By applying an electric voltage electrons and holes as charge carriers move towards the emission layer where their recombination leads to the excitation and hence luminescence of the lumophor units contained in the emission layer. The inventive compounds, materials and films may be employed in one or more of the charge transport layers and/or in the emission layer, corresponding to their electrical and/or optical properties. Furthermore their use within the emission layer is especially advantageous, if the compounds, materials and films according to the invention show electroluminescent properties themselves or comprise electroluminescent groups or compounds. The selection, characterization as well as the processing of suitable monomeric, oligomeric and polymeric compounds or materials for the use in OLEDs is generally known by a person skilled in the art, see, e.g., Müller et al, *Synth. Metals,* 2000, 111-112, 31-34, Alcala, *J. Appl. Phys.,* 2000, 88, 7124-7128 and the literature cited therein.

According to another use, the materials according to this invention, especially those showing photoluminescent properties, may be employed as materials of light sources, e.g. in display devices, as described in EP 0 889 350 A1 or by C. Weder et al., *Science,* 1998, 279, 835-837.

A further aspect of the invention relates to both the oxidised and reduced form of the compounds according to this invention. Either loss or gain of electrons results in formation of a highly delocalised ionic form, which is of high conductivity. This can occur on exposure to common dopants. Suitable dopants and methods of doping are known to those skilled in the art, e.g. from EP 0 528 662, U.S. Pat. No. 5,198,153 or WO 96/21659.

The doping process typically implies treatment of the semiconductor material with an oxidating or reducing agent in a redox reaction to form delocalised ionic centres in the material, with the corresponding counterions derived from the applied dopants. Suitable doping methods comprise for example exposure to a doping vapor in the atmospheric pressure or at a reduced pressure, electrochemical doping in a solution containing a dopant, bringing a dopant into contact with the semiconductor material to be thermally diffused, and ion-implantation of the dopant into the semiconductor material.

When electrons are used as carriers, suitable dopants are for example halogens (e.g., $I_2$, $Cl_2$, $Br_2$, ICl, $ICl_3$, IBr and IF), Lewis acids (e.g., $PF_5$, $AsF_5$, $SbF_5$, $BF_3$, $BCl_3$, $SbCl_5$, $BBr_3$ and $SO_3$), protonic acids, organic acids, or amino acids (e.g., HF, HCl, $HNO_3$, $H_2SO_4$, $HClO_4$, $FSO_3H$ and $ClSO_3H$), transition metal compounds (e.g., $FeCl_3$, FeOCl, $Fe(ClO_4)_3$, $Fe(4-CH_3C_6H_4SO_3)_3$, $TiCl_4$, $ZrCl_4$, $HfCl_4$, $NbF_5$, $NbCl_5$, $TaCl_5$, $MoF_5$, $MoCl_5$, $WF_5$, $WCl_6$, $UF_6$ and $LnCl_3$ (wherein Ln is a lanthanoid), anions (e.g., $Cl^-$, $Br^-$, $I^-$, $I_3^-$, $HSO_4^-$, $SO_4^{2-}$, $NO_3^-$, $ClO_4^-$, $BF_4^-$, $PF_6^-$, $AsF_6^-$, $SbF_6^-$, $FeCl_4^-$, $Fe(CN)_6^{3-}$, and anions of various sulfonic acids, such as aryl-$SO_3^-$). When holes are used as carriers, examples of dopants are cations (e.g., $H^+$, $Li^+$, $Na^+$, $K^+$, $Rb^+$ and $Cs^+$), alkali metals (e.g., Li, Na, K, Rb, and Cs), alkaline-earth metals (e.g., Ca, Sr, and Ba), $O_2$, $XeOF_4$, $(NO_2^+)$ $(SbF_6^-)$, $(NO_2^+)(SbCl_6^-)$, $(NO_2^+)(BF_4^-)$, $AgClO_4$, $H_2IrCl_6$, $La(NO_3)_3$ $6H_2O$, $FSO_2OOSO_2F$, Eu, acetylcholine, $R_4N^+$, (R is an alkyl group), $R_4P^+$ (R is an alkyl group), $R_6As^+$ (R is an alkyl group), and $R_3S^+$ (R is an alkyl group).

The conducting form of the compounds of the present invention can be used as an organic "metal" in applications including, but not limited to, charge injection layers and ITO planarising layers in OLED applications, films for flat panel displays and touch screens, antistatic films, printed conductive substrates, patterns or tracts in electronic applications such as printed circuit boards and condensers.

The compounds and formulations according to the present invention may also be suitable for use in organic plasmon-emitting diodes (OPEDs), as described for example in Koller et al., *Nat. Photonics,* 2008, 2, 684.

According to another use, the materials according to the present invention can be used alone or together with other materials in or as alignment layers in LCD or OLED devices, as described for example in US 2003/0021913. The use of charge transport compounds according to the present invention can increase the electrical conductivity of the alignment layer. When used in an LCD, this increased electrical conductivity can reduce adverse residual dc effects in the switchable LCD cell and suppress image sticking or, for example in ferroelectric LCDs, reduce the residual charge produced by the switching of the spontaneous polarisation charge of the ferroelectric LCs. When used in an OLED device comprising a light emitting material provided onto the alignment layer, this increased electrical conductivity can enhance the electroluminescence of the light emitting material. The compounds or materials according to the present invention having mesogenic or liquid crystalline properties can form oriented anisotropic films as described above, which are especially useful as alignment layers to induce or enhance alignment in a liquid crystal medium provided onto said anisotropic film. The materials according to the present invention may also be combined with photoisomerisable compounds and/or chromophores for use in or as photoalignment layers, as described in US 2003/0021913 A1.

According to another use the materials according to the present invention, especially their water-soluble derivatives (for example with polar or ionic side groups) or ionically doped forms, can be employed as chemical sensors or materials for detecting and discriminating DNA sequences. Such uses are described for example in L. Chen, D. W. McBranch, H. Wang, R. Helgeson, F. Wudl and D. G. Whitten, *Proc. Natl. Acad. Sci. U.S.A.*, 1999, 96, 12287; D. Wang, X. Gong, P. S. Heeger, F. Rininsland, G. C. Bazan and A. J. Heeger, *Proc. Natl. Acad. Sci. U.S.A.*, 2002, 99, 49; N. DiCesare, M. R. Pinot, K. S. Schanze and J. R. Lakowicz, *Langmuir*, 2002, 18, 7785; D. T. McQuade, A. E. Pullen, T. M. Swager, *Chem. Rev.*, 2000, 100, 2537.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

Above and below, unless stated otherwise percentages are percent by weight and temperatures are given in degrees Celsius. The values of the dielectric constant c ("permittivity") refer to values taken at 20° C. and 1,000 Hz.

EXAMPLES

The advantages of the present invention are further illustrated by the following non-limiting examples.

If not expressly stated to have been synthesized, starting materials were ordered from commercial sources. For example, MADN was purchased from Beijing Aglaia Technology and Development Co., Ltd.

Example 1

Synthesis of 4,10-Diphenyl-4,5,10,11-tetrahydro-1, 7-dioxa-5,11-diaza-4, 10-dibora-dicyclopenta[a,h] anthracene (9, BNLT)

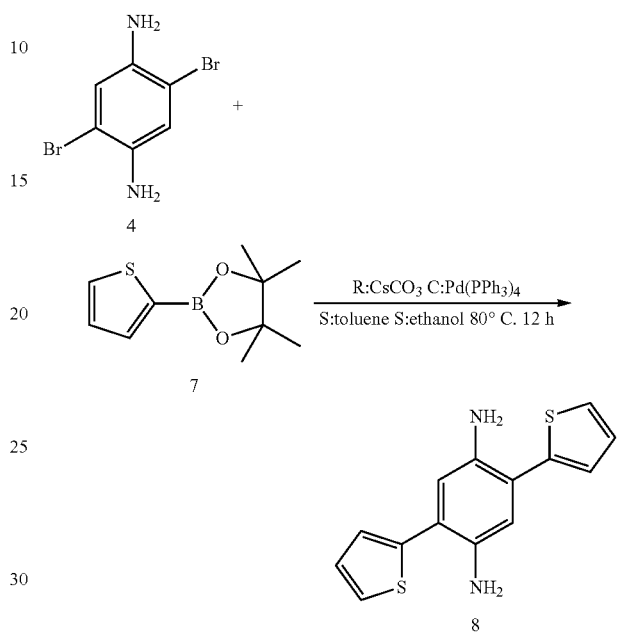

Synthesis of 2,5-bis(2-thienyl)-1,4-phenylenediamine (8)

In a Schlenk flask, 2,5-dibromo-1, 4-phenylenediamine (500 mg, 1.88 mmol) and thiophene-2-boronic acid pinacol ester 7 (1.58 g, 7.52 mmol) were charged under the protection of nitrogen. After adding 30 ml toluene, 10 ml ethanol and 10 ml $Cs_2CO_3$ aqueous solution (2.0 mol/l), the mixture was degassed for 30 min. $Pd(PPh_3)_4$ (218 mg, 0.188 mmol) was added. The mixture was then heated to 80° C., stirred overnight, poured into brine and extracted with dichloromethane for several times. The organic phase was dried over $Mg_2SO_4$ and the solvent was evaporated in vacuo. The product was purified by chromatography on silica gel ($CH_2Cl_2$) to give product 8 as yellow flaky crystal (310 mg, 59%). $^1$H NMR (400 MHz, $CDCl_3$, ppm): 3.81 (br, 4H), 6.82 (s, 2H), 7.12 (dd, J=5.14, 3.53 Hz, 2H), 7.24 (dd, J=3.27, 0.78 Hz, 2H), 7.34 (dd, J=5.15, 1.01 Hz, 2H). m/z[M+H]+ calcd for $C_{14}H_{13}N_2S_2$ 273.0521; HR-ESI observed 273.0515.

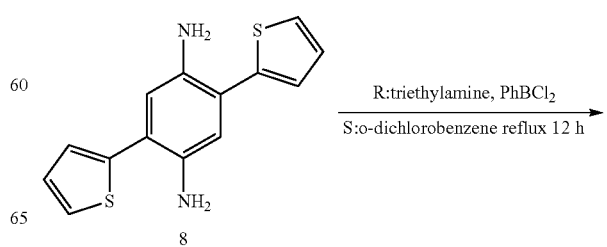

Synthesis of 4,10-Diphenyl-4,5,10,11-tetrahydro-1,7-dioxa-5,11-diaza-4,10-dibora-dicyclopenta [a,h] anthracene (9)

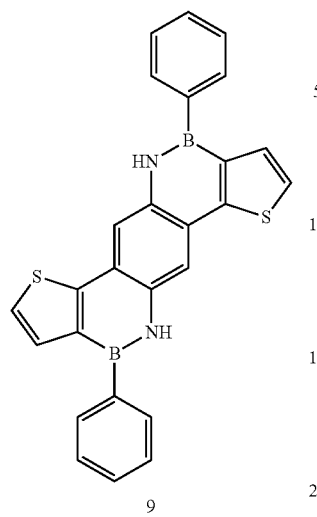

9

To a solution of 2,5-bis(2-thienyl)-1,4-phenylenediamine 8 (300 mg, 1.10 mmol) in o-dichlorobenzene (40 ml) under nitrogen was added triethylamine (670 mg, 6.61 mmol) and phenyldichloroborane (525 mg, 3.31 mmol). The reaction mixture was heated to 180° C. for 12 h. After cooling to the room temperature, the mixture was filtered through sand core funnel and then the residue washed by methanol to give product 9 as yellow powder (390 mg, 77%). $^1$H NMR (400 MHz, CDCl$_3$, ppm): 7.58-7.50 (m, 8H), 7.81 (d, J=5.05 Hz, 2H), 7.94 (s, 2H), 7.96 (dd, J=7.64, 1.79 Hz, 4H), 7.99 (s, 2H). m/z[M+H]+ calcd for C$_{26}$H$_{19}$B$_2$N$_2$S$_2$ 445.1177; HR-ESI observed 445.1153.

Example 2

Synthesis of 2,8-Dipropyl-4,10-diphenyl-4,5,10,11-tetrahydro-1,7-dithia-5, 11-diaza-4,10-dibora-dicyclopenta[a,h]anthracene (12, BNLT-C3)

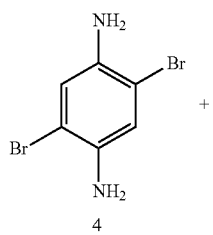

4

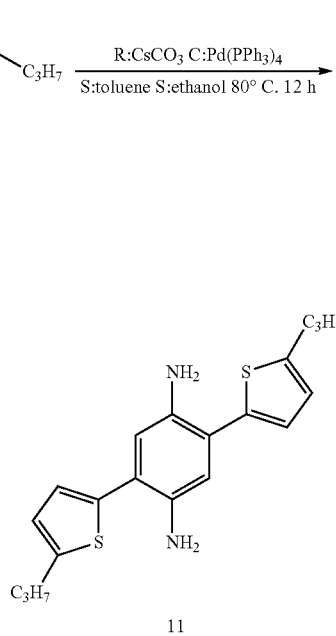

Synthesis of 2,5-bis(5-propyl-2-thienyl)-1,4-phenylenediamine (11)

In a Schlenk flask, 2,5-dibromo-1,4-phenylenediamine (1 g, 3.76 mmol) and 2-(4,4,5,5-Tetramethyl-1, 3,2-dioxaborolan-2-yl)-5-propylthiophene 10 (3.8 g, 15.04 mmol) were charged under the protection of nitrogen. After adding 75 ml toluene, 30 ml ethanol and 20 ml Cs$_2$CO$_3$ aqueous solution (2.0 mol/l), the mixture was degassed for 45 min. Pd(PPh$_3$)$_4$ (435 mg, 0.376 mmol) was added. The mixture was then heated to 80° C., stirred overnight, poured into brine and extracted by dichloromethane for several times. The organic phase was dried over Mg$_2$SO$_4$ and the solvent was evaporated in vacuo. The product was purified by chromatography on silica gel (CH$_2$Cl$_2$) to give product 11 as yellow flaky crystal (860 mg, 63%). $^1$H NMR (400 MHz, CDCl$_3$, ppm): 1.00 (t, J=7.34 Hz, 6H), 1.73 (dd, J=15.00, 7.44 Hz, 4H), 2.80 (t, J=7.36 Hz, 4H), 4.27-3.02 (br, 2H), 6.76 (m, 4H), 7.02 (d, J=1.96 Hz, 2H). $^{13}$C NMR (100 MHz, CDCl$_3$, ppm): 145.9, 138.4, 136.2, 125.8, 124.8, 121.9, 118.5, 32.4, 25.1, 14.0.

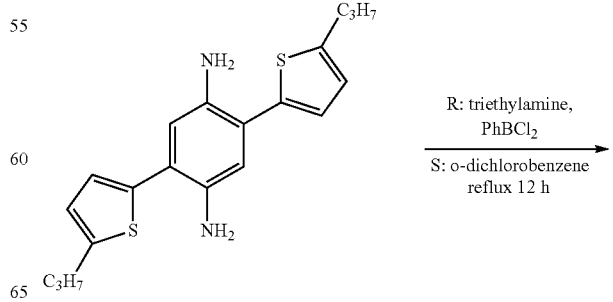

11

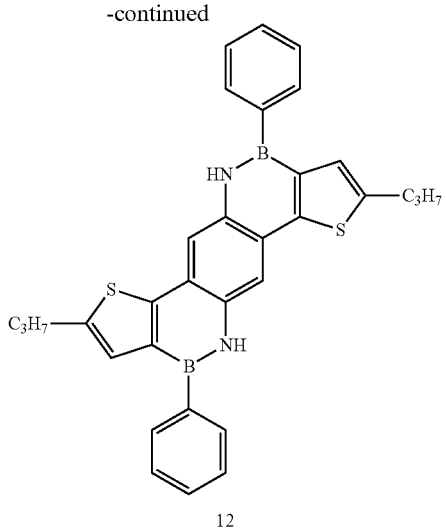

12

Synthesis of 2,8-Dipropyl-4,10-diphenyl-4,5,10,11-tetrahydro-1,7-dithia-5,11-diaza-4,10-dibora-dicyclopenta[a,h]anthracene (12)

To a solution of 2,5-bis(5-propyl-2-thienyl)-1,4-phenylenediamine 11 (850 mg, 2.33 mmol) in o-dichlorobenzene (30 ml) under nitrogen was added triethylamine (1.4 g, 13.95 mmol) and phenyldichloroborane (1.1 g, 6.98 mmol). The reaction mixture was heated to 180° C. for 12 h. After cooling to the room temperature, the mixture was filtered through sand core funnel and then the residue washed by methanol to give product 12 as yellow powder (700 mg, 51%). $^1$H NMR (400 MHz, CDCl$_3$, ppm): 1.05 (t, J=7.34 Hz, 6H), 1.83 (dd, J=14.87, 7.43 Hz, 4H), 2.96 (t, J=7.17 Hz, 4H), 7.43 (s, 2H), 7.56-7.48 (m, 6H), 7.84 (s, 2H), 7.86 (s, 2H), 7.93 (dd, J=7.70, 1.66 Hz, 4H). $^{13}$C NMR (100 MHz, CDCl$_3$, ppm): 149.5, 145.7, 133.3, 129.4, 129.0, 128.4, 122.2, 112.9, 32.7, 25.3, 14.0.

Example 3

Synthesis of 2,8-Dihexyl-4,10-diphenyl-4,5,10,11-tetrahydro-1,7-dithia-5,11-diaza-4,10-dibora-dicyclopenta[a,h]anthracene (15, BNLT-C6)

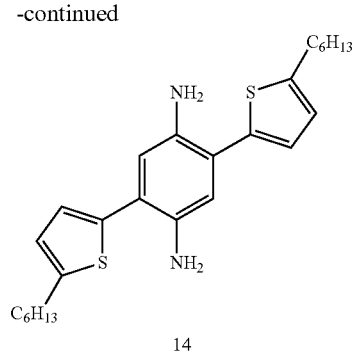

14

Synthesis of 2,5-bis(5-hexyl-2-thienyl)-1,4-phenylenediamine (14)

In a Schlenk flask, 2,5-dibromo-1,4-phenylenediamine (500 mg, 1.88 mmol) and 2-(4,4,5,5-tetramethyl-1,3,2-dioxaborolan-2-yl)-5-hexylthiophene 13 (2.21 g, 7.52 mmol) were charged under the protection of nitrogen. After adding 25 ml toluene, 10 ml ethanol and 10 ml Cs$_2$CO$_3$ aqueous solution (2.0 mol/l), the mixture was degassed for 30 min. Pd(PPh$_3$)$_4$ (217.3 mg, 18.8 mmol) was added, then the mixture was heated to 80° C. and stirred overnight. The reactant was poured into brine and extracted by dichloromethane for several times. The organic phase was dried over Mg$_2$SO$_4$ and the solvent was evaporated in vacuo. The product was purified by chromatography on silica gel (petroleum ether/CH$_2$Cl$_2$=1) to give product 14 as yellow flaky crystal (550 mg, 66%). $^1$H NMR (400 MHz, CDCl$_3$, ppm): 0.90 (t, J=7.02 Hz, 6H), 1.46-1.23 (m, 12H), 1.76-1.64 (m, 4H), 2.82 (t, J=7.65 Hz, 4H), 3.70 (br, 4H), 6.79-6.73 (m, 4H), 7.02 (d, J=3.48 Hz, 2H). m/z[M+H]$^+$ calcd for C$_{26}$H$_{37}$N$_2$S$_2$ 441.2399; HR-ESI observed 441.2393. $^{13}$C NMR (100 MHz, CDCl$_3$, ppm): 149.5, 146.0, 133.3, 129.4, 128.9, 128.4, 122.2, 112.9, 32.0, 31.9, 30.7, 29.1, 22.8, 14.3.

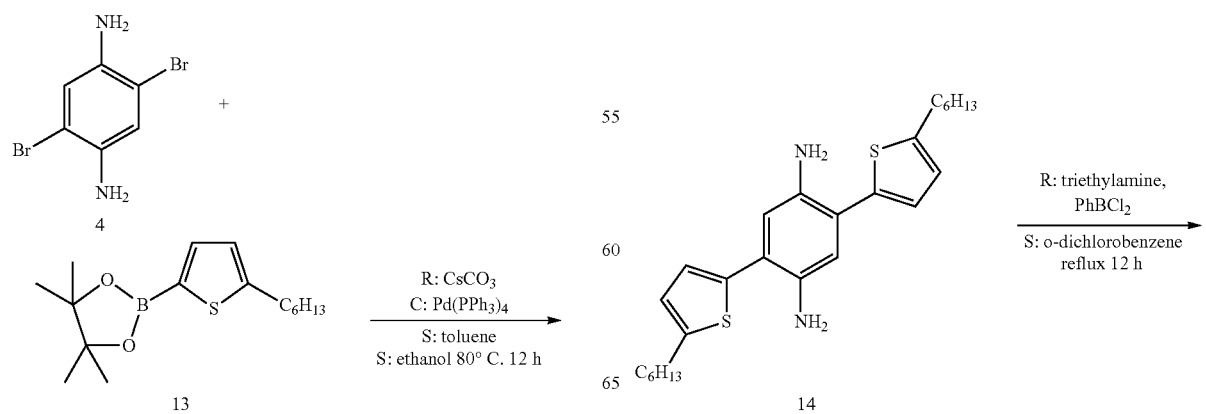

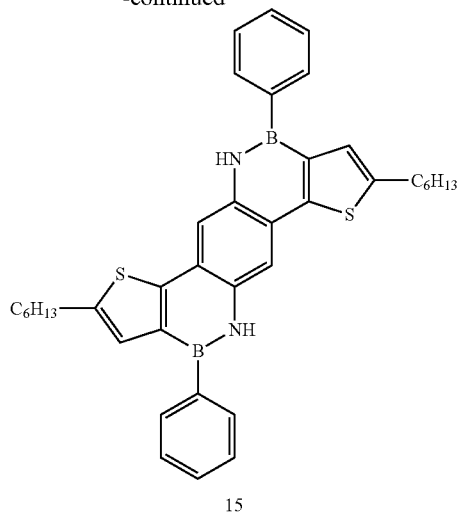

15

Synthesis of 2,8-Dihexyl-4,10-diphenyl-4,5,10,11-tetrahydro-1,7-dithia-5,11-diaza-4, 10-dibora-dicyclopenta[a,h]anthracene (15)

To a solution of 2,5-bis(5-hexyl-2-thienyl)-1,4-phenylenediamine 14 (1 g, 2.27 mmol) in o-dichlorobenzene (40 ml) under nitrogen was added triethylamine (1.4 mg, 13.6 mmol) and phenyldichloroborane (1.1 g, 6.81 mmol). The reaction mixture was heated to 180° C. for 12 h. After cooling to the room temperature, the mixture was filtered through sand core funnel and then the residue washed by methanol to give product 15 as yellow powder (1.15 g, 83%). $^1$H NMR (400 MHz, CDCl$_3$, ppm): 0.92-0.88 (m, 6H), 1.40-1.20 (m, 12H), 1.79 (td, J=14.95, 7.65 Hz, 4H), 2.98 (t, J=7.99 Hz, 4H), 7.43 (s, 2H), 7.56-7.49 (m, 6H), 7.84 (s, 2H), 7.86 (s, 2H), 7.93 (dd, J=8.02, 1.60 Hz, 4H). $^{13}$C NMR could not be well-resolved due to its poor solubility. m/z[M+H]$^+$ calcd for C$_{38}$H$_{43}$B$_2$N$_2$S$_2$ 613.3073; HR-ESI observed 613.3038.

Example 4

Synthesis of 4,10-Diphenyl-4,5,10,11-tetrahydro-1,7-dioxa-5,11-diaza-4, 10-dibora-dicyclopenta[a,h]anthracene (18, BNLF)

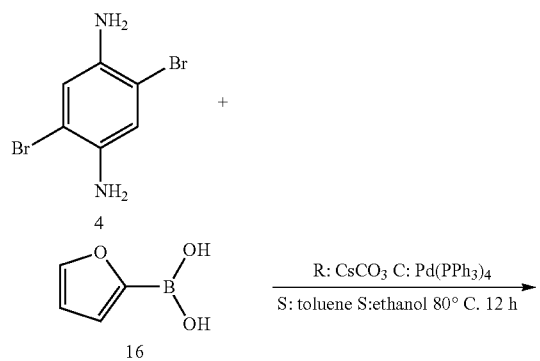

Synthesis of 2,5-bis(2-furanyl)-1,4-phenylenediamine (17)

In a Schlenk flask, 2,5-dibromo-1,4-phenylenediamine (200 mg, 0.752 mmol) and 2-furanylboronic acid 16 (337 mg, 3.0 mmol) were charged under the protection of nitrogen. After adding 15 ml toluene, 10 ml ethanol and 5 ml Cs$_2$CO$_3$ aqueous solution (2.0 mol/l), the mixture was degassed for 30 min. Pd(PPh$_3$)$_4$ (87 mg, 0.0752 mmol) was added. The mixture was then heated to 80° C., stirred overnight, poured into brine and extracted with dichloromethane for several times. The organic phase was dried over Mg$_2$SO$_4$ and the solvent was evaporated in vacuo. The product was purified by chromatography on silica gel to give product 17 as golden yellow flaky crystal. $^1$H NMR (400 MHz, CDCl$_3$, ppm): 3.99 (br, 4H), 6.51 (dd, J=3.39, 1.85 Hz, 2H), 6.62 (dd, J=3.39, 0.70 Hz, 2H), 6.98 (s, 2H), 7.50 (dd, J=1.84, 0.69 Hz, 2H). $^{13}$C NMR (100 MHz, CDCl$_3$, ppm): 153.0, 141.7, 135.7, 117.8, 115.8, 111.7, 107.3. m/z [M+H]$^+$ calcd for C$_{14}$H$_{13}$N$_2$O$_2$ 241.0978; HR-ESI observed 241.0972.

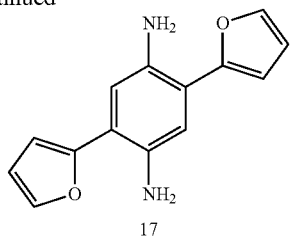

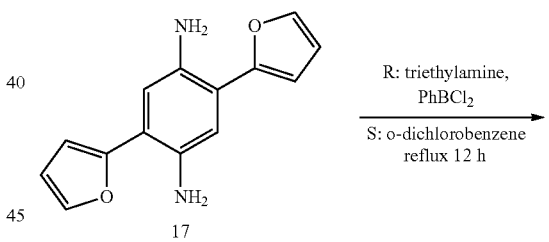

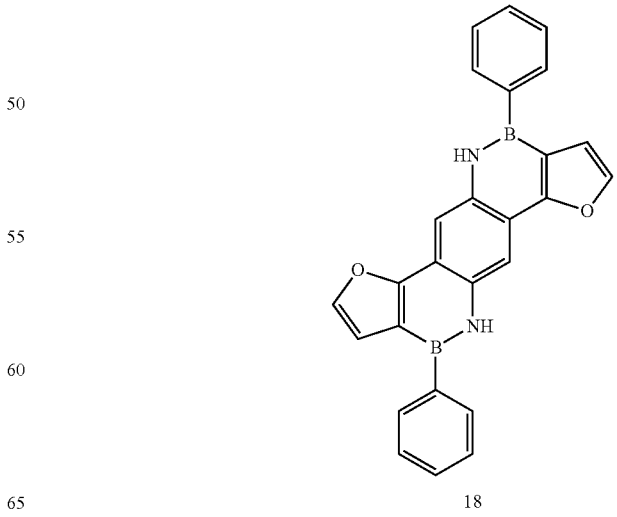

Synthesis of 4,10-Diphenyl-4,5,10,11-tetrahydro-1,
7-dioxa-5,11-diaza-4,10-dibora-dicyclopenta [a,h]
anthracene (18)

To a solution of 2,5-bis(2-furanyl)-1,4-phenylenediamine 17 (400 mg, 1.66 mmol) in o-dichlorobenzene (40 mL) under nitrogen was added triethylamine (1 g, 10 mmol) and phenyldichloroborane (800 mg, 5 mmol). The reaction mixture was heated to 180° C. for 12 h. After cooling to the room temperature, the mixture was filtered through sand core funnel and then the residue washed by methanol to give product 18 as yellow powder (450 mg, 65%). 1H NMR (400 MHz, CDCl3, ppm): 7.19 (d, J=1.85 Hz, 2H), 7.59-7.50 (m, 6H), 7.80 (d, J=1.84 Hz, 2H), 7.99 (s, 2H), 8.02 (dd, J=7.73, 1.64 Hz, 4H), 8.17 (s, 2H). 13C NMR could not be well-resolved due to its poor solubility. m/z[M]+ calcd. for C26H18B2N2O2 412.1554; HR-MALDI observed 411.761.

Example 5

Synthesis of Compound 21 (BNLBT)

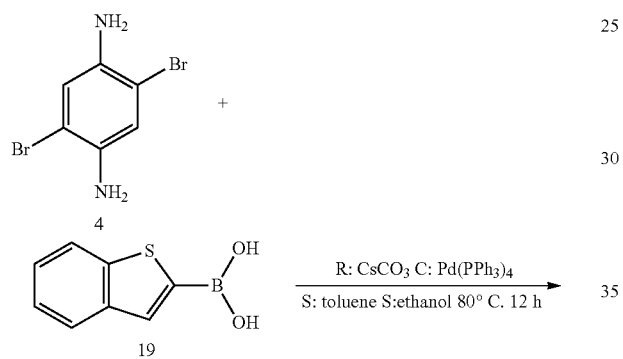

Synthesis of
2,5-bis(2-benzothienyl)-1,4-phenylenediamine (20)

In a Schlenk flask, 2,5-dibromo-1,4-phenylenediamine (1 g, 3.76 mmol) and benzo[b]thien-2-ylboronic acid 19 (2.68 g, 15.1 mmol) were charged under the protection of nitrogen. After adding 70 ml toluene, 30 ml ethanol and 20 ml Cs2CO3 aqueous solution (2.0 mol/l), the mixture was degassed for 40 min. Pd(PPh3)4 (87 mg, 0.0752 mmol) was added, then the mixture was heated to 80° C. and stirred overnight. The reactant was poured into brine and extracted by dichloromethane for several times. The organic phase was dried over Mg2SO4 and the solvent was evaporated in vacuo. The product was purified by chromatography on silica gel to give product 20 as golden orange powder (200 mg, 14%). $^1$H NMR (400 MHz, CDCl3, ppm): 3.83 (s, 4H), 6.92 (s, 2H), 7.30-7.43 (m, 4H), 7.49 (s, 2H), 7.80 (d, J=7.18 Hz, 2H), 7.86 (d, J=7.65 Hz, 2H). m/z[M+H]+ calcd. for C22H17N2S2 373.0834; HR-ESI observed 373.0827.

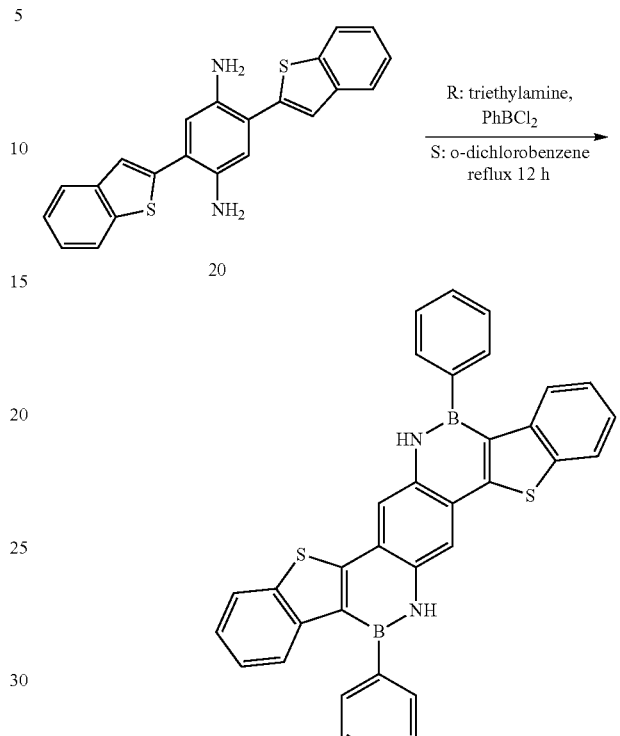

Synthesis of Compound 21

To a solution of 2,5-bis(2-benzothienyl)-1,4-phenylenediamine 20 (180 mg, 0.48 mmol) in o-dichlorobenzene (20 ml) under nitrogen was added triethylamine (300 mg, 2.90 mmol) and phenyldichloroborane (230 mg, 1.45 mmol). The reaction mixture was heated to 180° C. for 12 h. After cooling to the room temperature, the mixture was filtered through sand core funnel and then the residue washed by methanol to give product 21 as yellow powder (175 mg, 66%). $^1$H NMR (400 MHz, CDCl3, ppm): 7.28 (d, J=1.49 Hz, 2H), 7.38 (t, J=6.81 Hz, 2H), 7.58-7.53 (m, 6H), 7.87-7.82 (m, 4H), 7.99-7.93 (m, 6H), 8.02 (s, 2H). $^{13}$C NMR could not be well-resolved due to its poor solubility. m/z[M]+ calcd for C34H22B2N2S2 544.1411; HR-MALDI observed 544.286.

Example 6

Synthesis of 4,4'-Diphenyl-3a,4,5,9b,3'a,4',5',9'b-octahydro-[2,2']bi[benzo[e]thieno[3,2-c][1,2]azaborininyl] (25)

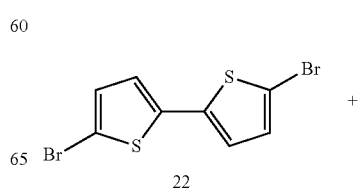

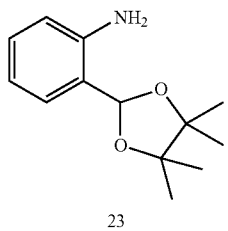

23

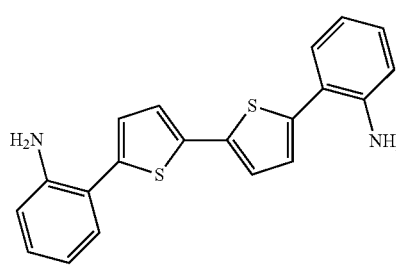

24

Synthesis of 2,2'-(2,2'-bithiophene-5,5'-diyl)dianiline (24)

In a Schlenk flask, 5,5'-dibromo-2,2'-bithiophene 22 (1.0 g, 2.92 mmol) and 2-(4,4,5,5-tetramethyl-1,3-dioxolan-2-yl) aniline 23 (1.6 g, 7.31 mmol) were charged under nitrogen. After adding 60 ml toluene, 20 ml aqueous solution of $K_3PO_4$ (2.0 mol/l), the mixture was degassed for 30 min. $Pd_2(dba)_3 \cdot CHCl_3$ (151.3 mg, 0.1462 mmol), (t-Bu)$_3$P.HBF$_4$ (84.8 mg, 0.292 mmol) was added. The mixture was then heated to 80° C., stirred overnight, poured into brine and extracted with dichloromethane for several times. The organic phase was dried over $Mg_2SO_4$ and the solvent was evaporated in vacuo. The product was purified by chromatography on silica gel to give product 24 (0.9 g, 88.3% yield) as golden brown flaky crystals. $^1$H NMR (400 MHz, CDCl$_3$, ppm): 4.06 (br, 4H), 6.78 (dd, J=8.00, 0.93 Hz, 2H), 6.81 (dt, J=7.49, 1.19 Hz, 1H), 7.13 (d, J=3.66 Hz, 2H), 7.16 (ddd, J=9.05, 7.46, 1.55 Hz, 2H), 7.19 (d, J=3.67 Hz, 2H), 7.30 (dd, J=7.62, 1.45 Hz, 2H). $^{13}$C NMR (400 MHz, CDCl$_3$, ppm): 116.3, 118.9, 119.8, 124.3, 126.8, 129.4, 130.9, 137.1, 140.4, 144.2.

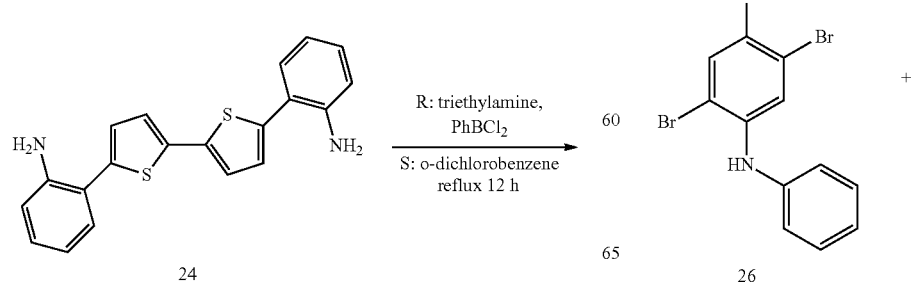

24

25

Synthesis of 4,4'-Diphenyl-3a,4,5,9b,3'a,4',5',9'b-octahydro-[2,2]bi[benzo[e]thieno[3,2-c][1,2]azaborininyl] (25)

To a solution of 2,2'-(2,2'-bithiophene-5,5'-diyl)dianiline 24 (100 mg, 0.574 mmol) in dimethylbenzene (25 ml) under nitrogen was added triethylamine (1.2 ml, 1 M in toluene, 2.296 mmol) and phenyldichloroborane (232 mg, 2.296 mmol). The reaction mixture was heated to 100° C. for 12 h. After cooling to the room temperature, aluminum trichloride (30.6 mg, 0.30 mmol) was added. The reaction mixture was refluxed for 24h, then 1,4-diazabicyclo[2.2.2]octane was added. The mixture was centrifuged to remove precipitate, the liquid phase then washed with brine and extracted with dichloromethane. The organic phase was dried over $Mg_2SO_4$ and the solvent was evaporated in vacuo. The product was purified by chromatography on silica gel to give product 25 as yellow powder. $^1$H NMR (400 MHz, CDCl$_3$, ppm): 7.28-7.59 (m, 12H), 7.87 (br, 2H), 7.91 (s, 2H), 7.95 (dd, J=7.75, 1.63 Hz, 2H), 7.98 (dd, J=8.21, 1.01 Hz, 2H). $^{13}$C NMR could not be well-resolved due to its poor solubility. HRMS (ESI) m/z[M]+ calculated for $C_{32}H_{23}B_2N_2S_2$ 521.1489; observed 521.1492.

Example 7

Synthesis of Compound 28 (BNXT-C3)

26

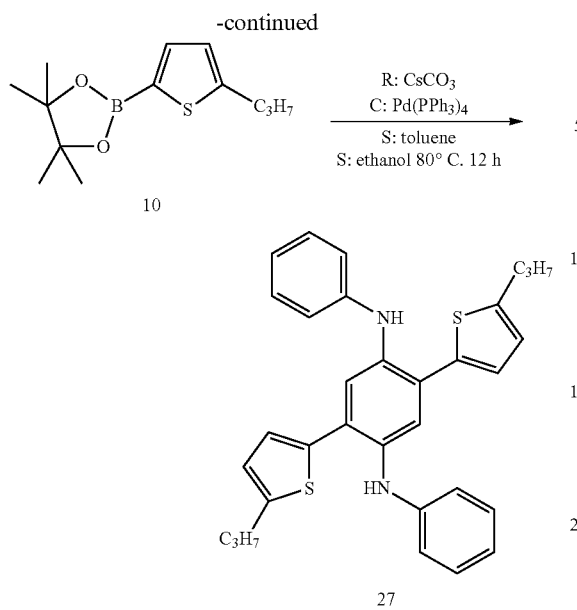

27

Synthesis of 2,5-di(5-propyl-thiophen-2-yl)-N¹,N⁴-diphenylbenzene-1,4-diamine (27)

A mixture that contained 2,5-dibromo-N¹,N⁴-diphenyl-benzene-1,4-diamine (26) (500 mg, 1.20 mmol), 2-(4,4,5,5-Tetramethyl-1,3,2-dioxaborolan-2-yl)-5-propylthiophene 10 (1.22 g, 4.80 mmol), cesium carbonate (3.95 g, 12 mmol) and 10 mol % tetrakis(triphenylphosphine) palladium(0) (0.1422 g, 0.12 mmol) that had been dissolved in toluene (30 ml), ethanol (10 ml) and H₂O (7 ml) was stirred at 80° C. for 24 h and cooled to room temperature. The mixture was poured into sodium hydroxide, and then extracted with dichloromethane. The aqueous layer was extracted with dichloromethane (3 times). Then the combined organic layers were dried over anhydrous sodium sulfate and compound 27 (486 mg, 80%, light yellow powder) was isolated by silica gel chromatography (1:1 hexane: dichloromethane ratio). The analysis of 27 was as follows. ¹H NMR (400 MHz, DMSO-d₆, TMS standard, ppm): 7.53 (s, 2H), 7.45 (s, 2H), 7.19 (d, J=3.66 Hz, 2H), 7.14-7.08 (m, 4H), 6.77-6.71 (m, 6H), 6.66 (t, J=7.29 Hz, 2H), 2.66 (t, J=7.46 Hz, 4H), 1.55 (dd, J=14.83, 7.39 Hz, 4H), 0.86 (t, J=7.33 Hz, 6H).

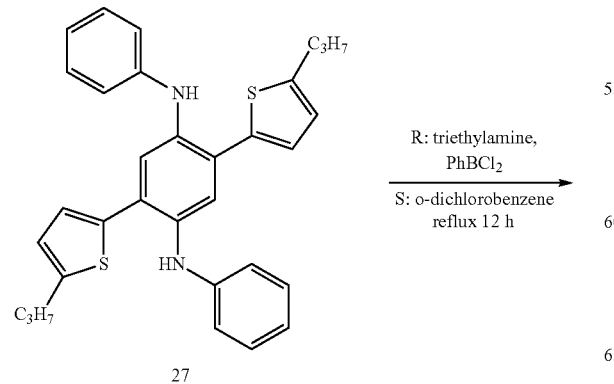

27

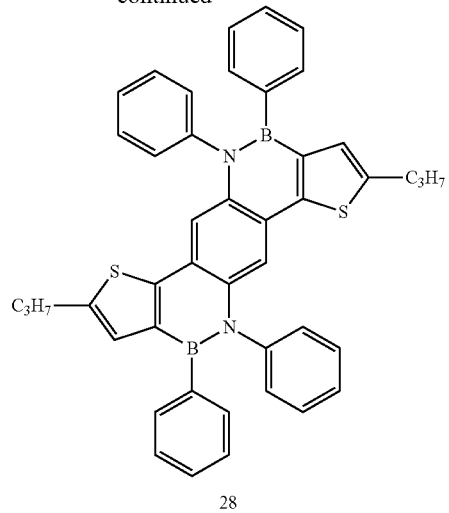

28

Synthesis of Compound 28 (BNXT-C3)

To a solution of 2,5-di(5-propyl-thiophen-2-yl)-N¹,N⁴-diphenylbenzene-1,4-diamine 27 (200 mg, 0.39 mmol) in o-dichlorobenzene (10 ml) under nitrogen was added triethylamine (240 mg, 2.36 mmol) and phenyldichloroborane (190 mg, 1.18 mmol). The reaction mixture was heated to 180° C. for 12 h. After cooling to the room temperature, the mixture was filtered through sand core funnel and then the residue washed by methanol to give product 28 as yellowgreen powder (230 mg, 86%). ¹H NMR (400 MHz, CDCl₃, TMS standard, ppm): 7.47-7.35 (m, 8H), 7.29 (dd, J=6.51, 3.08 Hz, 4H), 7.22 (dd, J=6.86, 1.48 Hz, 4H), 7.18 (dd, J=4.43, 2.15 Hz, 6H), 7.01 (s, 2H), 2.80 (t, J=7.54 Hz, 4H), 1.69 (dd, J=14.91, 7.43 Hz, 4H), 0.94 (t, J=7.34 Hz, 6H).

Example 8

Synthesis of Compound 30 (BNXF)

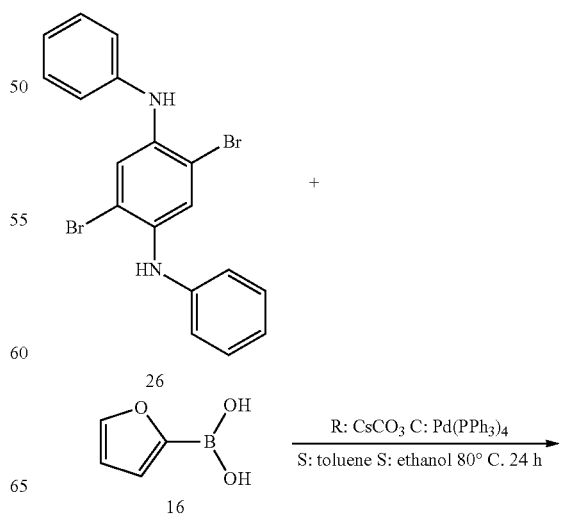

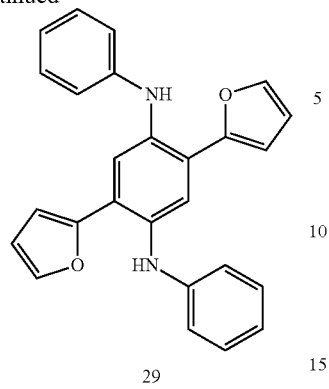

29

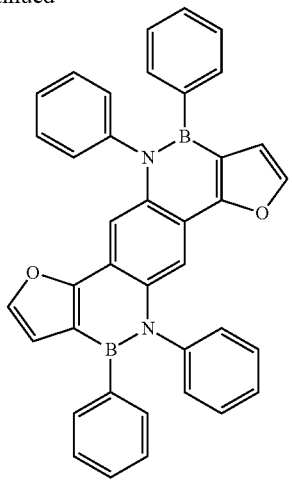

30

Synthesis of 2,5-di(furan-2-yl)-$N^1,N^4$-diphenylbenzene-1,4-diamine (29)

A mixture that contained 2,5-dibromo-$N^1,N^4$-diphenylbenzene-1,4-diamine (26) (0.5014 g, 1.20 mmol), furan-2-yl-boronic acid 16 (0.6215 g, 5.55 mmol), cesium carbonate (4.0512 g, 12.43 mmol) and 10 mol % tetrakis(triphenylphosphine) palladium(0) (0.1422 g, 0.12 mmol) that had been dissolved in toluene (30 mL), ethanol (10 ml) and $H_2O$ (7 ml) was stirred at 80° C. for 24 h and cooled to room temperature. The mixture was poured into sodium hydroxide, and then extracted with dichloromethane. The aqueous layer was extracted with dichloromethane (3 times). Then the combined organic layers were dried over anhydrous sodium sulfate and compound 29 (0.369 g, 78%, light yellow powder) was isolated by silica gel chromatography (1:1 hexane: dichloromethane ratio). The analysis of 29 was as follows. $^1$H NMR (400 MHz, DMSO-$d_6$, TMS standard, ppm): δ 7.70 (d, J=2.8 Hz, 4H, m-$C_6H_6$), 7.61 (s, 2H, NH), 7.17 (dd, J=7.6, 8.8 Hz, 4H, o-$C_6H_6$), 6.84 (d, J=1.2 Hz, 2H, $C_6H_2Fu_2$), 6.82 (d, J=0.8 Hz, 2H, Fu-H-4), 6.81 (dd, J=3.2, 0.4 Hz, 2H, p-$C_6H_6$), 6.73 (t, J=7.6 Hz, 2H, Fu-H-2), 6.54 (dd, J=3.2, 1.6 Hz, 4H, Fu-H-3).

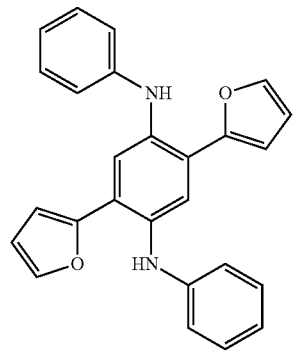

29

R: triethylamine, PhBCl$_2$
S: o-dichlorobenzene reflux 12 h

Synthesis of Compound 30

To a solution of 2,5-di(furan-2-yl)-$N^1,N^4$-diphenylbenzene-1, 4-diamine 29 (200 mg, 0.51 mmol) in o-dichlorobenzene (20 ml) under nitrogen was added triethylamine (310 mg, 3.06 mmol) and phenyldichloroborane (250 mg, 1.53 mmol). The reaction mixture was heated to 180° C. for 12 h. After cooling to the room temperature, the mixture was filtered through sand core funnel and then the residue washed by methanol to give product 30 as yellow powder (240 mg, 83%). $^{13}$C NMR could not be well-resolved due to its poor solubility. NMR could not be well-resolved due to its poor solubility.

Example 9

Synthesis of Compound 34

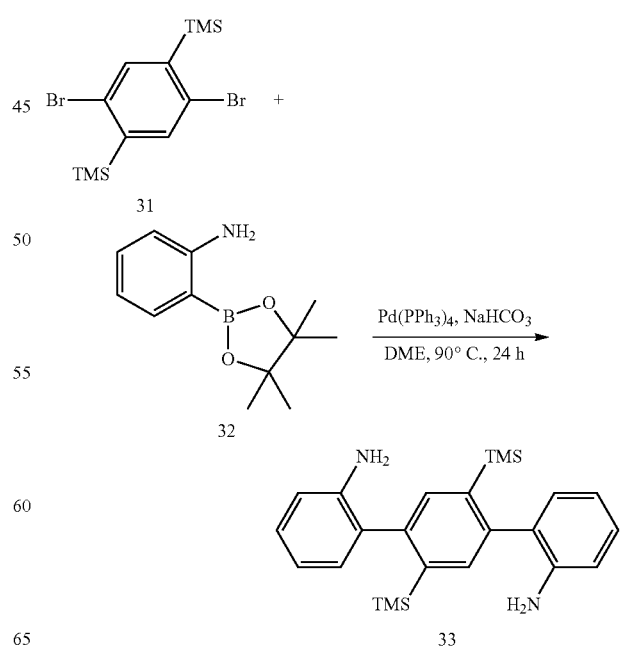

Synthesis of 2,2'-(2,5-bis(trimethylsilyl)benzene-1,4-diyl)dianiline (33)

In a schlenk flask, 1,4-dibromo-2,5-bis(trimethylsilyl)-benzene (31) (380 mg, 1.0 mmol) and 2-(4,4,5,5-tetramethyl-1,3,2-dioxaborolan-2-yl)benzenamine (32) (660 mg, 3.0 mmol) were charged under the protection of nitrogen. After adding 40 ml dimethoxyethane, 10 ml NaHCO$_3$ aqueous solution (1.0 mol/l), the mixture was degassed for 30 min. Pd(PPh$_3$)$_4$ (115 mg, 0.10 mmol) was added, then the mixture was heated to 90° C. and stirred for 24 hours. The reactant was poured into brine and extracted by dichloromethane for several times. The organic phase was dried over MgSO$_4$ and the solvent was evaporated in vacuo. The crude product was purified by chromatography on silica gel (DCM) to give product 2,2'-(2,5-bis(trimethylsilyl) benzene-1,4-diyl)dianiline (33) as white powder (390 mg, 92%). $^1$H NMR (250 MHz, CD$_2$Cl$_2$, ppm): δ 7.46 (d, J=5.6 Hz, 1H), 7.16 (t, J=7.6 Hz, 1H), 7.03 (d, J=6.2 Hz, 1H), 6.76 (m, 2H), 3.58 (s, 2H), 0.02 (s, 9H).

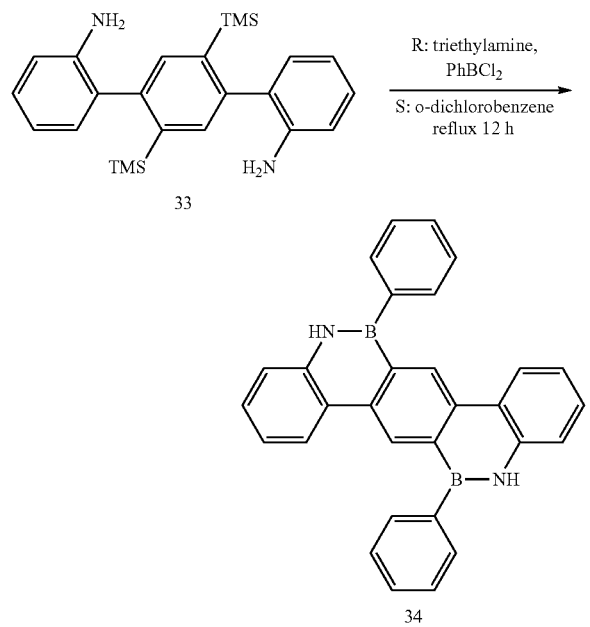

Synthesis of Compound 34

To a solution of 2,2'-(2,5-bis(trimethylsilyl)benzene-1,4-diyl)dianiline (33) (101 mg, 0.25 mmol) in o-dichlorobenzene (10 ml) under nitrogen was added triethylamine (150 mg, 1.5 mmol) and phenyldichloroborane (120 mg, 0.75 mmol). The reaction mixture was heated to 180° C. for 12 h. After cooling to the room temperature, the mixture was filtered through sand core funnel and then the residue washed by methanol to give product 34 as white powder (60 mg, 56%). $^1$H NMR (250 MHz, CD$_2$Cl$_2$, ppm): δ 9.40 (s, 1H), 8.48 (d, J=7.9 Hz, 1H), 7.95 (t, J=8.6 Hz, 3H), 7.61 (d, J=6.3 Hz, 3H), 7.37 (m, 3H).

Example 10

OLED Fabrication and Measurement

ITO-coated glass substrates were cleaned successively using deionized water, acetone and iso-propanol in an ultrasonic bath, dried in a drying cabinet, and then pre-treated with oxygen plasma. Thereon were deposited in sequence a layer of 1,4-bis[(1-naphthylphenyl)-amino]biphenyl (NPB), a layer comprising a compound X in accordance with present application, a layer of 2,2,2-(1,3,5-benzenetryl)tris(1-phenyl)-1H-benzimidazol (TPBI), and a layer of lithium fluoride by evaporation at a vacuum of about 10$^{-6}$ Torr. Finally, Al metal as cathode was evaporated onto the lithium fluoride layer, thereby obtaining organic light emitting devices having the configuration (with thickness of the layers given in parentheses) ITO/NPB (50 nm)/X/TPBI (30 nm)/LiF (1 nm)/Al (100 nm), wherein NPB, X and aluminum tris(8-hydroxyquinoline) ("Alq3") are used as hole transporting, light emitting, and electron transporting layers, respectively.

The thicknesses of the respective layers were determined by quartz crystal monitors. The active area of the electronic device, defined by the overlap of the ITO and the cathode electrode, was 3 mm by 3 mm. Current density-voltage (J-V), luminance-voltage (L-V), current efficiency-current density (CE-J), power efficiency-current density (PE-J) and external quantum efficiency-luminance (EQE-L) characteristics were measured with a computer controlled Keithley 2400 Source Meter and BM-7A Luminance Colorimeter. The electroluminescence spectra were captured using a Labsphere CDS-610.

Device performances as well as the respective nature of X are given in Table I for devices I to IV and in Table 2 for devices V to VIII, wherein $V_{on}$ denotes the voltage required for 1 cd m$^{-2}$, $\eta_c$ the maximum current efficiency, $\eta_p$ the maximum power efficiency, and $\eta_{ext}$ the maximum external quantum efficiency. Thickness of the respective layers X was 30 nm for devices I to VII and 8 nm for device VIII (limited by the sublimed amount). Chemical structures of the components of the host materials are given below. If present— MADN was present in an amount of 3 wt %, relative to the total weight of X.

TABLE 1

| | | Electronic device (I-IV) performance | | | | | | |
|---|---|---|---|---|---|---|---|---|
| Device | X | $V_{on}$ [V] | $L_{max}$ [cd m$^{-2}$] | $\eta_c$ [cd A$^{-1}$] | $\eta_p$ [lm W$^{-1}$] | $\lambda_{max}$ [nm] | $\eta_{ext}$ [%] | CIE (x, y) |
| I | MADN:BNLT-C3 | 3.8 | 6510 | 1.80 | 0.99 | 458 | 1.3 | 0.16, 0.16 |
| II | BNLT-C3 | 3.4 | 5159 | 2.02 | 1.17 | 496 | 0.9 | 0.17, 0.39 |
| III | MADN:BNLT-C6 | 3.8 | 6416 | 1.70 | 1.00 | 458 | 1.4 | 0.16, 0.17 |
| IV | BNLT-C6 | 3.2 | 5077 | 1.39 | 0.85 | 496 | 0.6 | 0.18, 0.38 |

TABLE 2

Electronic device (V-VIII) performance

| Device | X | $V_{on}$ [V] | $L_{max}$ [cd m$^{-2}$] | $\eta_c$ [cd A$^{-1}$] | $\eta_p$ [lm W$^{-1}$] | $\eta_{ext}$ [%] | CIE (x, y) |
|---|---|---|---|---|---|---|---|
| V | MADN:BNXF | 3.6 | 458 | 1.78 | 1.00 | 1.3 | 0.16, 0.17 |
| VI | MADN:BNXT-C3 | 3.6 | 444 | 1.45 | 1.16 | 1.5 | 0.16, 0.12 |
| VII | BNXF | 3.6 | 458 | 1.90 | 1.00 | 1.5 | 0.16, 0.16 |
| VIII | BNXT-C3 | 4.2 | 421/445 | 1.18 | 0.65 | 1.2 | 0.15, 0.16 |

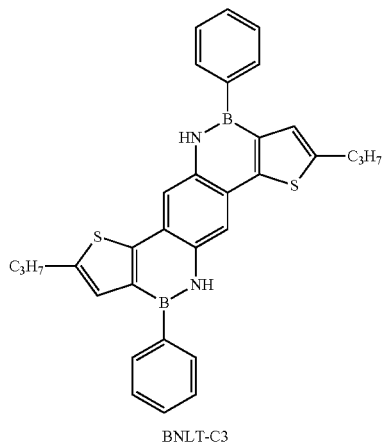

BNLT-C3

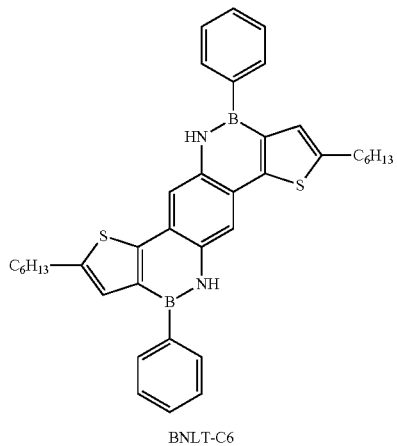

BNLT-C6

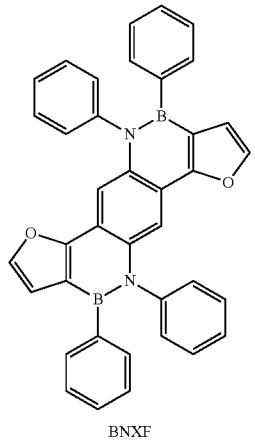

BNXF

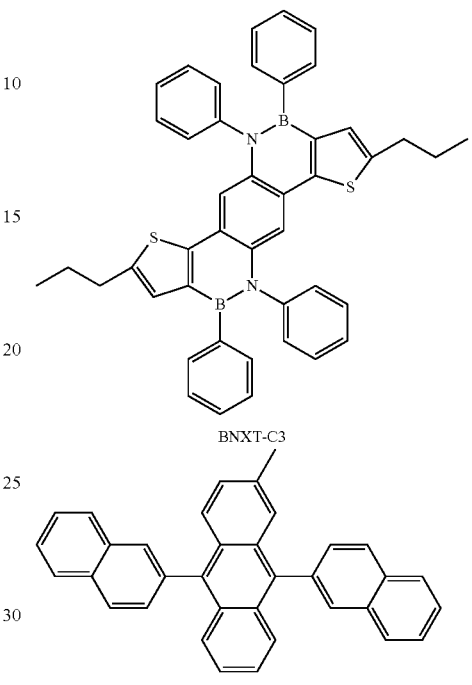

BNXT-C3

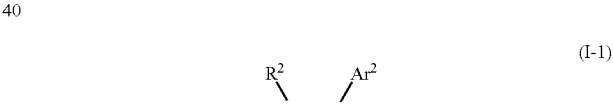

MADN

The invention claimed is:

1. A compound comprising a structural unit of formula I-1 or I-2

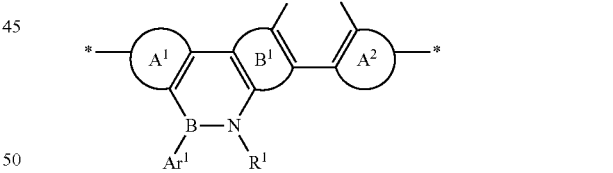

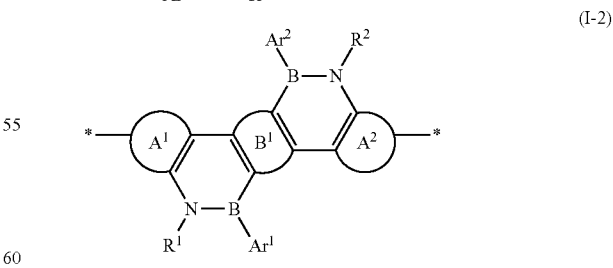

wherein Formulae I-1 and I-2 depict trans-structures only with respect to the B-N moieties, $A^1$ and $A^2$ are independently of each other mono- or polycyclic aromatic or heteroaromatic ring systems annealed to the neighboring azaborinine ring;

$B^1$ is benzene;
$Ar^1$ and $Ar^2$ are independently of each other aryl or heteroaryl; and
$R^1$ and $R^2$ are independently of each other selected from the group consisting of hydrogen, carbyl and hydrocarbyl;
wherein $A^1$, $A^2$, $B^1$, $Ar^1$ and $Ar^2$ may independently of each other be substituted or unsubstituted.

2. A compound according to claim 1, wherein each of $A^1$ and $A^2$ comprises from 5 to 30 aromatic ring atoms.

3. A compound according to claim 1, wherein $A^1$ and $A^2$ are independently of each other selected from cyclopentadiene, mono-, di-, tri- and tetracyclic aromatic or heteroaromatic ring systems and their respective derivatives wherein one or more aromatic ring atom may be replaced by N and/or one or more of the non-aromatic ring atoms may be replaced by a group selected from O, S, Se, $NR^3$ and $SiR^3_2$, preferably selected from O, S, $NR^3$ and $SiR^3_2$, more preferably selected from O, S and $NR^3$, with $R^3$ being at each occurrence independently of each other H or optionally substituted $C_{1-40}$ carbyl or hydrocarbyl.

4. A compound according to claim 1, wherein each of $Ar^1$ and $Ar^2$ comprises from 5 to 30 aromatic carbon atoms.

5. A compound according to claim 1, wherein $Ar^1$ and $Ar^2$ are independently of each other selected from cyclopentadiene, mono-, di-, tri- and tetracyclic aromatic or heteroaromatic ring systems and their respective derivatives wherein one or more aromatic ring atom may be replaced by N and/or one or more of the non-aromatic ring atoms may be replaced by a group selected from O, S, Se, $NR^3$ and $SiR^3_2$, preferably selected from O, S, $NR^3$ and $SiR^3_2$, more preferably selected from O, S and $NR^3$, with $R^3$ being at each occurrence independently of each other H or optionally substituted $C_{1-40}$ carbyl or hydrocarbyl.

6. A compound according to claim 1, wherein $R^1$ and $R^2$ are independently of each other selected from the group consisting of H, alkyl having from 1 to 20 carbon atoms and aryl having from 5 to 30 carbons atoms and heteroaryl having from 5 to 30 aromatic ring atoms.

7. A compound according to claim 1, wherein the compound is selected from the group consisting of small molecule, monomer, oligomer and polymer.

8. A mixture or a blend comprising one or more compounds of claim 1 and one or more compounds or polymers having semiconducting, charge transport, hole transport, electron transport, hole blocking, electron blocking, electrically conducting, photoconducting or light emitting properties.

9. Formulation comprising the compound of claim 1 and an organic solvent.

10. A method comprising incorporating a compound of claim 1 as charge transport, semiconducting, electrically conducting, photoconducting or light emitting material in optical, electrooptical, electronic, electroluminescent or photoluminescent components or devices.

11. Charge transport, semiconducting, electrically conducting, photoconducting or light emitting material comprising the compound of claim 1.

12. A component or device comprising the compound of claim 1, said component or device being selected from the group consisting of organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), organic solar cells (O-SC), photodiodes, laser diodes, photoconductors, organic photodetectors (OPD), electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

13. A component or device according to claim 12, said component or device being selected from the group consisting of organic field effect transistors (OFET), thin film transistors (TFT), integrated circuitry (IC), radio frequency identification (RFID) tags, organic light emitting devices (OLED), organic light emitting transistors (OLET) and backlights of displays.

14. A compound selected from the group consisting of

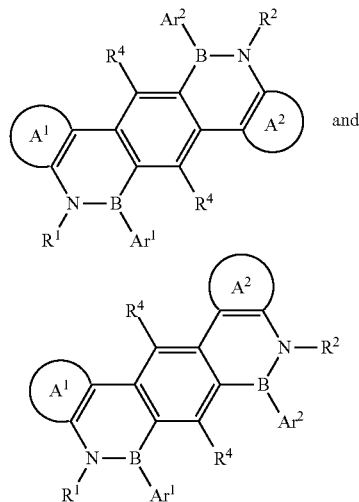

wherein $R^4$ is at each occurrence selected from the group consisting of H, F and alkyl having from 1 to 20 carbon atoms,
$A^1$ and $A^2$ are independently of each other mono- or polycyclic aromatic or heteroaromatic ring systems annealed to the neighboring azaborinine ring;
$Ar^1$ and $Ar^2$ are independently of each other aryl or heteroaryl; and
$R^1$ and $R^2$ are independently of each other selected from the group consisting of hydrogen, carbyl and hydrocarbyl;
wherein $A^1$, $A^2$, $B^1$, $Ar^1$ and $Ar^2$ may independently of each other be substituted or unsubstituted.

15. A mixture or a blend comprising one or more compounds of claim 14 and one or more compounds or polymers having semiconducting, charge transport, hole transport, electron transport, hole blocking, electron blocking, electrically conducting, photoconducting or light emitting properties.

16. Formulation comprising the compound of claim 14 and an organic solvent.

17. A method comprising incorporating a compound of claim 14 as charge transport, semiconducting, electrically conducting, photoconducting or light emitting material in optical, electrooptical, electronic, electroluminescent or photoluminescent components or devices.

18. Charge transport, semiconducting, electrically conducting, photoconducting or light emitting material comprising the compound of claim 14.

19. A component or device comprising the compound of claim 14, said component or device being selected from the group consisting of organic field effect transistors (OFET), thin film transistors (TFT), integrated circuits (IC), logic circuits, capacitors, radio frequency identification (RFID) tags, devices or components, organic light emitting diodes (OLED), organic light emitting transistors (OLET), flat panel displays, backlights of displays, organic photovoltaic devices (OPV), organic solar cells (O-SC), photodiodes, laser diodes, photoconductors, organic photodetectors (OPD), electrophotographic devices, electrophotographic recording devices, organic memory devices, sensor devices, charge injection layers, charge transport layers or interlayers in polymer light emitting diodes (PLEDs), Schottky diodes, planarising layers, antistatic films, polymer electrolyte membranes (PEM), conducting substrates, conducting patterns, electrode materials in batteries, alignment layers, biosensors, biochips, security markings, security devices, and components or devices for detecting and discriminating DNA sequences.

20. A component or device according to claim 19, said component or device being selected from the group consisting of organic field effect transistors (OFET), thin film transistors (TFT), integrated circuitry (IC), radio frequency identification (RFID) tags, organic light emitting devices (OLED), organic light emitting transistors (OLET) and backlights of displays.

* * * * *